(12) United States Patent
Jang et al.

(10) Patent No.: US 12,550,553 B2
(45) Date of Patent: Feb. 10, 2026

(54) LIGHT EMITTING DISPLAY APPARATUS AND MULTI-SCREEN DISPLAY APPARATUS INCLUDING THE SAME

(71) Applicant: LG Display Co., Ltd., Seoul (KR)

(72) Inventors: YoungIn Jang, Paju-si (KR); KyungYun Kang, Paju-si (KR); Subin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 615 days.

(21) Appl. No.: 17/981,253

(22) Filed: Nov. 4, 2022

(65) Prior Publication Data

US 2023/0209930 A1 Jun. 29, 2023

(30) Foreign Application Priority Data

Dec. 23, 2021 (KR) .................. 10-2021-0186119

(51) Int. Cl.
| | | |
|---|---|---|
| *H01L 27/32* | (2006.01) | |
| *H10D 86/40* | (2025.01) | |
| *H10D 86/60* | (2025.01) | |
| *H10K 59/121* | (2023.01) | |
| *H10K 59/131* | (2023.01) | |
| *H10K 59/18* | (2023.01) | |
| *H10K 59/80* | (2023.01) | |

(52) U.S. Cl.
CPC ......... *H10K 59/131* (2023.02); *H10D 86/441* (2025.01); *H10D 86/481* (2025.01); *H10D 86/60* (2025.01); *H10K 59/1213* (2023.02); *H10K 59/1216* (2023.02); *H10K 59/18* (2023.02); *H10K 59/873* (2023.02)

(58) Field of Classification Search
None
See application file for complete search history.

(56) References Cited

U.S. PATENT DOCUMENTS

2021/0202676 A1* 7/2021 Jeong .................. H10K 59/10

FOREIGN PATENT DOCUMENTS

| KR | 20170061783 A | 6/2017 |
|---|---|---|
| KR | 20170079854 A | 7/2017 |
| KR | 20200118316 A | 10/2020 |
| KR | 20200120804 A | 10/2020 |
| KR | 20210086289 A | 7/2021 |
| KR | 20210086309 A | 7/2021 |

* cited by examiner

*Primary Examiner* — William C Trapanese
(74) *Attorney, Agent, or Firm* — Seed Intellectual Property Law Group LLP

(57) ABSTRACT

A light emitting display apparatus includes a substrate, a display portion including a plurality of pixel driving lines disposed over the substrate and a plurality of pixels selectively connected to the plurality of pixel driving lines, a light emitting device layer including a self-emitting device disposed at the display portion, a dam disposed along an edge portion of the substrate, the dam including a metal line, an encapsulation layer including an organic encapsulation layer disposed on an encapsulation region surrounded on at least four sides by the dam, and an anti-electrostatic circuit selectively disposed in outermost pixels of the plurality of pixels, wherein the anti-electrostatic circuit is electrically coupled between a pixel driving line of the plurality of pixel driving lines, the pixel driving line being disposed in at least one of the outermost pixels and the metal line disposed in the dam.

19 Claims, 18 Drawing Sheets

LIGHT EMITTING DISPLAY APPARATUS AND MULTI-SCREEN DISPLAY APPARATUS INCLUDING THE SAME

CROSS-REFERENCE TO RELATED APPLICATIONS

This application claims the benefit of the Korean Patent Application No. 10-2021-0186119 filed on Dec. 23, 2021, which is hereby incorporated by reference as if fully set forth herein.

BACKGROUND

Technical Field

The present disclosure relates to a light emitting display apparatus and a multi-screen display apparatus including the same.

Description of the Related Art

Light emitting display apparatuses which are self-emitting light emitting display apparatuses, do not need a separate light source unlike liquid crystal display (LCD) apparatuses, and thus, they may be manufactured to be lightweight and thin. Also, light emitting display apparatuses are driven with a low voltage and thus is reduced in power consumption. Further, light emitting display apparatuses are good in color implementation, response time, viewing angle, and contrast ratio, and thus, are attracting much attention as the next-generation light emitting display apparatuses.

Light emitting display apparatuses display an image based on the light emission of a light emitting device layer including a light emitting device interposed between two electrodes. In this case, light emitted by the light emitting device is discharged to the outside through an electrode and a substrate.

Light emitting display apparatuses include a display panel which is implemented to display an image. The display panel may include a display area which includes a plurality of pixels for displaying an image and a bezel area which surrounds the display area.

A light emitting display apparatus of the related art may need a bezel (or a mechanism) for occluding a bezel area disposed at an edge (or a periphery portion) of a display panel, and due to a width of the bezel area, a bezel width may increase. Moreover, when a bezel width of a light emitting display apparatus of the related art is maximally reduced, a pixel circuit may be damaged by static electricity flowing into an outermost pixel from the outside or in performing a manufacturing process, and the reliability of a light emitting device may be reduced due to a degradation in the light emitting device caused by the penetration of water (or moisture).

Recently, multi-screen display apparatuses have been commercialized where a large screen is implemented by arranging the light emitting display apparatuses as a lattice type.

However, in a multi-screen display apparatus of the related art, a boundary portion such as a seam is formed between adjacent light emitting display apparatuses due to a bezel area or a bezel of each of a plurality of light emitting display apparatuses. The boundary portion may cause a sense of disconnection (or discontinuity) of an image when one image is being displayed on a total screen of the multi-screen display apparatus, and due to this, the immersion of a viewer watching the image may be reduced.

BRIEF SUMMARY

Accordingly, the present disclosure is directed to providing a light emitting display apparatus and a multi-screen display apparatus including the same that substantially obviate one or more problems due to limitations and disadvantages of the related art.

An aspect of the present disclosure is directed to providing a light emitting display apparatus having a zero bezel width and a multi-screen display apparatus including the same, in which a pixel circuit may be protected from static electricity.

An aspect of the present disclosure is directed to providing a light emitting display apparatus and a multi-screen display apparatus including the same, which may have a zero-bezel width and may minimize or reduce a reduction in reliability of a self-emitting device caused by the penetration of water (or moisture).

The technical benefits of the present disclosure are not limited to the aforesaid, but other technical benefits not described herein will be clearly understood by those skilled in the art from descriptions below.

Additional features and aspects will be set forth in part in the description that follows, and in part will become apparent from the description, or may be learned by practice of the concepts provided herein. Other features and aspects of the disclosure may be realized and attained by the structure particularly pointed out in the written description, or derivable therefrom, and the claims hereof as well as the appended drawings.

To achieve these and other aspects of the disclosure, as embodied and broadly described herein, a light emitting display apparatus comprises a substrate; a display portion including a plurality of pixel driving lines disposed over the substrate and a plurality of pixels selectively connected to the plurality of pixel driving lines; a light emitting device layer including a self-emitting device disposed at the display portion; a dam disposed along a periphery portion of the substrate, the dam including a metal line; an encapsulation layer including an organic encapsulation layer disposed on an encapsulation region surrounded on at least four sides by the dam, and an anti-electrostatic circuit selectively disposed in outermost pixels of the plurality of pixels, wherein the anti-electrostatic circuit is electrically coupled between a pixel driving line of the plurality of pixel driving lines, the pixel driving line being disposed in at least one of the outermost pixels and the metal line disposed in the dam.

In another aspect of the present disclosure, a multi-screen display apparatus comprises a plurality of display apparatuses disposed along at least one direction of a first direction and a second direction crossing the first direction, each of the plurality of display apparatuses includes a light emitting display apparatus, the light emitting display apparatus comprises a substrate; a display portion including a plurality of pixel driving lines disposed over the substrate and a plurality of pixels selectively connected to the plurality of pixel driving lines; a light emitting device layer including a self-emitting device disposed at the display portion; a dam disposed along an edge portion of the substrate, the dam including a metal line; an encapsulation layer including an organic encapsulation layer disposed on an encapsulation region surrounded on at least four sides by the dam, and an anti-electrostatic circuit selectively disposed in outermost pixels of the plurality of pixels, wherein the anti-electrostatic circuit is electrically coupled between a pixel driving line of the plurality of pixel driving lines, the pixel driving line being disposed in at least one of the outermost pixels and the metal line disposed in the dam.

Specific details according to various examples of the present specification other than the means for solving the above-mentioned problems are included in the description and drawings below.

According to an embodiment of the present disclosure, a light emitting display apparatus and a multi-screen display apparatus including the same, which may have a zero-bezel width and may protect a pixel circuit from static electricity, may be provided.

According to an embodiment of the present disclosure, a light emitting display apparatus and a multi-screen display apparatus including the same, which may have a zero-bezel width and may minimize or reduce a reduction in reliability of a self-emitting device caused by the penetration of water (or moisture), may be provided.

According to an embodiment of the present disclosure, a multi-screen display apparatus which display an image without a sense of discontinuity, may be provided.

It is to be understood that both the foregoing general description and the following detailed description of the present disclosure are examples and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure.

DETAILED DESCRIPTION

Figure 1:
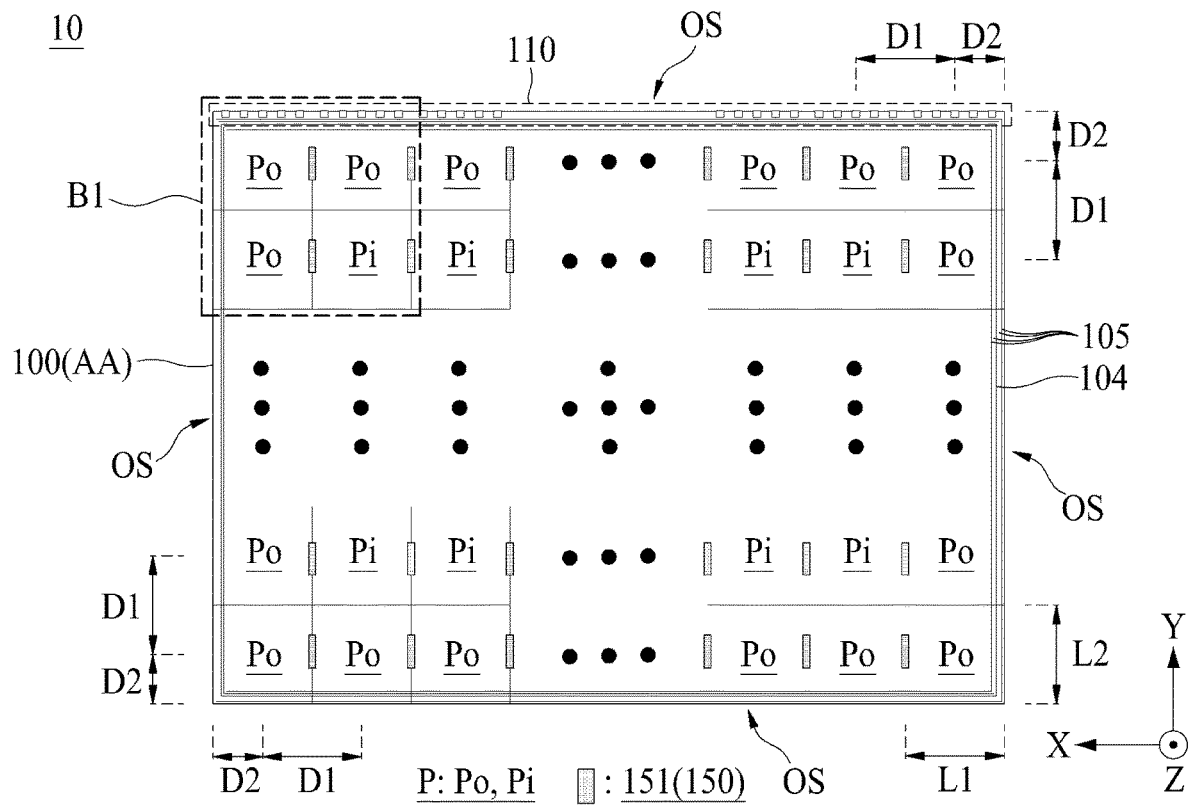
FIG. 1 is a plan view illustrating a light emitting display apparatus according to an embodiment of the present disclosure.

Reference will now be made in detail to embodiments of the present disclosure, examples of which may be illustrated in the accompanying drawings. In the following description, when a detailed description of well-known functions or configurations related to this document is determined to unnecessarily cloud a gist of the technical features, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the embodiments of the present disclosure are not limited to the illustrated details. Same reference numerals refer to same elements throughout. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case which is not continuous may be included unless a more limiting term, such as "just," "immediate(ly)," or "direct(ly)" is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "coupled to" another element or layer, it may be directly on or directly coupled to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

The term "surround" as used herein includes at least partially surrounding as well as entirely surrounding one or more of the associated elements. Similarly, the term "cover" as used herein includes at least partially covering as well as entirely covering one or more of the associated elements. For example, if an encapsulation layer surrounds a dam, this may be construed as the encapsulation layer at least partially surrounding the dam. However, in some embodiments, the encapsulation layer may entirely surround the dam. The meaning in which the term "surround" is used herein may be further specified based on the associated drawings and embodiments. In the present disclosure, the terms "surround," "at least partially surround," "completely surround" or the like is used. In accordance with the definition of "surround" as set forth above, when only the term "surround" is used in an embodiment, it may mean either at least partially surrounding or entirely surrounding one or more of the associated elements. The same applies for the term "cover."

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together with in co-dependent relationship.

Hereinafter, embodiments of the present disclosure will be described in detail with reference to the accompanying drawings. For convenience of description, a scale of each of elements illustrated in the accompanying drawings differs from a real scale, and thus, is not limited to a scale illustrated in the drawings. In addition, in adding reference numerals to elements of each of the drawings, although the same elements are illustrated in other drawings, like reference numerals may refer to like elements.

FIG. 1 is a plan view illustrating a light emitting display apparatus 10 according to an embodiment of the present disclosure.

Referring to FIG. 1, the light emitting display apparatus (or a light emitting display panel) 10 according to an embodiment of the present disclosure may include a substrate 100 having a display portion AA, a plurality of pixels P at the display portion AA of the substrate 100, and a dam 104 at the display portion AA.

The substrate 100 may be referred to as a first substrate, a front substrate, a base substrate, or a pixel array substrate. The substrate 100 may be a glass substrate, or may be a thin glass substrate or a plastic substrate, which is bendable or flexible.

The display portion AA of the substrate 100 may be an area which displays an image and may be referred to as an active portion, an active area, a display area or a display screen. A size of the display portion AA may be the same as a size of the substrate 100 (or the light emitting display apparatus or a light emitting display panel). For example, a size of the display portion AA may be the same as a total size of the first surface of the substrate 100. Therefore, the display portion AA may be implemented (or disposed) on the whole front surface of the substrate 100, and thus, a whole front surface of the light emitting display apparatus may implement the display portion AA.

An end portion (or an outermost portion) of the display portion AA may overlap or may be aligned with an outer surface OS of the substrate 100. For example, with respect to a thickness direction Z of the light emitting display apparatus (or the light emitting display panel), a lateral surface (or an end line) of the display portion AA may be aligned at a vertical extension line vertically extending from the outer surface OS of the substrate 100. The lateral surface of the display portion AA may be surrounded only by air without being surrounded by a separate mechanism. That is, the display portion AA or all lateral surfaces (or the outer surface) of the substrate 100 may be provided in a structure which directly contacts air without being surrounded by a separate mechanism. Therefore, the outer surface OS of the substrate 100 corresponding to the end portion of the display portion AA may be surrounded by only air (or abutting ambient air), and thus, the light emitting display apparatus (or the light emitting display panel) according to an embodiment of the present disclosure may have an air-bezel structure or a non-bezel structure (or a zeroized bezel or no bezel) where the end portion (or lateral surface) of the display portion AA is surrounded by air (or abutting ambient air).

The plurality of pixels P may be arranged (or disposed) over the display portion AA of the substrate 100 to have the first interval D1 along each of a first direction X and a second direction Y. The first direction X may be a widthwise direction, a horizontal direction, or a first length direction (or widthwise length direction) of the substrate 100 or the light emitting display apparatus. The second direction Y may be a lengthwise direction, a vertical direction, or a second length direction (or a lengthwise length direction) of the substrate 100 or the light emitting display apparatus. The first direction X may traverse (or intersect or cross) to the second direction Y.

Each of the plurality of pixels P may be implemented at a plurality of pixel areas disposed on the display portion AA of the substrate 100. Each of the plurality of pixels P may have a first length L1 parallel to the first direction X and a second length L2 parallel to the second direction Y. The first length L1 may be the same as the second length L2 or the first interval D1. The first length L1 and the second length L2 may be the same as the first interval D1. Therefore, the plurality of pixels P (or pixel areas) may all have the same size.

Two pixels P adjacent to each other along each of the first direction X and the second direction Y may have the same first interval D1 without an error range of a manufacturing process. The first interval D1 may be a pitch (or a pixel pitch) between two adjacent pixels P. For example, the first length L1 or the second length L2 of the pixel P may be referred to as the pixel pitch. For example, the first interval (or the pixel pitch) D1 may be a distance (or a length) between center portions of two adjacent pixels P. For example, the first interval (or the pixel pitch) D1 may be a shortest distance (or a shortest length) between center portions of two adjacent pixels P.

Each of the plurality of pixels P may include a circuit layer which includes a pixel circuit implemented at a pixel area of the substrate 100 and a light emitting device layer which is disposed over the circuit layer and is connected to the pixel circuit. The pixel circuit may output a data current corresponding to a data signal, in response to a pixel driving signal supplied through the pixel driving lines disposed at the pixel area. The plurality of pixels P may be selectively connected to the plurality of pixel driving lines. The light emitting device layer may include a self-emitting device (or a self-emitting layer) which is commonly disposed over the remaining display portion AA except for a periphery portion of the display portion AA. The self-emitting device may be configured to emit light by the data current supplied from the pixel circuit. The pixel driving lines, the pixel circuit, and the light emitting device layer will be described below.

The plurality of pixels P may be divided (or classified) into outermost pixels (or outer pixels) Po and internal pixels (or inner pixels) Pi.

The outermost pixels Po may be pixels disposed closest to the outer surface OS of the substrate 100 of the plurality of pixels P. For example, the outermost pixels Po may be pixels which are arranged in each of a first horizontal line (or a first pixel row), a last horizontal line (or a last pixel row), a first vertical line (or a first pixel column), and a last vertical line (or a last pixel column). For example, the outermost pixels Po may be pixels disposed at edge areas (or periphery areas) of display portion AA.

A second interval D2 between a center portion of each of the outermost pixels Po and the outer surface OS of the substrate 100 may be half or less of the first interval D1. For example, the second interval D2 may be a shortest distance (or a shortest length) between a center portion of the outermost pixel Po area and the outer surface OS of the substrate 100.

When the second interval D2 is greater than half of the first interval D1, the substrate 100 may have a greater size than the display portion AA by a difference area between half of the first interval D1 and the second interval D2, and thus, an area between the end of the outermost pixel Po and the outer surface OS of the substrate 100 may be configured as a non-display portion surrounding a whole display portion AA. For example, when the second interval D2 is greater than half of the first interval D1, the substrate 100 inevitably includes a bezel area based on a non-display portion surrounding the whole display portion AA. On the other hand, when the second interval D2 is half or less of the first interval D1, the end of each of the outermost pixels Po may be aligned with (or disposed at) the outer surface OS of the substrate 100, or the end portion of the display portion AA may be aligned with (or disposed at) the outer surface OS of the substrate 100, and thus, the display portion AA may be implemented (or disposed) at the whole front surface of the substrate 100.

Some of outermost pixels Po may further include an anti-electrostatic circuit (or electrostatic protection circuit). The anti-electrostatic circuit may be implemented to be disposed (or included) within the outermost pixel Po and may protect the pixel circuit, disposed in the outermost pixel Po, from static electricity flowing in through the pixel driving lines. The anti-electrostatic circuit may be selectively disposed in outermost pixels Po. The anti-electrostatic circuit will be described below.

The internal pixels Pi may be the remaining pixels other than the outermost pixels Po among the plurality of pixels P, or may be pixels surrounding by the outermost pixels Po among the plurality of pixels P. The internal pixels (or second pixels) Pi may be implemented to have a configuration or a structure, which differs from the outermost pixels (or first pixels) Po.

The dam 104 may be implemented at periphery portions of the outermost pixels Po which are implemented at a periphery portion of the substrate 100 or are arranged at the display portion AA. For example, the dam 104 may be disposed in the display portion AA to one-dimensionally have a closed loop line shape (or a continuous line shape or a closed loop shape) along a region between a center portion of the outermost pixels Po and an outer surface OS of the substrate 100. The dam 104 may have a closed loop line shape disposed along a region between a lateral surface of the substrate 100 and emission areas of the outermost pixels Po. For example, the closed loop line shape may be a ring shape which is continuously connected.

The dam 104 may include a metal line (or an electrostatic discharging line) which is coupled to the anti-electrostatic circuit. The metal line may be implemented or embedded within (or inside) the dam 104 to supply an anti-electrostatic power to the anti-electrostatic circuit. For example, the metal line may be surrounded by the dam 104.

The dam 104 may be configured to prevent the spread or overflow of an organic encapsulation layer of an encapsulation layer, disposed on the light emitting device layer, at periphery portions of the outermost pixels Po. Also, the dam 104 may isolate (or disconnect or separate) at least some layers of the light emitting device layer at the periphery portions of the outermost pixels Po, and thus, may block a lateral water penetration path, thereby preventing or minimizing a reduction in reliability of the light emitting device layer caused by lateral water penetration.

The dam 104 may include an undercut structure or an eaves structure for isolating (or disconnecting or separating) at least some layers of the light emitting device layer. For example, the dam 104 may include an undercut region which is implemented by the undercut structure or an eaves structure. Therefore, at least a portion of the light emitting device layer may be physically isolated (or disconnected or separated) by the undercut region of the dam 104. For example, a self-emitting device (or a self-emitting layer) of the light emitting device layer formed over the dam 104 may be isolated (or disconnected or separated) at least once in the undercut region of the dam 104.

The light emitting display apparatus (or the light emitting display panel) 10 or the substrate 100 according to an embodiment of the present disclosure may further include a pad portion 110.

The pad portion 110 may be a first pad portion, a front pad portion, or a first routing pad. The pad portion 110 may be disposed (or included) within outermost pixels Po disposed at a first periphery portion (or one periphery portion) of a first surface of the substrate 100 parallel to a first direction X, and thus, the substrate 100 may not include a non-display portion (or a bezel area) based on the pad portion 110.

The pad portion 110 may include a plurality of first pads (or front pads) connected (or coupled) to pixel driving lines. For example, the pad portion 110 may include a plurality of first pads (or front pads) for receiving a data signal, a gate control signal, a pixel driving power, a reference voltage, and a pixel common voltage, or the like, from a driving circuit part. Each of the outermost pixels Po disposed at the first periphery portion of the substrate 100 to include the pad portion 110 may include at least one of the plurality of first pads. Thus, the outermost pixels Po may include at least one first pad, and thus, may be implemented to have a configuration or a structure which differs from the inner pixel Pi including no first pad.

For example, when the pad portion 110 is not disposed (or included) within (or inside) the outermost pixels Po and is disposed between ends of the outermost pixels Po and the outer surface OS of the substrate 100, the substrate 100 may include a non-display portion where the pad portion 110 is disposed between ends of the outermost pixels Po and the outer surface OS of the substrate 100, and due to the non-display portion, a second interval D2 may be greater than half of a first interval D1, the whole substrate 100 may not be implemented as the display portion AA, and a separate bezel for covering the non-display portion may be needed. On the other hand, the pad portion 110 according to an embodiment of the present disclosure may be disposed (or included) within (or inside) the outermost pixels Po, and thus, because a non-display portion (or a bezel area) caused by the pad portion 110 is not formed or provided between the ends of the outermost pixels Po and the outer surface OS of the substrate 100, the second interval D2 may be less than or equal to half of the first interval D1, whereby all of the substrate 100 may be implemented as the display portion AA.

The light emitting display apparatus (or a light emitting display panel) 10 or the substrate 100 according to an embodiment of the present disclosure may further include a gate driving circuit 150.

The gate driving circuit 150 may be disposed or embedded within the display portion AA to supply a scan signal (or a gate signal) to the pixels P disposed on the substrate 100. The gate driving circuit 150 may simultaneously supply the scan signal to pixels P disposed at a horizontal line parallel to the first direction X. For example, the gate driving circuit 150 may be configured to supply at least one scan signal to pixels P disposed at one horizontal line through at least one gate line.

The gate driving circuit 150 may be implemented with a shift register including a plurality of stage circuits. That is, the light emitting display apparatus (or the light emitting display panel) 10 according to an embodiment of the present disclosure may include a shift register which is embedded (or built-in) in the display portion AA of the substrate 100 to supply the scan signal to the pixel P.

Each of the plurality of stage circuits may include a plurality of branch circuits 151 which are arranged spaced apart from one another at each horizontal line of the substrate 100 along the first direction X. Each of the plurality of stage circuits 151 may be disposed to be dispersed (or spaced apart from one another) between a plurality of pixels P within each horizontal line. Each of the plurality of branch circuits 151 may include at least one thin film transistor (TFT) (or branch TFT). For example, each of the plurality of branch circuits 151 may be disposed one by one between at least one pixels P (or a pixel area) within one horizontal line. Each of the plurality of stage circuits may generate a scan signal through driving of the plurality of branch circuits based on a gate control signal supplied through gate control lines and may supply the scan signal to pixels P disposed within a corresponding horizontal line.

The light emitting display apparatus (or the light emitting display panel) 10 or the substrate 100 according to an embodiment of the present disclosure may further include a separation portion 105.

The separation portion 105 may be implemented at a periphery portion of the substrate 100 or implemented at a periphery portion of the outermost pixel Po disposed at the display portion AA. For example, the separation portion 105 may be disposed within the display portion AA to one-dimensionally have a closed loop line shape (or a continuous line shape or a closed loop shape) along a region between the center portion of the outermost pixels Po and the outer surface OS of the substrate 100. For example, the separation portion 105 may be disposed between the dam 104 and the outer surface OS of the substrate 100 to surround the dam 104. Moreover, the separation portion 105 may be disposed between the dam 104 and the center portion of the outermost pixels Po to be surrounded by the dam 104. Thus, the outermost pixels Po may include the separation portion 105, and thus, may be implemented to have a configuration or a structure which differs from the inner pixel Pi including no the separation portion 105.

The separation portion 105 may isolate (or disconnect or separate) at least some layers of the light emitting device layer within the outermost pixels Po, and thus, may block a lateral water penetration path, thereby preventing or minimizing a reduction in reliability of the light emitting device layer caused by lateral water penetration. The separation portion 105 may include an undercut structure or an eaves structure for isolating (or disconnecting or separating) at least some layers of the light emitting device layer. For example, the separation portion 105 may include an undercut region which is implemented by the undercut structure or an eaves structure. Therefore, at least a portion of the light emitting device layer may be physically isolated (or disconnected or separated) by the undercut region of the separation portion 105. For example, the self-emitting device (or the self-emitting layer) of the light emitting device layer formed over the separation portion 105 may be isolated (or disconnected or separated) at least once in the undercut region of the separation portion 105.

The separation portion 105 may include at least two separation structures or a plurality of separation structures, which are parallel to one another to have a closed loop line shape (or a continuous line shape or a closed loop shape). For example, the separation portion 105 may include at least two separation structures which are disposed at at least one of an inner region and an outer region of the dam 104.

Figure 2A:
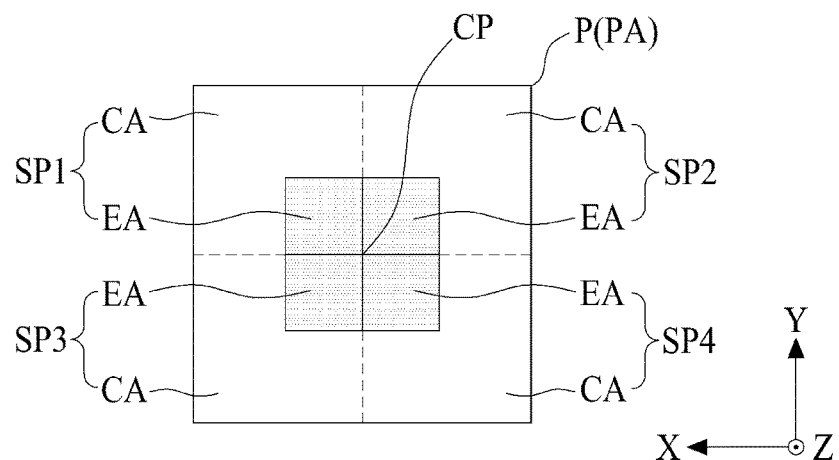
FIG. 2A is a diagram illustrating one pixel according to an embodiment of the present disclosure illustrated in FIG. 1.
Figure 2B:
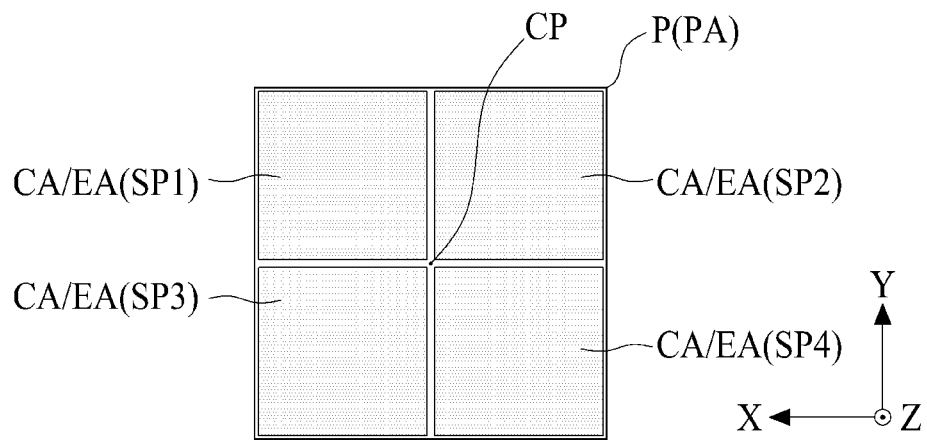
FIG. 2B is a diagram illustrating one pixel according to another embodiment of the present disclosure illustrated in FIG. 1.
Figure 2C:
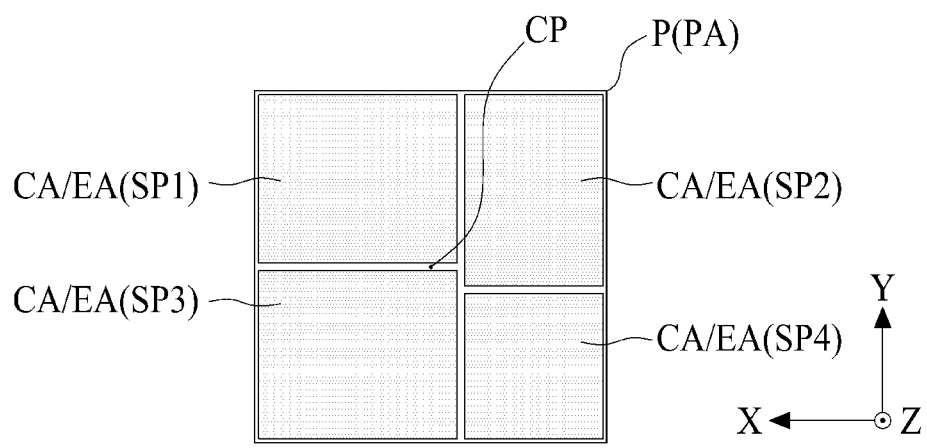
FIG. 2C is a diagram illustrating one pixel according to another embodiment of the present disclosure illustrated in FIG. 1.

FIG. 2A is a diagram illustrating one pixel according to an embodiment of the present disclosure illustrated in FIG. 1, FIG. 2B is a diagram illustrating one pixel according to another embodiment of the present disclosure illustrated in FIG. 1, and FIG. 2C is a diagram illustrating one pixel according to another embodiment of the present disclosure illustrated in FIG. 1.

Referring to FIGS. 1 and 2A, one pixel (or a unit pixel) P according to an embodiment of the present disclosure may include first to fourth subpixels SP1 to SP4.

The first subpixel SP1 may be disposed in a first subpixel area of the pixel area PA, the second subpixel SP2 may be disposed in a second subpixel area of the pixel area PA, the third subpixel SP3 may be disposed in a third subpixel area of the pixel area PA, and the fourth subpixel SP4 may be disposed in a fourth subpixel area of the pixel area PA.

The first to fourth subpixels SP1 to SP4 may be disposed in a 2×2 form or a quad form. The first to fourth subpixels SP1 to SP4 may each include a plurality of emission areas EA and a plurality of circuit areas CA. For example, the emission areas EA may be referred to as an opening area, an opening portion, or an emission portion.

The emission areas EA of each of the first to fourth subpixels SP1 to SP4 may have a uniform quad structure to have a square shape having the same size (or same area). According to an embodiment, each of the emission areas EA having a uniform quad structure may be disposed close to a center portion CP of the pixel P within a corresponding subpixel area to have a size which is less than each of four equal division regions of the pixel P or may be disposed to be concentrated at the center portion CP of the pixel P. According to another embodiment, each of the emission areas EA having a uniform quad structure may be disposed at the center portion CP of the corresponding subpixel area to have a size which is less than each of four equal division regions of the pixel P.

A circuit area CA of each of the first to fourth subpixels SP1 to SP4 may be disposed at a periphery of a corresponding emission area EA. The circuit area CA may include the pixel driving lines and the pixel circuit for allowing a corresponding subpixel to emit light. For example, the circuit area CA may be referred to as a non-emission area, a non-opening area, a non-emission portion, a non-opening portion, or a peripheral portion.

Referring to FIGS. 1 and 2B, an emission area EA of each of first to fourth subpixels SP1 to SP4 according to another embodiment of the present disclosure may extend to a circuit area CA to overlap a portion or all of the circuit area CA. That is, in order to increase an aperture ratio of each of subpixels SP1 to SP4 corresponding to a size of the emission area EA or decrease a pixel pitch D1 on the basis of implementation of a high resolution of each pixel P, the emission area EA of each of the first to fourth subpixels SP1 to SP4 may extend to the circuit area CA to overlap a portion or all of the circuit area CA. For example, the emission area EA of each of the first to fourth subpixels SP1 to SP4 may have a top emission structure, and thus, may be disposed to overlap a corresponding circuit area CA. Accordingly, the emission area EA may have a size which is greater than or equal to that of the circuit area CA.

Referring to FIGS. 1 and 2C, each of first to fourth subpixels SP1 to SP4 according to another embodiment of the present disclosure may be disposed in a non-uniform quad structure having different sizes. For example, an emission area EA of each of the first to fourth subpixels SP1 to SP4 may be disposed in a non-uniform quad structure having different sizes.

A size of each of the first to fourth subpixels SP1 to SP4 having a non-uniform quad structure may be set based on a resolution, emission efficiency, or image quality, or the like. When the emission area EA have a non-uniform quad structure, among the emission area EA of each of the first to fourth subpixels SP1 to SP4, the emission area EA of the fourth subpixel SP4 may have a smallest size (or area), and the emission area EA of the third subpixel SP3 may have a largest size. The emission area EA of each of the first to fourth subpixels SP1 to SP4 may extend to the circuit area CA to overlap some or all of the circuit area CA. For example, since the emission area EA of each of the first to fourth subpixels SP1 to SP4 have a top emission structure, the emission area EA may be arranged to overlap the corresponding circuit area CA. Thus, the emission area EA may have a size which is equal to or greater than the circuit area CA.

In FIGS. 2A to 2C, the first subpixel SP1 may be implemented to emit light of a first color, the second subpixel SP2 may be implemented to emit light of a second color, the third subpixel SP3 may be implemented to emit light of a third color, and the fourth subpixel SP4 may be implemented to emit light of a fourth color. For example, each of the first to fourth colors may be different. According to an embodiment of the present disclosure, the first color may be red, the second color may be blue, the third color may be white, and the fourth color may be green. According to another embodiment of the present disclosure, some of the first to fourth colors may be the same. For example, the first color may be red, the second color may be first green, the third color may be second green, and the fourth color may be blue.

Alternatively, each of the first to fourth subpixels SP1 to SP4 according to another embodiment of the present disclosure may have a 1×4 form, a uniform stripe structure, or a non-uniform stripe structure. For example, the emission area EA of each of the first to fourth subpixels SP1 to SP4 may have the 1×4 form, the uniform stripe structure, or the non-uniform stripe structure. For example, the emission area EA of each of the first to fourth subpixels SP1 to SP4 having the uniform stripe structure may each have a rectangular shape which includes a short side parallel to the first direction X and a long side parallel to the second direction Y. Optionally, a white subpixel implemented to emit white light in the first to fourth subpixels SP1 to SP4 having the 1×4 form, the uniform stripe structure, or the non-uniform stripe structure may be omitted.

Figure 3:
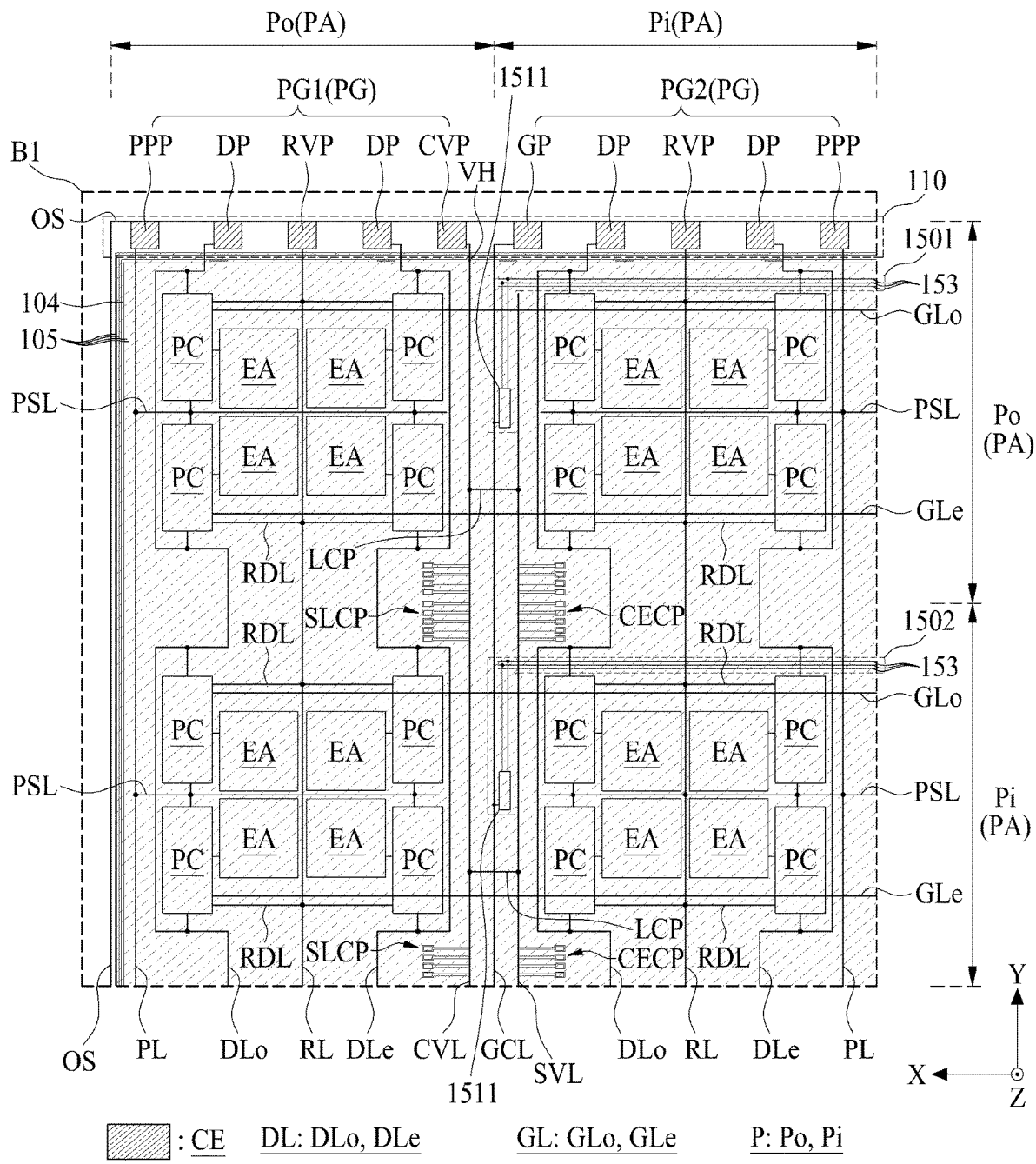
FIG. 3 is a schematic enlarged view of a region 'B1' illustrated in FIG. 1.
Figure 4:
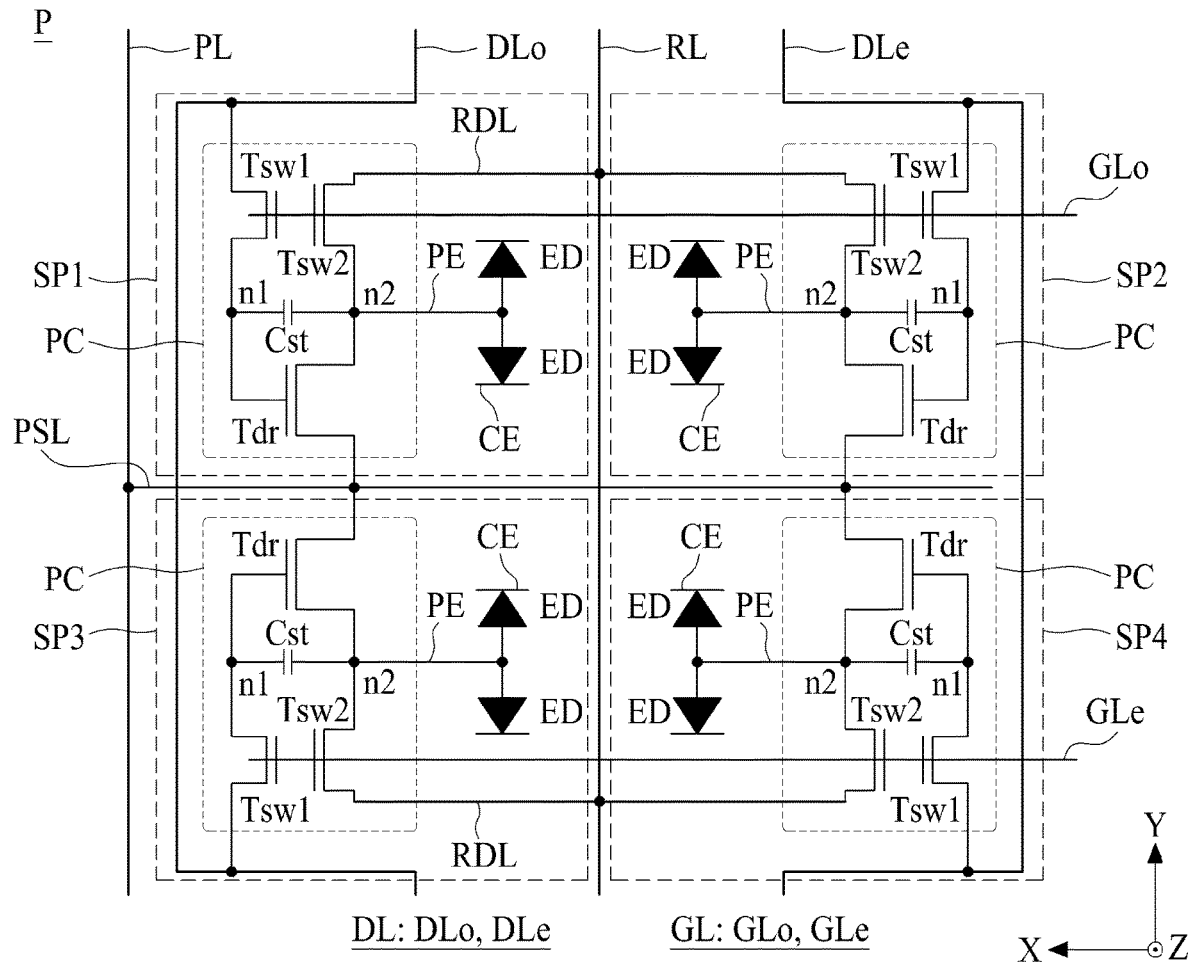
FIG. 4 is an equivalent circuit diagram illustrating one subpixel illustrated in FIGS. 1 and 3.

FIG. 3 is a schematic enlarged view of a region 'B1' illustrated in FIG. 1, and FIG. 4 is an equivalent circuit diagram illustrating one subpixel illustrated in FIGS. 1 and 3.

Referring to FIGS. 1, 3, and 4, a substrate 100 according to an embodiment of the present disclosure may include pixel driving lines DL, GL, PL, CVL, RL, and GCL, a plurality of pixels P, a common electrode CE, a plurality of common electrode connection portions CECP, a dam 104, a separation portion 105, and a pad portion 110.

The pixel driving lines DL, GL, PL, CVL, RL, and GCL may include a plurality of data lines DL, a plurality of gate lines GL, a plurality of pixel driving power lines PL, a plurality of pixel common voltage lines CVL, a plurality of reference voltage lines RL, and a plurality of gate control lines GCL.

The plurality of data lines DL may extend long along a second direction Y and may be disposed spaced apart from one another by a predetermined or selected interval over (or in) a display portion AA of the substrate 100 along the first direction X.

The plurality of gate lines GL may extend long along the first direction X and may be disposed spaced apart from one another by a predetermined or selected interval over (or in) the display portion AA of the substrate 100 along the second direction Y.

The plurality of pixel driving power lines PL may extend long along the second direction Y and may be disposed spaced apart from one another by a predetermined or selected interval over (or in) the display portion AA of the substrate 100 along the first direction X.

Two adjacent pixel driving power lines PL of the plurality of pixel driving power lines PL may be coupled to a plurality of power sharing lines PSL disposed in each of the pixel areas PA arranged along the second direction Y. For example, the plurality of pixel driving power lines PL may be electrically coupled to (or contact) one another by the plurality of power sharing lines PSL, and thus, may have a ladder structure or a mesh structure. The plurality of pixel driving power lines PL may have a ladder structure or a mesh structure, and thus, the voltage drop (IR drop) of the pixel driving power caused by a line resistance of each of the plurality of pixel driving power lines PL may prevent or minimize or reduce. Accordingly, the light emitting display apparatus according to embodiments of the present disclosure may be prevented or minimized or reduced the degradation in image quality caused by a deviation of the pixel driving power supplied to each of the pixels P arranged at the display portion AA.

Each of the plurality of power sharing lines PSL may branch from an adjacent pixel driving power line PL in parallel with the first direction X and may be disposed at a middle region of each pixel area PA, but embodiments of the present disclosure are not limited thereto.

The plurality of pixel common voltage lines CVL may extend long along the second direction Y and may be disposed spaced apart from one another by a predetermined or selected interval over (or in) the display portion AA of the substrate 100 along the first direction X. For example, each of the plurality of pixel common voltage lines CVL may be disposed at a first periphery portion of an even-numbered pixel area PA with respect to the first direction X, but embodiments of the present disclosure are not limited thereto.

The plurality of reference voltage lines RL may extend long along the second direction Y and may be disposed spaced apart from one another by a predetermined or selected interval over (or in) the display portion AA of the substrate 100 along the first direction X. Each of the plurality of reference voltage lines RL may be disposed at a center region of each of the pixel areas PA arranged along the second direction Y, but embodiments of the present disclosure are not limited thereto.

Each of the plurality of reference voltage lines RL may be shared by two adjacent subpixels ((SP1, SP2) (SP3, SP4)) along the first direction X in each pixel area PA. To this end, each of the plurality of reference voltage lines RL may include a reference branch line RDL. The reference branch line RDL may branch (or protrude) to the two adjacent subpixels ((SP1, SP2) (SP3, SP4)) along the first direction X in each pixel area PA and may be electrically connected to (or contact) the two adjacent subpixels ((SP1, SP2) (SP3, SP4)).

Each of the plurality of gate control lines GCL may extend long along the second direction Y and may be disposed spaced apart from one another by a predetermined or selected interval over (or in) the display portion AA of the substrate 100 along the first direction X. For example, each of the plurality of gate control lines GCL may be disposed at between the plurality of pixel areas PA or a boundary region between two adjacent pixel areas PA with respect to the first direction X.

Each of the plurality of pixels P may include at least three subpixels. For example, each of the plurality of pixels P may include first to fourth subpixels SP1 to SP4. Each of the first to fourth subpixels SP1 to SP4 may include a pixel circuit PC and a light emitting device layer.

The pixel circuit PC according to an embodiment may be disposed in a circuit area of the pixel area PA and may be connected to a gate line GLo or GLe adjacent thereto, a data line DLo or DLe adjacent thereto, and the pixel driving power line PL. For example, a pixel circuit PC disposed at a first subpixel SP1 may be connected to an odd-numbered data line DLo and an odd-numbered gate line GLo, a pixel circuit PC disposed at a second subpixel SP2 may be connected to an even-numbered data line DLe and an odd-numbered gate line GLo, a pixel circuit PC disposed at a third subpixel SP3 may be connected to an odd-numbered data line DLo and an even-numbered gate line GLe, and a pixel circuit PC disposed at a fourth subpixel SP4 may be connected to an even-numbered data line DLe and an even-numbered gate line GLe.

The pixel circuit PC of each of the first to fourth subpixels SP1 to SP4 may sample a data signal supplied from a corresponding data line DLo or DLe in response to a scan signal supplied from a corresponding gate line GLo or GLe and may control a current flowing from the pixel driving power line PL to the light emitting device layer based on a sampled data signal.

The pixel circuit PC according to an embodiment may include a first switching thin film transistor Tsw1, a second switching thin film transistor Tsw2, a driving thin film transistor Tdr, and a storage capacitor Cst, but embodiments of the present disclosure are not limited thereto. In the following description, a thin film transistor may be referred to as a TFT.

The first switching TFT Tsw1 may include a gate electrode coupled to a corresponding gate line GLo or GLe a first electrode (or a first source/drain electrode) connected to a corresponding data line DLo or DLe, and a second electrode (or a second source/drain electrode) connected to a gate node n1 of the driving TFT Tdr. The first switching TFT Tsw1 may be turned on by a scan signal (or a first gate signal) supplied through corresponding gate line GLo or GLe and may transfer a data signal, supplied through corresponding data line DLo or DLe, to the gate node n1 of the driving TFT Tdr.

The second switching TFT Tsw2 may include a gate electrode connected to a corresponding gate line GLo or GLe a first electrode (or a first source/drain electrode) connected to a source node n2 of the driving TFT Tdr, and a second electrode (or a second source/drain electrode) connected to a corresponding reference voltage line RL. The second switching TFT Tsw2 may be turned on by a scan signal (or a second gate signal) supplied through the corresponding gate line GLo or GLe and may transfer a reference voltage, supplied through the corresponding reference voltage line RL, to the source node n2 of the driving TFT Tdr. For example, the second switching TFT Tsw2 may be turned on simultaneously with the first switching TFT Tsw1.

The storage capacitor Cst may be formed between the gate node n1 and the source node n2 of the driving TFT Tdr.

The storage capacitor Cst according to an embodiment may include a first capacitor electrode connected to the gate node n1 of the driving TFT Tdr, a second capacitor electrode connected to the source node n2 of the driving TFT Tdr, and a dielectric layer formed in an overlap region between the first capacitor electrode and the second capacitor electrode. The storage capacitor Cst may be charged with a difference voltage between the gate node n1 and the source node n2 of the driving TFT Tdr, and then, may turn on or off the driving TFT Tdr based on a charged voltage thereof.

The driving TFT Tdr may include a gate electrode (or the gate node n1) connected to the second electrode of the first switching TFT Tsw1 and the first capacitor electrode of the storage capacitor Cst in common, a first electrode (or a first source/drain electrode or the source node n2) connected to the first electrode of the second switching TFT Tsw2, the second capacitor electrode of the storage capacitor Cst, and a pixel electrode PE of the light emitting device layer in common, and a second electrode (or a second source/drain electrode or a drain node) connected to a corresponding pixel driving power line PL. The driving TFT Tdr may be turned on based on a voltage of the storage capacitor Cst and may control the amount of current flowing from the pixel driving power line PL to the light emitting device layer.

The light emitting device layer may be disposed at an emission area EA of the pixel area PA and electrically connected to (or contact) the pixel circuit PC. The light emitting device layer according to an embodiment may a pixel electrode PE electrically connected to (or contact) the pixel circuit PC, a common electrode CE electrically connected to (or contact) the pixel common voltage line CVL, and a self-emitting device ED interposed between the pixel electrode PE and the common electrode CE.

Each of the plurality of common electrode connection portions CECP may be disposed between the plurality of pixels P respectively overlapping the plurality of pixel common voltage lines CVL and may electrically connected to (or contact) the common electrode CE to each of the plurality of pixel common voltage lines CVL. With respect to the first direction X and the second direction Y, each of the plurality of common electrode connection portions CECP according to an embodiment may be electrically coupled to each of the plurality of pixel common voltage lines CVL in a portion between the plurality of pixels P or a boundary portion between the plurality of pixels P and may be electrically connected to (or contact) a portion of the common electrode CE, and thus, may electrically connected to (or contact) the common electrode CE to each of the plurality of pixel common voltage lines CVL.

Each of the plurality of common electrode connection portions CECP may be disposed a portion between the plurality of pixels P to electrically connect to (or contact) the common electrode CE to each of the plurality of pixel common voltage lines CVL, and thus, may prevent or minimize or reduce the voltage drop (IR drop) of the pixel common voltage caused by a surface resistance of the common electrode CE. According to an embodiment of the present disclosure, each of the plurality of common electrode connection portions CECP may be formed together with a pixel electrode PE having at least two-layer structure so as to be electrically connected to (or contact) to each of the plurality of pixel common voltage lines CVL. For example, the common electrode CE may be connected to (or contact) to each of the plurality of common electrode connection portions CECP by a side contact structure (or a side exposed structure).

Each of the dam 104 and the separation portion 105 may be disposed or implemented at periphery portions of the substrate 100 or the outermost pixels Po to have a closed loop line shape (or a closed loop shape). Each of the dam 104 and the separation portion 105 is the same as described with reference to FIG. 1, and thus, their repetitive descriptions are omitted.

The pad portion 110 may include a plurality of first pads which are disposed in parallel with one another along the first direction X at the first periphery portion of the substrate 100. The plurality of first pads may be divided (or classified) into a plurality of first data pads DP, a plurality of first gate pads GP, a plurality of first pixel driving power pads PPP, a plurality of first reference voltage pads RVP, and a plurality of first pixel common voltage pads CVP.

Each of the plurality of first data pads DP may be individually (or a one-to-one relationship) connected to one side end of each of the plurality of data lines DLo and DLe disposed on the substrate 100.

Each of the plurality of first gate pads GP may be individually (or a one-to-one relationship) connected to one side end of each of the gate control lines GCL disposed at the substrate 100. The plurality of first gate pads GP may be divided (or classified) into a first start signal pad, a plurality of first shift clock pads, a plurality of first carry clock pads, at least one first gate driving power pad, and at least one first gate common power pad, or the like.

Each of the plurality of first pixel driving power pads PPP may be individually (or a one-to-one relationship) connected to one side end of each of the plurality of pixel driving power lines PL disposed on the substrate 100. Each of the first reference voltage pads RVP may be individually (or a one-to-one relationship) connected to one side end of each of the plurality of reference voltage lines RL disposed on the substrate 100. Each of the first pixel common voltage pads CVP may be individually (or a one-to-one relationship) connected to one side end of each of the plurality of pixel common voltage lines CVL disposed on the substrate 100.

The pad portion 110 according to an embodiment of the present disclosure may include a plurality of pad groups PG disposed along the first direction X. Each of the plurality of pad groups PG may be connected to two adjacent pixels P disposed along the first direction X. Each of the plurality of pad groups PG may include a first pad group PG1 and a second pad group PG1 which are alternately disposed along the first direction X. The first pad group PG1 may include a first pixel driving power pad PPP, a first data pad DP, a first reference voltage pad RVP, a first data pad DP, and a first pixel common voltage pad CVP continuously disposed within an odd-numbered pixel area PA along the first direction X. The second pad group PG2 may include a first gate pad GP, a first data pad DP, a first reference voltage pad RVP, a first data pad DP, and a first pixel driving power pad PPP continuously disposed within an even-numbered pixel area PA along the first direction X.

The light emitting display apparatus 10 or the substrate 100 according to an embodiment of the present disclosure may further include a plurality of secondary voltage lines SVL and a plurality of secondary line connection portions SLCP.

Each of the plurality of secondary voltage lines SVL may extend long along the second direction Y and may be disposed adjacent to a corresponding pixel common voltage line CVL of the plurality of pixel common voltage lines CVL. Each of the plurality of secondary voltage lines SVL may be electrically connected to (or contact) an adjacent pixel common voltage line CVL without being electrically connected to (or contact) the pixel common voltage pad CVP1, and thus, may be supplied with a pixel common voltage from the adjacent pixel common voltage line CVL. To this end, the substrate 100 according to an embodiment of the present disclosure may further include a plurality of line connection patterns LCP which electrically connect (or contact) a pixel common voltage line CVL and a secondary voltage lines SVL adjacent to each other.

Each of the plurality of line connection patterns LCP may be disposed on the substrate 100 so as to intersect or overlap with a pixel common voltage line CVL and a secondary voltage lines SVL adjacent to each other, and may electrically connect (or contact) a pixel common voltage line CVL and a secondary voltage lines SVL adjacent to each other through a line jumping structure. For example, one side of each of the plurality of line connection patterns LCP may be electrically connected to (or contact) a portion of the secondary voltage lines SVL through a first line contact hole formed at an insulation layer over the secondary voltage lines SVL, and the other side of each of the plurality of line connection patterns LCP may be electrically connected to (or contact) a portion of the pixel common voltage line CVL through a second line contact hole formed at the insulation layer over the pixel common voltage line CVL.

Each of the plurality of secondary line connection portions SLCP may electrically connect (or contact) the common electrode CE to each of the plurality of secondary voltage lines SVL at between the plurality of pixels P overlapping each of the plurality of secondary voltage lines SVL. With respect to the second direction Y, each of the plurality of secondary line connection portions SLCP according to an embodiment may be electrically connected to (or contact) each of the plurality of secondary voltage lines SVL in a portion between the plurality of pixels P or a boundary portion between the plurality of pixels P, and may be electrically connected to (or contact) a portion of the common electrode CE, and thus, may electrically connect (or contact) the common electrode CE to each of the plurality of secondary voltage lines SVL. Therefore, the common electrode CE may be additionally connected to each of the plurality of secondary voltage lines SVL through the secondary line connection portions SLCP. Accordingly, the light emitting display apparatus 10 according to an embodiment of the present disclosure may more prevent or minimize or reduce the degradation in image quality caused by a deviation of the pixel common voltage supplied to each of the pixels P arranged in the display portion AA. Also, in the light emitting display apparatus 10 according to an embodiment of the present disclosure, although the pixel common voltage pad CVP connected to each of the plurality of secondary voltage lines SVL is not additionally disposed (or formed), the pixel common voltage may be supplied to each of the plurality of secondary voltage lines SVL through each of the pixel common voltage lines CVL and the plurality of line connection patterns LCP.

The light emitting display apparatus 10 or the substrate 100 according to an embodiment of the present disclosure may further include an encapsulation layer.

The encapsulation layer may be implemented to surround a light emitting device layer. The encapsulation layer may include a first inorganic encapsulation layer (or a first encapsulation layer) disposed over the light emitting device layer, the dam 104 and the separation portion 105, a second inorganic encapsulation layer (or a third encapsulation layer) disposed over the first inorganic encapsulation layer, and an organic encapsulation layer (or a second encapsulation layer) interposed between the first inorganic encapsulation layer and the second inorganic encapsulation layer disposed over an encapsulation region adjacent the dam 104.

The organic encapsulation layer may cover a front surface (or a top surface) of the light emitting device layer and may flow toward an end of the substrate 100, and the spread (or flow) of the organic encapsulation layer may be blocked by the dam 104. The dam 104 may define or limit an arrangement region (or an encapsulation region) of the organic encapsulation layer, and the spread or overflow of the organic encapsulation layer may be blocked or prevented.

Figure 5:
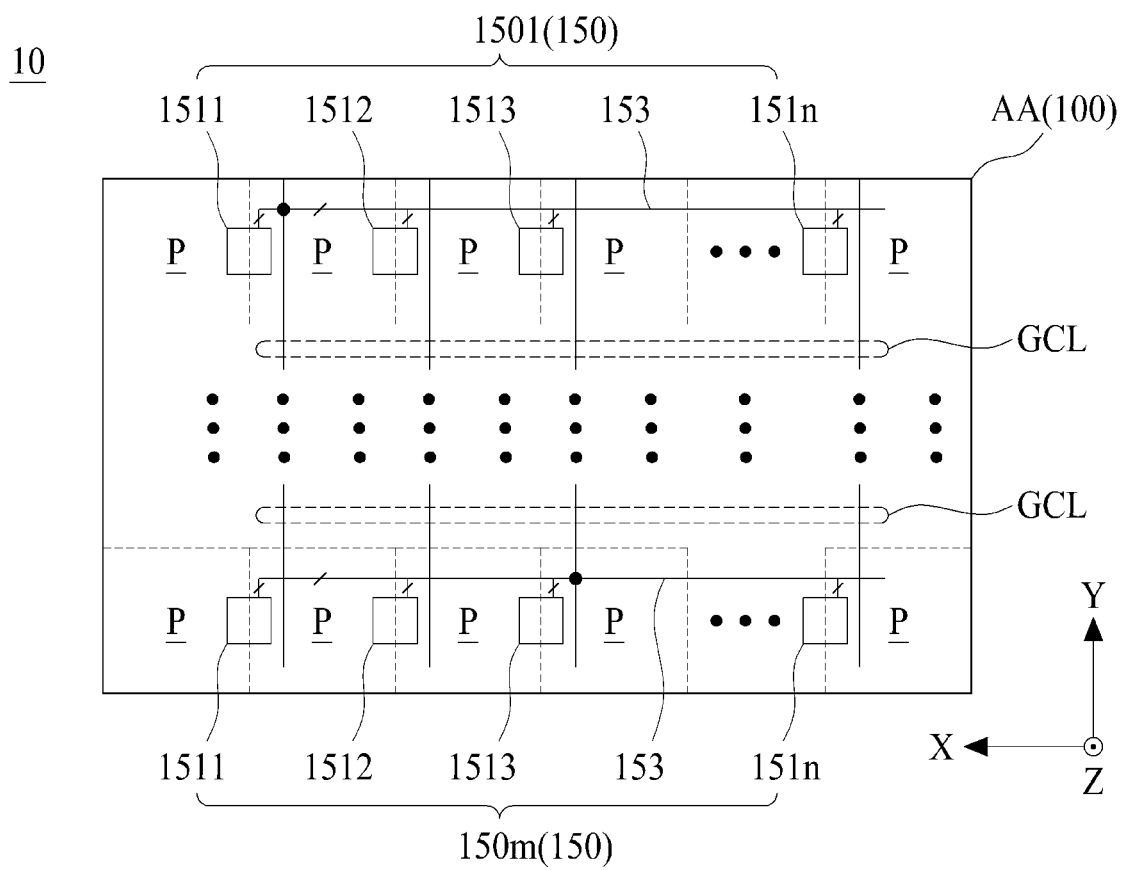
FIG. 5 is a diagram illustrating a gate driving circuit illustrated in FIGS. 1 and 3.

FIG. 5 is a diagram illustrating a gate driving circuit illustrated in FIGS. 1 and 3.

Referring to FIGS. 1, 3, and 5, the gate driving circuit 150 according to another embodiment of the present disclosure may be implemented (or embedded) within the display portion AA of the substrate 100. The gate driving circuit 150 may generate a scan signal based on gate control signals supplied through the pad portion 110 and the gate control lines GCL, and sequentially supply the scan signal to the plurality of gate lines GL.

The gate control lines GCL may include a start signal line, a plurality of shift clock lines, at least one gate driving voltage line, and at least one gate common voltage line. The gate control lines GCL may extend long along a second direction Y and may be disposed spaced apart from one another by a predetermined or selected interval in a display portion AA of the substrate 100 along the first direction X. For example, the gate control lines GCL may be disposed between at least one pixels P along the first direction X.

The gate driving circuit 150 may be implemented with a shift register including a plurality of stage circuits 1501 to 150*m*, where m is an integer of 2 or more.

Each of the plurality of stage circuits 1501 to 150*m* may be individually disposed in each horizontal line on a first surface of the substrate 100 along the first direction X and may be dependently connected to one another along the second direction Y. Each of the plurality of stage circuits 1501 to 150*m* may generate a scan signal in a predetermined or selected order in response to gate control signals supplied through the pad portion 110 and the gate control lines GCL and may supply the scan signal to a corresponding gate line GL.

Each of the plurality of stage circuits 1501 to 150*m* may include a plurality of branch circuits 1511 to 151*n* and a branch network 153.

The plurality of branch circuits 1511 to 151*n* may be selectively connected to the gate control lines GCL through the branch network 153 and may be electrically connected to (or contact) one another through the branch network 153. Each of the plurality of branch circuits 1511 to 151*n* may generate the scan signal based on a gate control signal supplied through the gate control lines GCL and a voltage of the branch network 153, and may supply the scan signal to a corresponding gate line GL.

Each of the plurality of branch circuits 1511 to 151*n* may include at least one TFT (or branch TFT) of a plurality of TFTs configuring one stage circuit of the plurality of stage circuits 1501 to 150*m*. Any one branch circuit of the plurality of branch circuits 1511 to 151*n* may include a pull-up TFT connected to the gate line GL. The other branch circuit of the plurality of branch circuits 1511 to 151*n* may include a pull-down TFT connected to the gate line GL.

Each of the plurality of branch circuits 1511 to 151*n* according to an embodiment may be disposed at a circuit area between two adjacent pixels P or at a circuit area between at least two adjacent pixels P, in each horizontal line of the substrate 100, but embodiments of the present disclosure are not limited thereto. For example, each of the plurality of branch circuits 1511 to 151n may be disposed at a circuit area (or a boundary region) between at least one adjacent pixels P according to the number of TFTs configuring the one stage circuit 1501 to 150m and the number of pixels P disposed one horizontal line.

The branch network 153 may be disposed at each horizontal line of the substrate 100 and may electrically connect (or contact) the plurality of branch circuits 1511 to 151n to each other. The branch network 153 may include a plurality of control node lines and a plurality of network line.

The plurality of control node lines may be disposed at each horizontal line of the substrate 100 and may be selectively connected to the plurality of branch circuits 1511 to 151n within one horizontal line. For example, the plurality of control node lines may be disposed at an upper periphery region (or a lower periphery region) among pixel areas arranged within each horizontal line of the substrate 100, but embodiments of the present disclosure are not limited thereto.

The plurality of network line may be selectively connected to the gate control lines GCL disposed at the substrate 100 and may be selectively connected to the plurality of branch circuits 1511 to 151n. For example, the plurality of network line may transfer the gate control signal supplied from the gate control lines GCL to corresponding branch circuits 1511 to 151n and may transfer a signal between the plurality of branch circuits 1511 to 151n.

As described above, according to an embodiment of the present embodiment, because the gate driving circuit 150 is disposed within the display portion AA of the substrate 100, a second interval D2 between a center portion of the outermost pixel Po and the outer surfaces OS of the substrate 100 may be equal to or less than half of a first interval (or a pixel pitch) D1 between adjacent pixel P. For example, when the gate driving circuit 150 is not disposed within the display portion AA of the substrate 100 and is disposed at a periphery portion of the substrate 100, the second interval D2 may not be equal to or less than half of the first interval D1 due to the gate driving circuit 150. Accordingly, in the light emitting display apparatus 10 according to an embodiment of the present disclosure, the gate driving circuit 150 may be disposed within the display portion AA of the substrate 100, and thus, the second interval D2 may be implemented to be equal to or less than half of the first interval D1, and moreover, the light emitting display apparatus 10 may be implemented to have an air bezel structure which has a zeroized bezel or where a bezel area is not provided.

Figure 6:
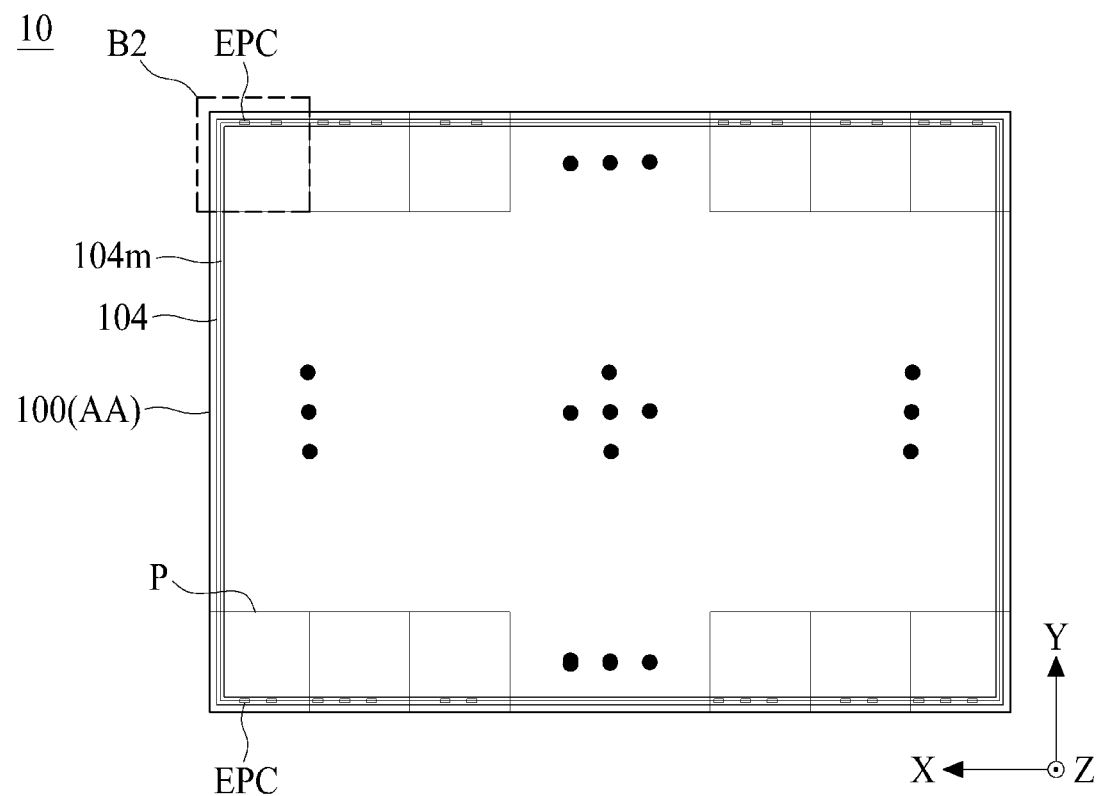
FIG. 6 is a diagram for describing a dam and an anti-electrostatic circuit according to an embodiment of the present disclosure.
Figure 7:
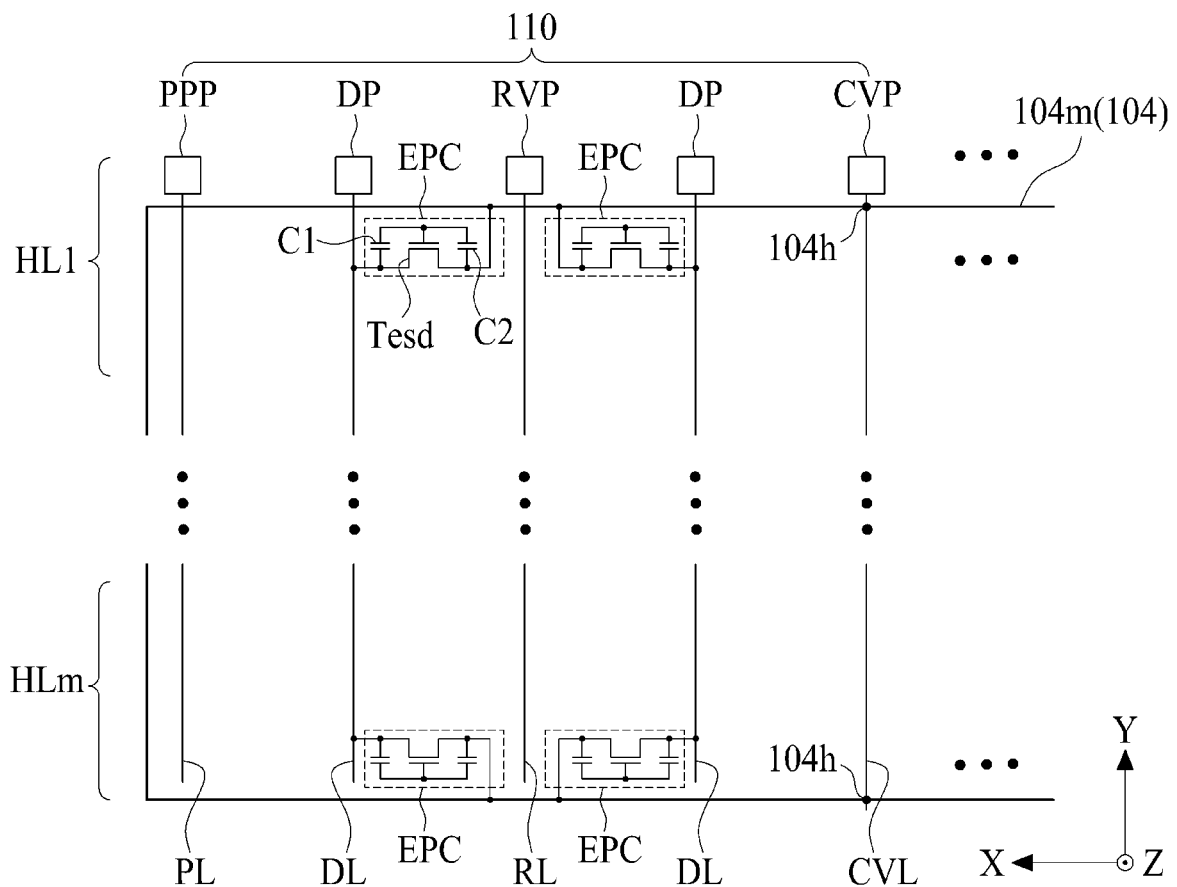
FIG. 7 is a diagram for describing the anti-electrostatic circuit illustrated in FIG. 6.
Figure 8:
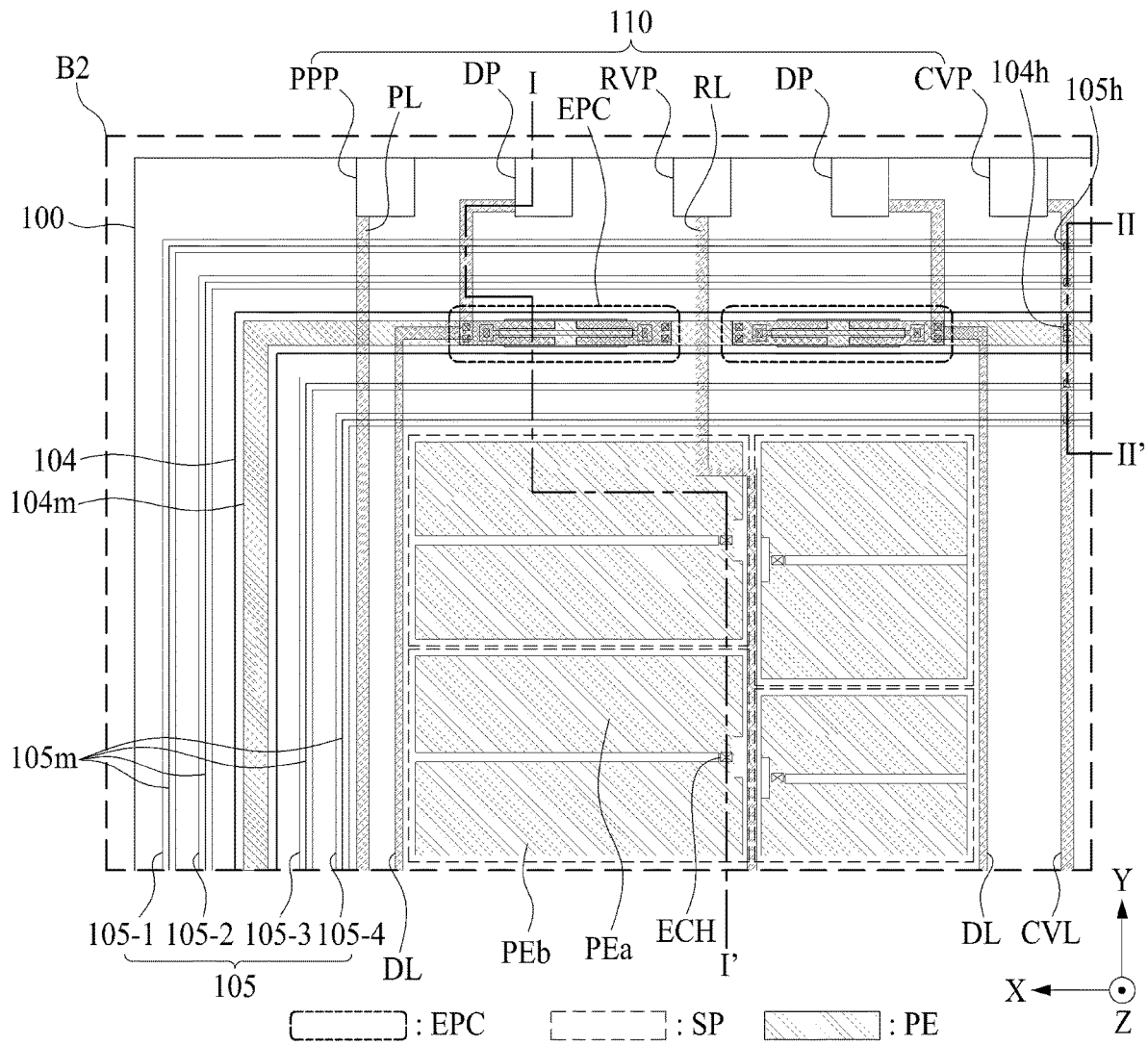
FIG. 8 is a schematic enlarged view of a portion 'B2' illustrated in FIG. 6.
Figure 9:
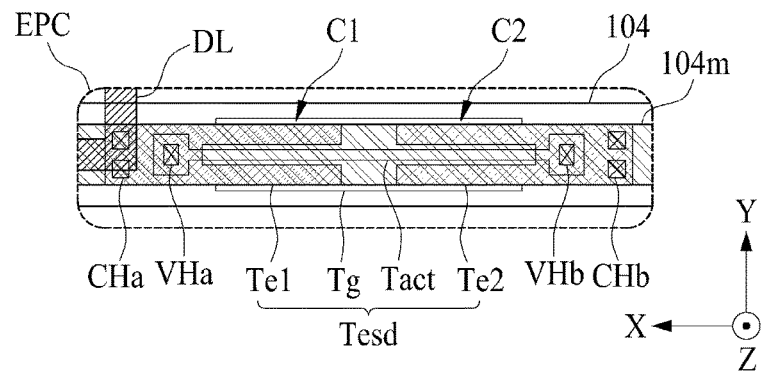
FIG. 9 is a diagram illustrating the anti-electrostatic circuit illustrated in FIG. 8.

FIG. 6 is a diagram for describing a dam and an anti-electrostatic circuit according to an embodiment of the present disclosure, FIG. 7 is a diagram for describing the anti-electrostatic circuit illustrated in FIG. 6, FIG. 8 is a schematic enlarged view of a portion 'B2' illustrated in FIG. 6, and FIG. 9 is a diagram illustrating the anti-electrostatic circuit illustrated in FIG. 8.

Referring to FIGS. 1, 3, 6, and 7, a dam 104 according to an embodiment of the present disclosure may include a metal line 104m.

The metal line 104m may be embedded or implemented in the dam 104, and thus, may one-dimensionally have the same closed loop line shape (or continuous line shape or closed loop shape) as that of the dam 104. The metal line 104m may receive an anti-electrostatic power from a driving circuit unit (or simply a "driving circuit") through the pad portion 110, or may be grounded or connected to a mechanism including a metal material to be grounded through the pad portion 110 and the driving circuit unit.

The anti-electrostatic power according to an embodiment of the present disclosure may be a pixel common voltage. In this case, the metal line 104m may be electrically coupled to a pixel common voltage line CVL connected to a first pixel common voltage pad CVP of the pad portion 110. For example, the metal line 104m may be electrically connected (or contact) to the pixel common voltage line CVL through a via hole 104h formed at an intersection or overlap region between the dam 104 and the pixel common voltage line CVL.

The anti-electrostatic power according to another embodiment of the present disclosure may be a ground power (or a ground power). In this case, the pad portion 110 may further include a separate ground pad (or dummy pad), and thus, the metal line 104m may be electrically coupled to a ground line electrically coupled to a ground pad of the pad portion 110. The ground line may be electrically coupled to the ground pad of the pad portion 110 and may extend along a second direction Y to intersect with or overlap the dam 104. For example, the metal line 104m may be connected (or contact) to the pixel common voltage line CVL through the via hole 104h formed in an intersection or overlap region between the dam 104 and the ground line.

The anti-electrostatic circuit EPC may be embedded or implemented in each of some outermost pixels Po of a plurality of outermost pixels Po so as to be connected to at least one of one side (or one end) and the other side (or the other end) of the pixel driving line. For example, the anti-electrostatic circuit EPC may be embedded or implemented at each of some outermost pixels Po of a plurality of outermost pixels Po disposed at each of a first edge portion (or a first horizontal line HL1) and a second edge portion (or a last horizontal line HLm) of the substrate 100 so as to be electrically coupled to each of the one side (or one end) and the other side (or the other end) of the pixel driving line. The anti-electrostatic circuit EPC may be implemented to discharge static electricity, flowing into the pixel driving line, to the metal line 104m. The anti-electrostatic circuit EPC may be embedded or implemented at the outermost pixel Po so as to electrically be connected between the pixel driving line and the metal line 104m of the dam 104.

The anti-electrostatic circuit EPC according to an embodiment of the present disclosure may be implemented to overlap the dam 104 disposed at each of the first edge portion (or the first horizontal line HL1) and the second edge portion (or the last horizontal line HLm) of the substrate 100. For example, the anti-electrostatic circuit EPC may be formed or implemented between the substrate 100 and the dam 104. The anti-electrostatic circuit EPC may be formed or implemented under (or a lower portion) the dam 104. The anti-electrostatic circuit EPC may overlap the metal line 104m embedded in the dam 104. At least one inorganic insulation layer and at least one organic insulation layer may be disposed between the anti-electrostatic circuit EPC and the metal line 104m.

The anti-electrostatic circuit EPC according to an embodiment of the present disclosure may be electrically coupled between pixel driving lines PL, DL, RL, and GCL and the metal line 104m of the dam 104. The anti-electrostatic circuit EPC may be electrically coupled between the metal line 104m of the dam 104 and at least one of a plurality of data lines DL, a plurality of pixel driving power lines PL, a plurality of reference voltage lines RL, and a plurality of gate control lines GCL.

According to an embodiment of the present disclosure, when a length of the anti-electrostatic circuit EPC in a first direction X is less than a length between two adjacent pixel driving lines PL, DL, RL, and GCL, the anti-electrostatic circuit EPC may be electrically coupled or implemented between each of all pixel driving lines PL, DL, RL, and GCL and the metal line 104*m*.

According to an embodiment of the present disclosure, when a length of the anti-electrostatic circuit EPC along a first direction X is greater than a length between two adjacent pixel driving lines PL, DL, RL, and GCL, the anti-electrostatic circuit EPC may be electrically coupled or implemented between the metal line 104*m* and each of some pixel driving lines receiving an alternating current (AC) signal among all pixel driving lines PL, DL, RL, and GCL. For example, the anti-electrostatic circuit EPC may be electrically coupled or implemented between each of the plurality of data lines DL and the metal line 104*m* and between each of the plurality of gate control lines GCL and the metal line 104*m*. For example, as illustrated in FIG. 7, the anti-electrostatic circuit EPC may be electrically coupled or implemented between each of the plurality of data lines DL and the metal line 104*m*.

Referring to FIGS. 6 to 9, one anti-electrostatic circuit EPC according to an embodiment of the present disclosure may include a protection TFT Tesd, a first capacitor C1, and a second capacitor C2.

The protection TFT Tesd may include a gate electrode Tg, a first electrode (or a first source/drain electrode) Te1 electrically coupled to a corresponding pixel driving line DL, and a second electrode (or a second source/drain electrode) Te2 electrically coupled to the metal line 104*m* of the dam 104.

The gate electrode Tg of the protection TFT Tesd may be a floating gate electrode which is not directly supplied with a separate gate voltage. The gate electrode Tg may be maintained in an electrical floating state. The gate electrode Tg may be disposed on or over an active layer Tact. The gate electrode Tg may overlap the other portion, except first and second edge portions, of the active layer Tact.

The first electrode Te1 of the protection TFT Tesd may be electrically connected (or contact) to a corresponding pixel driving line DL through a first contact hole CHa. For example, the first electrode Te1 may overlap each of one side of the active layer Tact and one side of the gate electrode Tg and may be electrically connected (or contact) to the one side of the active layer Tact through a first via hole VHa.

The second electrode Te2 of the protection TFT Tesd may be electrically connected (or contact) to the metal line 104*m* of the dame 104 through a second contact hole CHb. The second electrode Te2 may overlap each of the other side of the active layer Tact and the other side of the gate electrode Tg and may be electrically connected (or contact) to the other side of the active layer Tact through a second via hole VHb.

The first capacitor C1 may be formed or implemented between the gate electrode Tg and the first electrode Te1 of the protection TFT Tesd. For example, the first capacitor C1 may be formed or implemented by an insulation layer disposed between the gate electrode Tg and the first electrode Te1 of the protection TFT Tesd.

The second capacitor C2 may be formed or implemented between the gate electrode Tg and the second electrode Te2 of the protection TFT Tesd. For example, the second capacitor C2 may be formed or implemented by an insulation layer disposed between the gate electrode Tg and the second electrode Te2 of the protection TFT Tesd.

The first and second capacitors C1 and C2 may be electrically and serially connected between the pixel driving line DL and the metal line 104*m*. In order to enhance a switching speed of the protection TFT Tesd, a capacitance of the first capacitor C1 may be relatively greater than that of the second capacitor C2. The first and second capacitors C1 and C2 may divide a voltage applied to the pixel driving line to apply a divided voltage to the gate electrode of the protection TFT Tesd, and thus, may turn on the protection TFT Tesd.

As described above, when a high-voltage static electricity flows into the pixel driving line, the protection TFT Tesd of the anti-electrostatic circuit EPC may be driven in response to a voltage-division voltage, and thus, may discharge static electricity, flowing into the pixel driving line, to the metal line 104*m*. The anti-electrostatic circuit EPC may overlap the dam 104 or may be disposed under the dam 104, and thus, may protect the pixel circuit PC disposed in the outermost pixel Po without any increase in size of the outermost pixel Po.

Figure 10:
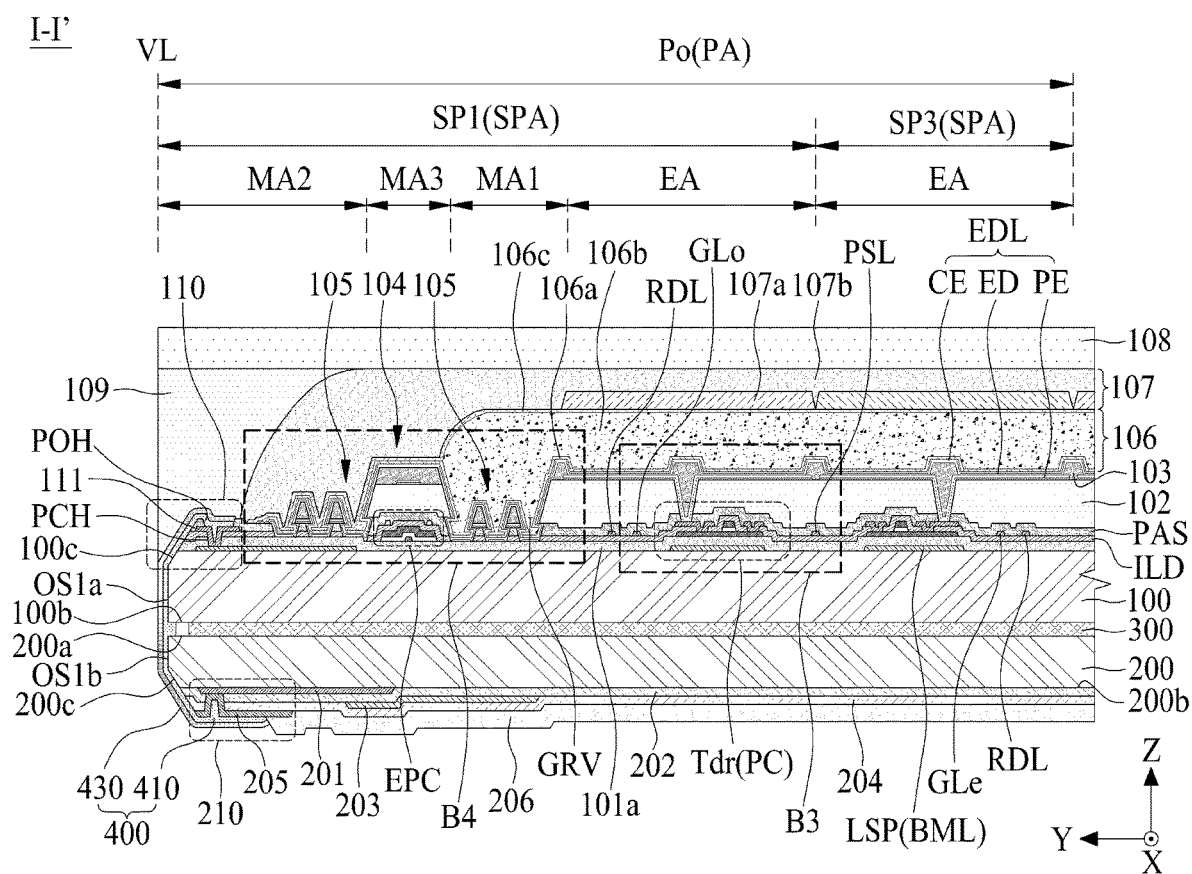
FIG. 10 is a cross-sectional view taken along line I-I' illustrated in FIG. 8.
Figure 11:
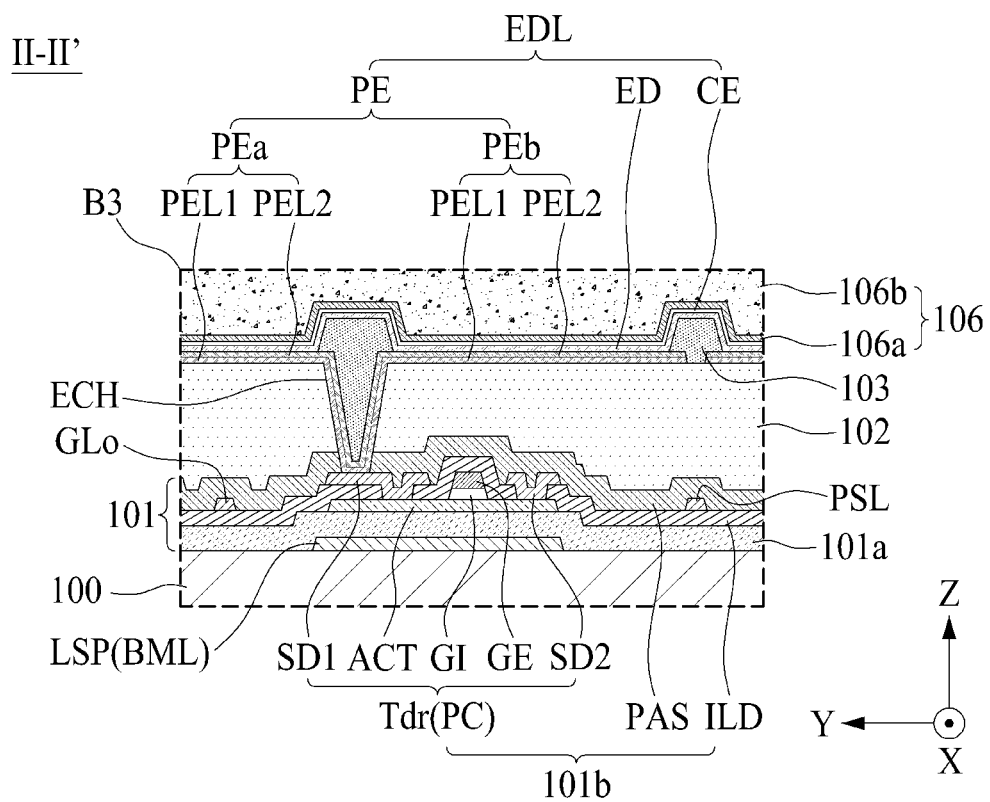
FIG. 11 is a schematic enlarged view of a region 'B3' illustrated in FIG. 10.
Figure 12:
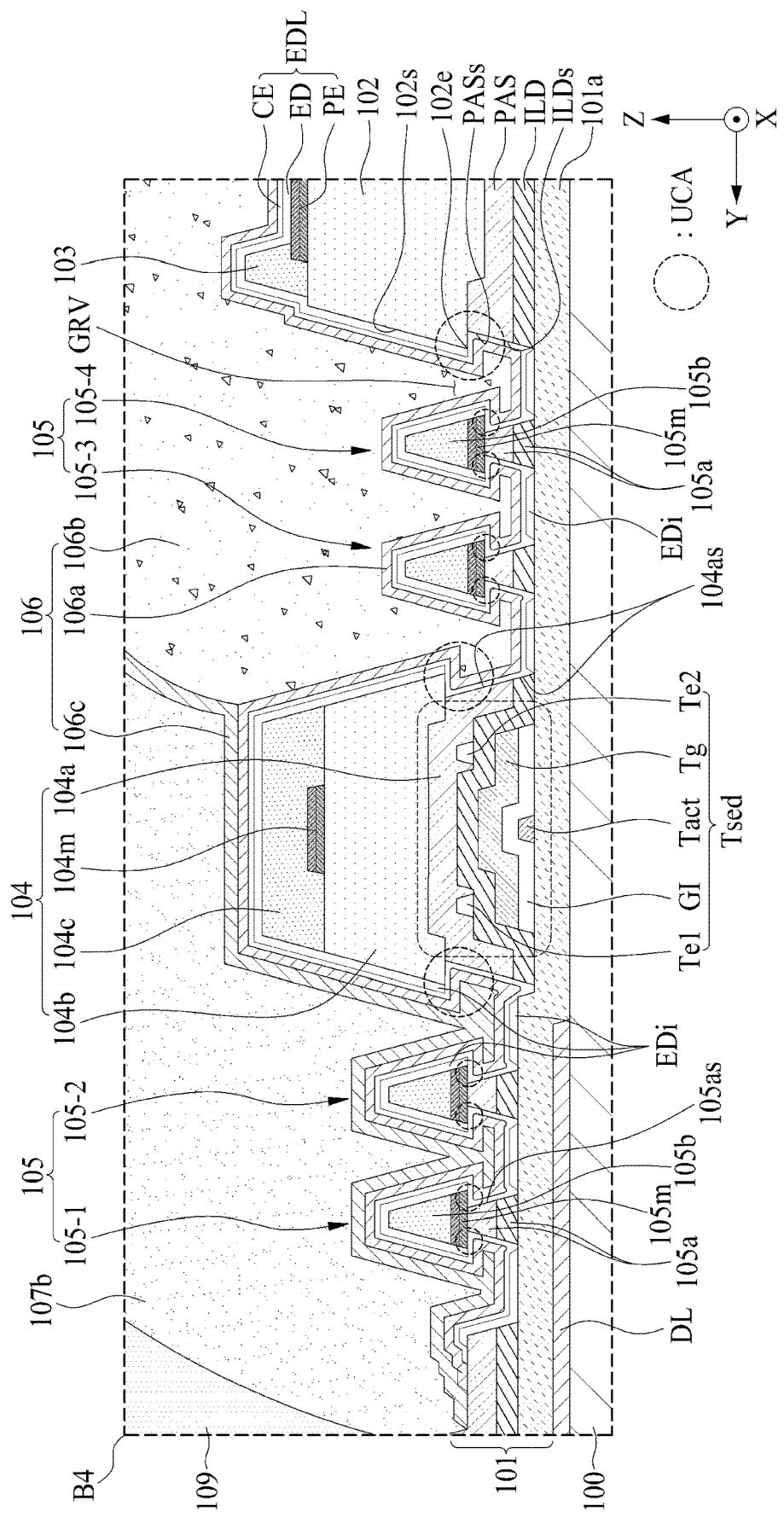
FIG. 12 is a schematic enlarged view of a region 'B4' illustrated in FIG. 10.
Figure 13:
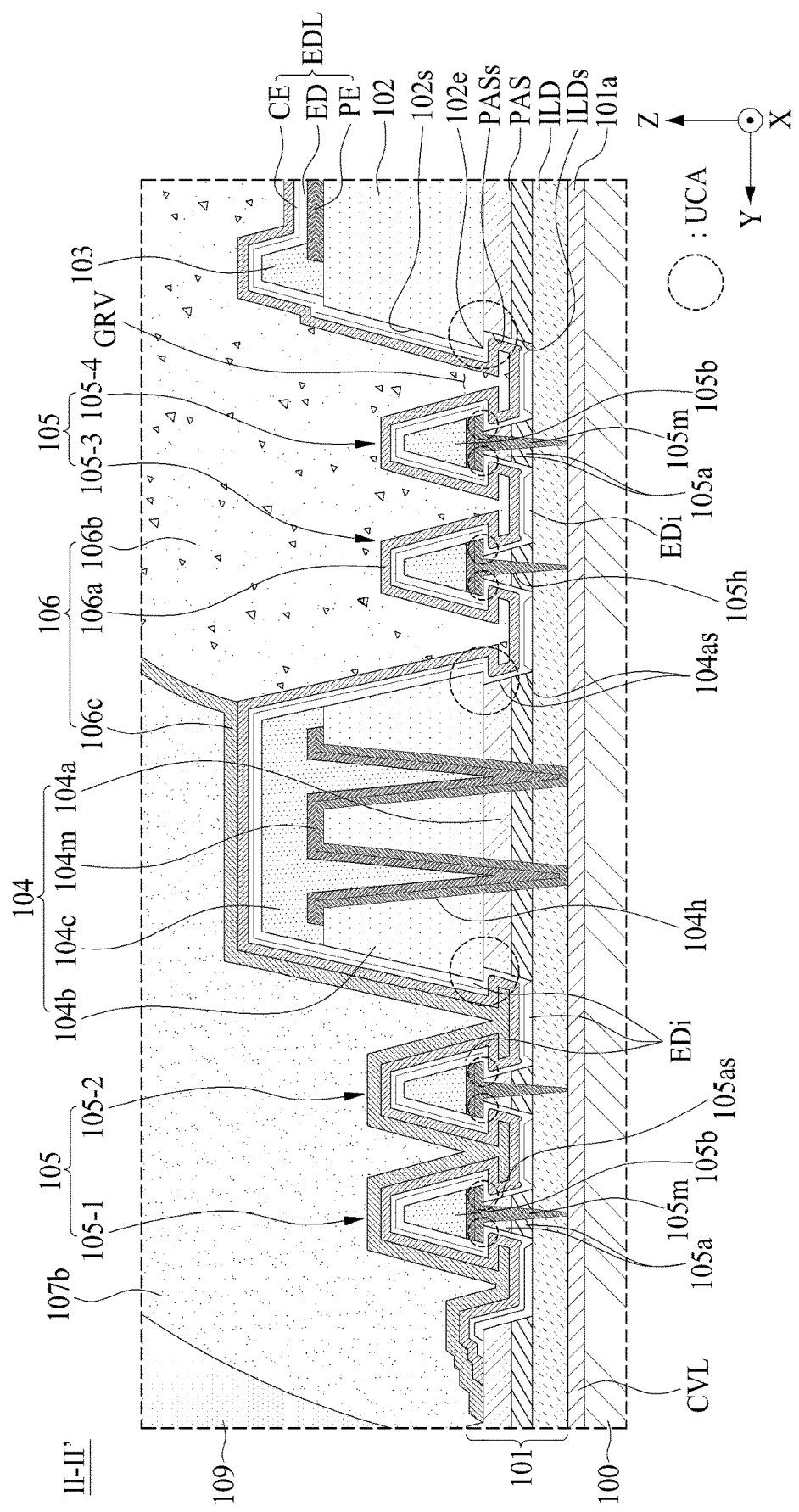
FIG. 13 is a cross-sectional view taken along line II-IP illustrated in FIG. 8.

FIG. 10 is a cross-sectional view taken along line I-I' illustrated in FIGS. 8, FIG. 11 is a schematic enlarged view of a region 'B3' illustrated in FIG. 10, FIG. 12 is a schematic enlarged view of a region 'B4' illustrated in FIG. 10, and FIG. 13 is a cross-sectional view taken along line II-II' illustrated in FIG. 8.

Referring to FIGS. 10 to 13, a light emitting display apparatus (or a light emitting display panel) 10 according to an embodiment of the present disclosure may include a substrate 100, a line substrate 200, a coupling member 300, and a routing portion 400.

The substrate 100 according to an embodiment of the present disclosure may include a circuit layer 101, an anti-electrostatic circuit EPC, a planarization layer 102, a light emitting device layer EDL, a bank 103, a dam 104, and an encapsulation layer 106.

The circuit layer 101 may be disposed over the substrate 100. The circuit layer 101 may be referred to as a pixel array layer or a TFT array layer.

The circuit layer 101 according to an embodiment may include a buffer layer 101*a* and a circuit array layer 101*b*.

The buffer layer 101*a* may prevent materials, such as hydrogen or the like included in the substrate 100, from being diffused to the circuit array layer 101*b* in a high temperature process of a process of manufacturing a TFT. Also, the buffer layer 101*a* may prevent external water or moisture from penetrating into the light emitting device layer EDL. For example, the buffer layer 101*a* may be formed of an inorganic material.

The circuit array layer 101*b* may include a pixel circuit PC which includes a driving TFT Tdr disposed in each of a plurality of pixel areas PA over the buffer layer 101*a*, the anti-electrostatic circuit EPC, and a passivation layer PAS.

The driving TFT Tdr disposed in a circuit area of each pixel area PA may include an active layer ACT, a gate insulation layer GI, a gate electrode GE, a first electrode SD1, and a second electrode SD2.

The active layer ACT may be disposed over the buffer layer 101*a* in each pixel area PA. The active layer ACT may include a channel area, overlapping the gate electrode GE, and a first electrode contact area and a second electrode contact area parallel to each other whit the channel areas therebetween. The active layer ACT may have conductivity in a conductivity process, and thus, may be used as a bridge line of a jumping structure which directly connects (or contacts) lines within the display portion AA or electrically connects (or contacts) lines disposed on different layers.

The gate insulation layer GI may be disposed over the channel area of the active layer ACT. The gate insulation layer GI may insulate the active layer ACT from the gate electrode GE.

The gate electrode GE may be disposed over the gate insulation layer GI and connected to the gate line. The gate electrode GE may overlap the channel area of the active layer ACT with the gate insulation layer GI therebetween. The gate electrode GE and the active layer ACT may be covered by an interlayer insulation layer ILD.

The interlayer insulation layer ILD may be disposed over the substrate 100 to cover the gate electrode GE and the active layer ACT. For example, the interlayer insulation layer ILD may be formed of an inorganic material. The interlayer insulation layer ILD according to an embodiment may include a single-layer structure including one of silicon oxide (SiOx), silicon nitride (SiNx), silicon oxynitride (SiONx), titanium oxide (TiOx), and aluminum oxide (AlOx) or a stacked structure thereof, but embodiments of the present disclosure are not limited thereto. For example, the interlayer insulation layer ILD may be referred to as an insulation layer or a first insulation layer.

The first electrode SD1 may be disposed over the interlayer insulation layer ILD overlapping the first electrode contact area of the active layer ACT and may be electrically connected to (or contact) the first electrode contact area of the active layer ACT through a first via hole disposed in the interlayer insulation layer ILD. For example, the first electrode SD1 may be a source electrode of the driving TFT Tdr, and the first electrode contact area of the active layer ACT may be a source area.

The second electrode SD2 may be disposed over the interlayer insulation layer ILD overlapping the second electrode contact area of the active layer ACT and may be electrically connected to (or contact) the second electrode contact area of the active layer ACT through a second via hole disposed in the interlayer insulation layer ILD. For example, the second electrode SD2 may be a drain electrode of the driving TFT Tdr, and the second electrode contact area of the active layer ACT may be a drain area.

As illustrated in FIG. 4, each of first and second switching TFT Tsw1 and Tsw2 configuring the pixel circuit PC may be formed together with the driving TFT Tdr, and thus, their repetitive descriptions are omitted.

The anti-electrostatic circuit EPC may be formed at a periphery portion of outermost pixels Po. The anti-electrostatic circuit EPC may include a protection TFT Tesd, a first capacitor C1, and a second capacitor C2. The anti-electrostatic circuit EPC having such a configuration may be formed together with the driving TFT Tdr, and thus, the repetitive description thereof is omitted.

The circuit layer 101 according to an embodiment may further include a lower metal layer BML which is disposed between the substrate 100 and the buffer layer 101a. The lower metal layer BML may include a light blocking pattern (or a light blocking layer) LSP which is disposed under (or below) the active layer ACT of each of the TFTs Tdr, Tsw1, and Tsw2 configuring the pixel circuit PC.

The light blocking pattern LSP may be disposed in an island shape between the substrate 100 and the active layer ACT. The light blocking pattern LSP may block light which is incident on the active layer ACT through the substrate 100, thereby preventing or minimizing a threshold voltage variation of each TFT caused by external light. Optionally, the light blocking pattern LSP may be electrically coupled to the first electrode SD1 of a corresponding TFT and thus may act as a lower gate electrode of the corresponding TFT, and in this case, a characteristic variation of each TFT caused by light and a threshold voltage variation of each TFT caused by a bias voltage may be minimized, reduced or prevented.

The lower metal layer BML may be used as a line disposed in parallel with each other of the gate line GL, the data line DL, the pixel driving power line PL, the pixel common voltage line CVL, and the reference voltage line RL. For example, the lower metal layer BML may be used as a line (or a metal layer) disposed in parallel to the pixel driving lines DL, GL, PL, CVL, RL, and GCL disposed over the substrate 100 along the second direction Y.

The passivation layer PAS may be disposed over the substrate 100 to cover the pixel circuit PC including the driving TFT Tdr. The passivation layer PAS may be an uppermost layer of the circuit layer 101 covering the driving TFT Tdr disposed in each subpixel area SPA, but embodiments of the present disclosure are not limited thereto. The passivation layer PAS may be formed of an inorganic material which is the same as or different from the interlayer insulation layer ILD. For example, the passivation layer PAS may include a single-layer structure including one of silicon oxide (SiOx), silicon nitride (SiNx), silicon oxynitride (SiONx), titanium oxide (TiOx), and aluminum oxide (AlOx) or a stacked structure thereof. For example, the passivation layer PAS may be referred to as a protection layer, a circuit protection layer, a circuit insulation layer, an inorganic insulation layer, a first inorganic insulation layer, or a second insulation layer, or the like.

The planarization layer 102 may be disposed over the substrate 100 on which the passivation layer PAS is disposed, and may provide a flat surface over the passivation layer PAS. For example, the passivation layer PAS may be disposed between the interlayer insulation layer ILD and the planarization layer 102.

The planarization layer 102 may be formed to cover the remaining circuit layer 101 except a periphery portion of the passivation layer PAS disposed at a periphery portion of the substrate 100. For example, the planarization layer 102 may be disposed between the substrate 100 and the light emitting device layer EDL or disposed under the light emitting device layer EDL. The planarization layer 102 according to an embodiment may be formed of an organic material, but embodiments of the present disclosure are not limited thereto. For example, the planarization layer 102 may be formed of an organic material which includes acrylic resin, epoxy resin, phenolic resin, polyamide-based resin, polyimide-based resin, or the like, but embodiments of the present disclosure are not limited thereto.

The light emitting device layer EDL may be disposed over the planarization layer 102. The light emitting device layer EDL according to an embodiment may include a pixel electrode PE, a self-emitting device ED, and a common electrode CE.

The pixel electrode PE may be referred to as an anode electrode or a first electrode of the self-emitting device ED, or may be referred to as a reflective electrode or a lower electrode. The pixel electrode PE may be disposed over the planarization layer 102 overlapping an emission area EA of each subpixel SP. The pixel electrode PE may be disposed to overlap at least a portion or all of the pixel circuit PC.

The pixel electrode PE may include a plurality of pixel division electrodes PEa and PEb which are disposed in an emission area EA to overlap at least a portion or all of the pixel circuit PC, but embodiments of the present disclosure are not limited thereto, and may include a single electrode structure which is formed as a single body (or one body) at the emission area EA to overlap at least a portion or all of the pixel circuit PC.

The pixel electrode PE according to an embodiment of the present disclosure may include a first pixel division electrode PEa disposed in one region of the emission area EA and a second pixel division electrode PEb disposed in the other region of the emission area EA. The plurality of pixel division electrodes PEa and PEb may be disposed spaced apart from each other within a corresponding emission area EA (or a subpixel area SPA). One side of each of the plurality of pixel division electrodes PEa and PEb may extend (or protrude) to a first electrode SD1 of a driving TFT Tdr and may be connected to the first electrode SD1 of a driving TFT Tdr through an electrode contact hole ECH in common. For example, each of the plurality of pixel division electrodes PEa and PEb may branch from the electrode contact hole ECH disposed within the emission area EA (or the subpixel area SPA).

The plurality of pixel division electrodes PEa and PEb may be implemented for repairing (or normalizing) a corresponding subpixel when a defect occurs due to particles in a manufacturing process. For example, when a defect occurs in a first pixel division electrode PEa of the plurality of pixel division electrodes PEa and PEb due to particles, the first electrode SD1 of the driving TFT Tdr may be electrically disconnected (or decoupled) from the first pixel division electrode PEa by cutting an extension portion of the first pixel division electrode PEa in a repair process, and thus, a corresponding subpixel may be repaired (or normalized) through the other pixel division electrode PEb except the first pixel division electrode PEa.

The pixel electrode PE may include a stack structure of at least two or more-layer pixel electrode layers PEL1 and PEL2. For example, each of the at least two or more-layer pixel electrode layers PEL1 and PEL2 may include at least one material selected from among indium tin oxide (ITO), indium zinc oxide (IZO), aluminum (Al), silver (Ag), molybdenum (Mo), titanium (Ti), MoTi, and copper (Cu). For example, the at least two or more-layer pixel electrode layers PEL1 and PEL2 may be sequentially stacked over the planarization layer 102, and then, may be simultaneously patterned, but embodiments of the present disclosure are not limited thereto.

The pixel electrode PE according to an embodiment of the present disclosure may have a two-layer structure including a first pixel electrode layer (or a first metal layer) PEL1 disposed over the planarization layer 102 and a second pixel electrode layer (or a second metal layer) PEL2 disposed (or stacked) over the first pixel electrode layer PEL1. The first and second pixel electrode layers PEL1 and PEL2 may be sequentially deposited over the planarization layer 102, and then, may be simultaneously patterned, but embodiments of the present disclosure are not limited thereto.

The first pixel electrode layer PEL1 may act as an adhesive layer corresponding to the planarization layer 102 and may act as a secondary electrode of the self-emitting device ED, and may include indium tin oxide (ITO) or indium zinc oxide (IZO). The second pixel electrode layer PEL2 may act as a reflective plate and may perform a function of decreasing a resistance of the pixel electrode PE, and may include one material of aluminum (Al), silver (Ag), molybdenum (Mo), titanium (Ti), a Mo—Ti alloy (MoTi), and copper (Cu).

The pixel electrode PE according to another embodiment of the present disclosure may have a three-layer structure of IZO/MoTi/ITO or ITO/MoTi/ITO, a four-layer structure of ITO/Cu/MoTi/ITO, or a fifth-layer structure of ITO/MoTi/ITO/Ag/ITO, but embodiments of the present disclosure are not limited thereto.

The self-emitting device ED may be disposed over the substrate 100. The self-emitting device ED may be formed over the pixel electrode PE and may directly contact the pixel electrode PE. The pixel electrode PE may be disposed under (or below) the self-emitting device ED.

The self-emitting device ED may be a common layer which is formed in common in each of a plurality of subpixels SP so as not to be distinguished by subpixel SP units. The self-emitting device ED may react on a current flowing between the pixel electrode PE and the common electrode CE to emit white light (or blue light). The self-emitting device ED may include an organic light emitting device, or may include a stacked or a combination structure of an organic light emitting device and a quantum dot light emitting device.

The organic light emitting device may include two or more organic light emitting parts for emitting white light (or blue light). For example, the organic light emitting device may include a first organic light emitting part and a second organic light emitting part for emitting white light based on a combination of first light and second light. For example, the first organic light emitting part may include at least one of a blue light emitting layer, a green light emitting layer, a red light emitting layer, a yellow light emitting layer, and a yellow-green light emitting layer. The second organic light emitting part may include at least one of a blue light emitting layer, a green light emitting layer, a red light emitting layer, a yellow light emitting layer, and a yellow-green light emitting layer for emitting second light which is combined with first light from the first organic light emitting part to generate white light.

The organic light emitting device may further include at least one or more function layers for enhancing emission efficiency and/or lifetime. For example, the function layer may be disposed upper and/or lower the light emitting layer.

The common electrode CE may be disposed over the display portion AA of the substrate 100 and may be electrically coupled to the self-emitting device ED disposed at each of the plurality of subpixels SP. The common electrode CE may be referred to as a cathode electrode, a transparent electrode, an upper electrode, a cathode, or a second electrode. The common electrode CE may be formed over the self-emitting device ED and may directly contact the self-emitting device ED or may electrically and directly contact the self-emitting device ED. The common electrode CE can include a transparent conductive material which transmits light emitted from the self-emitting device ED.

Additionally, the light emitting device layer EDL may further include a capping layer disposed over the common electrode CE. The capping layer may be disposed over the common electrode CE and may improve the emission efficiency of light by adjusting a refractive index of light emitted from the light emitting device layer EDL.

The bank 103 may be disposed over the planarization layer 102 and may be formed to include an opening portion overlapping the emission area EA of the subpixel areas SPA. The bank 103 may be disposed over the planarization layer 102 to cover a periphery portion of the pixel electrode PE. The bank 103 may define the emission area (or the opening portion) EA of each of the plurality of subpixels SP and may electrically isolate (or divide) the pixel electrodes PE disposed in adjacent subpixels SP. The bank 103 may be formed to cover the electrode contact hole ECH disposed at each pixel areas PA. The bank 103 may be covered by the self-emitting device ED of the light emitting device layer EDL. For example, the self-emitting device ED may be disposed over the bank 103 as well as over the pixel electrode PE of each of the plurality of subpixels SP.

The dam 104 may be implemented at a periphery portion of the substrate 100 or at periphery portions of the outermost pixels Po. The dam 104 may be disposed over the circuit layer 101 of the display portion AA to one-dimensionally have a closed loop line shape (or a continuous line shape or a closed loop shape) along a third margin area MA3 of outermost pixels Po. For example, the dam 104 may be supported by an interlayer insulation layer ILD of the circuit layer 101 based on a formation position, or may be disposed over the anti-electrostatic circuit EPC. For example, the third margin area MA3 may be an area including the dam 104 and may have a width corresponding to a width of the lowest bottom surface (or a lower surface) of the dam 104.

The dam 104 may be implemented to isolate (or disconnect or separate) at least some layers of the light emitting device layer EDL disposed at the periphery portions of the substrate 100 or the periphery portions of the outermost pixels Po. At the periphery portions of the substrate 100 or the periphery portions of the outermost pixels Po, the dam 104 may include a function of physically isolating (or disconnecting or separating) the self-emitting device ED of the light emitting device layer EDL, a function of blocking the spread or overflow of the organic encapsulation layer, and a function of preventing the penetration of water (or moisture) in the lateral direction of the substrate 100. A structure of the dam 104 for isolating (or disconnecting or separating) at least parts (or portions) of the light emitting device layer EDL will be described below.

The encapsulation layer 106 may be disposed over a remaining portion other than an outermost periphery portion of the substrate 100 and may be implemented to cover the light emitting device layer EDL. The encapsulation layer 106 may be implemented over the substrate 100 to surround all of the front surface and lateral surfaces of the light emitting device layer EDL. For example, the encapsulation layer 106 may be implemented to surround all of the front surface and lateral surfaces of the light emitting device layer EDL, and thus, may prevent oxygen or water from penetrating into the light emitting device layer EDL, thereby improving the reliability of the light emitting device layer EDL against oxygen or water.

The encapsulation layer 106 may include first to third encapsulation layers 106a, 106b, and 106c.

The first encapsulation layer 106a may be implemented to prevent oxygen or water (or moisture) from penetrating into the light emitting device layer EDL. The first encapsulation layer 106a may be disposed over the common electrode CE and may surround the light emitting device layer EDL. Therefore, all of a front surface and lateral surfaces of the light emitting device layer EDL may be surrounded by the first encapsulation layer 106a. The first encapsulation layer 106a may be a first inorganic encapsulation layer including an inorganic material. For example, the first encapsulation layer 106a may include a single-layer structure, including one of silicon oxide (SiOx), silicon nitride (SiNx), silicon oxynitride (SiONx), titanium oxide (TiOx), and aluminum oxide (AlOx), or a stack structure thereof.

The second encapsulation layer 106b may be implemented over the first encapsulation layer 106a disposed at an encapsulation region defined by the dam 104 to have a thickness which is relatively thicker than the first encapsulation layer 106a. The second encapsulation layer 106b may have a thickness for fully cover particles (or an undesired material or an undesired structure element) which is or may be on the first encapsulation layer 106a. The second encapsulation layer 106b may be surrounded by the dam 104. The second encapsulation layer 106b may spread to the periphery portion of the substrate 100 due to a relatively thick thickness, but the spread of the second encapsulation layer 106b may be blocked by the dam 104. The second encapsulation layer 106b may include an organic material or a liquid organic material. For example, the second encapsulation layer 106b may include an organic material such as silicon oxycarbon (SiOCz) acrylic or epoxy-based resin, or the like. For example, the second encapsulation layer 106b may be referred to as a particle cover layer, or an organic encapsulation layer, or the like.

The third encapsulation layer 106c may be implemented to primarily prevent oxygen or water from penetrating into the light emitting device layer EDL. The third encapsulation layer 106c may be implemented to surround all of the second encapsulation layer 106b disposed inside from the dam portion 105 and the first encapsulation layer 106a disposed outside from the dam portion 105. The third encapsulation layer 106c according to an embodiment may include an inorganic material which is the same as or different from the first encapsulation layer 106a. The third encapsulation layer 106c may be a second inorganic encapsulation layer including an inorganic material.

The light emitting display apparatus 10 or the substrate 100 according to an embodiment of the present disclosure may further include a separation portion 105.

The separation portion 105 may be disposed or implemented at a periphery portion of the substrate 100 or periphery portions of the outermost pixels Po. The separation portion 105 may be disposed or implemented at the periphery portion of the substrate 100 or the periphery portions of the outermost pixels Po to one-dimensionally have a closed loop line shape (or a continuous line shape or a closed loop shape) along one or more region of a first margin area MA1 and the third margin area MA3 of the outermost pixel Po. For example, the separation portion 105 may be disposed over the circuit layer 101 and may be supported by the buffer layer 101a or the interlayer insulation layer ILD of the circuit layer 101.

In the outermost pixels Po, the first margin area MA1 may be disposed between the third margin area MA3 and an emission area EA. For example, the first margin area MA1 may be disposed between an end of the emission area EA (or the bank 103) of the outermost pixel Po and the dam 104 based on the reliability margin of the light emitting device layer EDL caused by lateral penetration of water. For example, the second margin area MA2 may be disposed between the outer surface OS1a of the substrate 100 and the third margin area MA3. For example, the second margin area MA2 may be configured to have a second width between the outer surface OS1a of the substrate 100 and the dam 104 based on the reliability margin of the light emitting device layer EDL caused by lateral penetration of water, and may include the first pad portion 110. The third margin area MA3 may be disposed between the first margin area MA1 and the second margin area MA2. For example, the third margin area MA3 may have a width corresponding to a width of the lowest bottom surface (or a lower surface) of the dam 104, and may include the dam 104.

The separation portion 105 may be implemented to isolate (or disconnect or separate) the self-emitting device ED disposed at a periphery portion of the outermost pixels Po. The separation portion 105 may be implemented to prevent the penetration of water (or moisture) in a lateral direction of the substrate 100 to prevent the self-emitting device ED from being degraded by the lateral penetration of water. The separation portion 105 may isolate (or disconnect or separate) the self-emitting device ED of the light emitting device layer EDL at least once near the dam 104, and thus, may prevent the lateral penetration of water. The separation portion 105 will be described below.

Referring to FIGS. 3, 8, and 10, the light emitting display apparatus or the substrate 100 according to an embodiment of the present disclosure may further include a first pad portion 110.

The first pad portion 110 may be disposed at one periphery portion of the substrate 100 and may be electrically coupled to the pixel driving lines DL, GL, PL, CVL, RL, and GCL in a one-to-one relationship.

The first pad portion 110 according to an embodiment may include a plurality of first pads 111 disposed within the circuit layer 101.

The plurality of first pads 111 may be divided (or classified) into first data pads DP, first gate pads GP, first pixel driving power pads PPP, first reference voltage pads RVP, and first pixel common voltage pads CVP.

Each of the plurality of first pads 111 may be disposed over the interlayer insulation layer ILD and may be electrically connected to (or contact) a corresponding line of the pixel driving lines DL, GL, PL, CVL, RL, and GCL through a pad contact hole PCH passing through the interlayer insulation layer ILD and the buffer layer 101a. Each of the plurality of first pads 111 according to an embodiment may include the same material as a pixel electrode PE and may be together with the pixel electrode PE. Each of the plurality of first pads 111 according to another embodiment may include the same material as a source/drain electrode of a TFT and may be together with the source/drain electrode of the TFT.

A portion of each of the plurality of first pads 111 may be exposed over the substrate 100 through a pad open hole POH formed at the passivation layer PAS. For example, the pad open hole POH may be implemented by a pad open process of removing or opening a portion of the passivation layer PAS overlapping the portion of each of the plurality of first pads 111.

Referring again to FIG. 10, the light emitting display apparatus 10 or the substrate 100 according to an embodiment of the present disclosure may further include a wavelength conversion layer 107 disposed over the encapsulation layer 106.

The wavelength conversion layer 107 may convert white light (or blue light), which is incident thereon from an emission area EA of each subpixel area SPA, into color light corresponding to each subpixel area SPA or may transmit only color light corresponding to the subpixel SP. For example, the wavelength conversion layer 107 may include at least one of a wavelength conversion member and a color filter layer.

The wavelength conversion layer 107 may include a plurality of wavelength conversion members 107a and a protection layer 107b.

The plurality of wavelength conversion members 107a may be disposed over the encapsulation layer 106 disposed at the emission area EA of each subpixel SP. For example, the plurality of wavelength conversion members 107a may have the same size as or wider than the emission area EA of each subpixel SP. The plurality of wavelength conversion members 107a may be grouped (or classified) into the red light filter (or a first light filter) disposed over the encapsulation layer 106 in the emission area EA of the red subpixel SP, the green light filter (or a second light filter) disposed over the encapsulation layer 106 in the emission area EA of the green subpixel SP, and the blue light filter (or a third light filter) disposed over the encapsulation layer 106 in the emission area EA of the blue subpixel SP.

The protection layer 107b may be implemented to cover the wavelength conversion members 107a and to provide a flat surface over the wavelength conversion members 107a. The protection layer 107b may be disposed to cover the wavelength conversion members 107a and the encapsulation layer 106 where the wavelength conversion members 107a are not disposed. The protection layer 107b according to an embodiment may include an organic material. Alternatively, the protection layer 107b may further include a getter material for adsorbing water and/or oxygen.

Alternatively, the wavelength conversion layer 107 may be changed to a wavelength conversion sheet having a sheet form and may be disposed over the encapsulation layer 106. In this case, the wavelength conversion sheet (or a quantum dot sheet) may include the wavelength conversion members 107a interposed between a pair of films. For example, when the wavelength conversion layer 107 includes a quantum dot which re-emits colored light set in a subpixel SP, the light emitting device layer EDL of a subpixel SP may be implemented to emit white light or blue light.

The light emitting display apparatus 10 or the substrate 100 according to an embodiment of the present disclosure may further include a functional film 108. The functional film 108 may be disposed over the wavelength conversion layer 107. For example, the functional film 108 may be coupled to the wavelength conversion layer 107 by a transparent adhesive member. The functional film 108 according to an embodiment may include at least one of an anti-reflection layer (or an anti-reflection film), a barrier layer (or a barrier film), a touch sensing layer, and a light path control layer (or a light path control film).

The anti-reflection layer may include a circular polarization layer (or a circular polarization film) which prevents external light, reflected by TFTs and/or the pixel driving lines disposed at the substrate 100, from traveling to the outside. The barrier layer may include a material (or a polymer material) which is low in water transmission rate, and may primarily prevent the penetration of water or oxygen. The touch sensing layer may include a touch electrode layer based on a mutual capacitance method or a self-capacitance method, and may output touch data corresponding to a user's touch through the touch electrode layer. The light path control layer may include a stacked structure where a high refraction layer and a low refraction layer are alternately stacked and may change a path of light incident from each pixel P to minimize or reduce a color shift based on a viewing angle.

The light emitting display apparatus 10 or the substrate 100 according to an embodiment of the present disclosure may further include a side sealing member 109.

The side sealing member 109 may be formed between the substrate 100 and the functional film 108 and may cover all of lateral surfaces of the circuit layer 101 and the wavelength conversion layer 107. For example, the side sealing member 109 may cover all of lateral surfaces of each of the circuit layer 101 and the wavelength conversion layer 107 exposed at the outside of the light emitting display apparatus, between the functional film 108 and the substrate 100. Also, the side sealing member 109 may cover a portion of the routing portion 400 connected to the pad portion 110 of the substrate 100. The side sealing member 109 may prevent lateral light leakage by light, traveling from an inner portion of the wavelength conversion layer 107 to an outer surface thereof, of light emitted from the self-emitting device ED of each subpixel SP. Particularly, the side sealing member 109 overlapping the pad portion 110 of the substrate 100 may prevent or minimize or reduce the reflection of external light caused by the first pads 111 disposed at the pad portion 110. Optionally, the side sealing member 109 may further include a getter material for adsorbing water (or moisture) and/or oxygen.

In the light emitting display apparatus 10 according to an embodiment of the present disclosure, the substrate 100 may further include a first chamfer 100c which is provided at a corner portion between the first surface 100a and the outer surface OS. The first chamfer 100c may reduce or minimize the damage of the corner portion of the substrate 100 caused by a physical impact applied from the outside and may prevent a disconnection of the routing portion 400 caused by the corner portion of the substrate 100. For example, the first chamfer 100c may have a 45-degree angle, but embodiments of the present disclosure are not limited thereto. The first chamfer 100c may be implemented by a chamfer process using a cutting wheel, a polishing wheel, a laser, or the like. Accordingly, each of outer surfaces of the first pads 111 of the pad portion 110 disposed to contact the first chamfer 100c may include an inclined surface which is inclined by an angle corresponding to an angle of the first chamfer 100c by removing or polishing a corresponding portion thereof together with the corner portion of the substrate 100 through the chamfer process. For example, when the first chamfer 100c is formed at an angle of 45 degrees between the outer surface OS and the first surface 100a of the substrate 100, the outer surfaces (or one ends) of the first pads 111 of the pad portion 110 may be formed at an angle of 45 degrees.

Referring to FIG. 10, the line substrate 200 according to an embodiment of the present disclosure may be referred to as a second substrate, a link substrate, a lower substrate, a rear substrate, or link glass. The line substrate 200 may be a glass substrate, or a thin glass substrate or a plastic substrate which is bendable or flexible. For example, the line substrate 200 may include the same material as the substrate 100. A size of the line substrate 200 may be the same as the substrate 100, but embodiments of the present disclosure are not limited thereto, the size of the line substrate 200 may have a smaller than the substrate 100. For example, the line substrate 200 may be configured to have the same size as the substrate 100 in order to maintain or secure the stiffness of the substrate 100.

The line substrate 200 may include a second pad portion 210. The second pad portion 210 may be disposed at one periphery portion (or a first rear periphery portion) of a rear surface 200b of the line substrate 200 overlapping the first pad portion 110 disposed at a front surface of the substrate 100. For example, the second pad portion 210 may be a rear pad portion or a second routing pad.

The second pad portion 210 may include a plurality of second pads (or rear pads) which are disposed at a rear surface 200b of the line substrate 200 to overlap a plurality of first pads disposed at the pad portion 110 in a one-to-one relationship.

The plurality of second pads 211 may be grouped (or classified) into a plurality of second pixel driving power pads, a plurality of second data pads, a plurality of second reference voltage pads, a plurality of second gate pads, and a plurality of second pixel common voltage pads. The plurality of second pixel driving power pads may overlap each of the plurality of first pixel driving power pads PPP disposed at the first pad portion 110. The plurality of second data pads may overlap each of the plurality of first data pads DP disposed at the first pad portion 110. The plurality of second reference voltage pads may overlap each of the plurality of first reference voltage pads RVP disposed at the first pad portion 110. The plurality of second gate pads may overlap each of the plurality of first gate pads GP disposed at the first pad portion 110. The plurality of second pixel common voltage pads may overlap each of the plurality of first pixel common voltage pads CVP disposed at the first pad portion 110.

The light emitting display apparatus 10 or the line substrate 200 according to an embodiment of the present disclosure may further include at least one third pad portion and a link line part.

The at least one third pad portion (or an input pad portion) may be disposed at the rear surface 200b of the line substrate 200. For example, the at least one third pad portion may be disposed at a middle portion adjacent to the first periphery portion of the rear surface 200b of the line substrate 200. The at least one third pad portion may include a plurality of third pads (or input pads) which are spaced apart from one another by a certain interval. For example, the plurality of third pads may be grouped (or classified) into a plurality of third pixel driving power pads, a plurality of third data pads, a plurality of third reference voltage pads, a plurality of third gate pads, and at least one third pixel common voltage pads. The at least one third pad portions (or the input pad portion) may be coupled to the driving circuit part and may receive a pixel driving power, a data signal, a reference voltage, a gate control signal, and a pixel common voltage from the driving circuit part.

The link line portion may include a plurality of link lines disposed between the second pad portion 210 and the at least one third pad portion among the rear surface 200b of the line substrate 200.

The plurality of link lines may be grouped (or classified) into a plurality of pixel driving power link lines, a plurality of data link lines, a plurality of reference voltage link lines, a plurality of gate link lines, and at least one pixel common voltage link lines.

The plurality of pixel driving power link lines may be individually (or a one-to-one relationship) connected to each of the plurality of second pixel driving power pads and each of the plurality of third pixel driving power pads. The plurality of data link lines may be individually (or a one-to-one relationship) connected to each of the plurality of second data pads and each of the plurality of third data pads. The plurality of reference voltage link lines may be individually (or a one-to-one relationship) connected to each of the plurality of second reference voltage pads and each of the plurality of third reference voltage pads. The plurality of gate link lines may be individually (or a one-to-one relationship) connected to each of the plurality of second gate pads and each of the plurality of third gate pads. The at least one pixel common voltage link lines may be connected to each of the plurality of second pixel common voltage pads and the at least one third pixel common voltage pads in common.

The light emitting display apparatus 10 or the line substrate 200 according to an embodiment of the present disclosure may further include a metal pattern layer and an insulation layer.

The metal pattern layer (or a conductive pattern layer) may include a plurality of metal layers. The metal pattern layer may include a first metal layer 201, a second metal layer 203, and a third metal layer 205. The insulation layer may include a plurality of insulation layers. For example, the insulation layer may include a first insulation layer 202, a second insulation layer 204, and a third insulation layer 206. The insulation layer may be referred to as a rear insulation layer or a pattern insulation layer.

The first metal layer 201 may be implemented over a rear surface 200b of the line substrate 200. The first metal layer 201 may include a first metal pattern. For example, the first metal layer 201 may be referred to as a first link layer or a link line layer. The first metal pattern may be used as link lines of the link line portion.

The first insulation layer 202 may be implemented over the rear surface 200b of the line substrate 200 to cover the first metal layer 201. The first insulation layer 202 according to an embodiment may include an inorganic material.

The second metal layer 203 may be implemented over the first insulation layer 202. The second metal layer 203 according to an embodiment may include a second metal pattern. For example, the second metal layer 203 may be referred to as a second link layer, a jumping line layer, or a bridge line layer. The second metal pattern may be used as the gate link lines among the link lines of the link line portion 250, but embodiments of the present disclosure are not limited thereto. For example, the second metal layer 203 may be used as a jumping line (or a bridge line) for electrically connecting (or contacting) the link lines which are formed of different metal materials on different layers, in the link line portion 250.

Optionally, a link line (For example, a plurality of first link lines) disposed at the second metal layer 203 may be modified to be disposed at the first metal layer 201, and a link line (For example, a plurality of second link lines) disposed at the first metal layer 201 may be modified to be disposed at the second metal layer 203.

The second insulation layer 204 may be implemented over the rear surface 200b of the line substrate 200 to cover the second metal layer 203. The second insulation layer 204 according to an embodiment may include an inorganic material.

The third metal layer 205 may be implemented over the second insulation layer 204. The third metal layer 205 according to an embodiment may include a third metal pattern. For example, the third metal layer 205 may be referred to as a third link layer or a pad electrode layer. The third metal pattern may be used as the pads of the second pad portion 210. For example, the pads of the second pad portion 210 formed of the third metal layer 205 may be electrically connected to (or contact) the first metal layer 201 through the pad contact holes formed at the first and second insulation layers 202 and 204.

The third insulation layer 206 may be implemented over the rear surface 200b of the line substrate 200 to cover the third metal layer 205. The third insulation layer 206 according to an embodiment may include an organic material. For example, the third insulation layer 206 may include an insulating material such as photo acrylic or the like. The third insulation layer 206 may cover the third metal layer 205 to prevent the third metal layer 205 from being exposed at the outside. The third insulation layer 206 may be referred to as an organic insulation layer, a protection layer, a rear protection layer, an organic protection layer, a rear coating layer, or a rear cover layer.

The line substrate 200 may be coupled (or connected) to a second surface (or a rear surface) of the substrate 100 by using the coupling member 300. The coupling member 300 may be interposed between the substrate 100 and the line substrate 200. Thus, the substrate 100 and the line substrate 200 may be opposite-bonded to each other by the coupling member 300. The coupling member 300 may be a transparent adhesive member or a double-sided tape including an optically clear adhesive (OCA), or a pressure sensitive adhesive (PSA), or an optically clear resin (OCR), but embodiments of the present disclosure are not limited thereto. The coupling member 300 may include a glass fiber.

Alternatively, the line substrate 200 may be omitted. In this case, the second pad portion 210, the at least one third pad portion, and the link line portion may be disposed at a rear surface of the substrate 100, and thus, their repetitive descriptions are omitted. Therefore, when the line substrate 200 is omitted, the coupling member 300 may be omitted.

The routing portion 400 may be referred to as a side line portion, an edge line portion, a side routing portion, an edge routing portion, a printing line portion, a side printing line portion, or a side wiring portion, or the like. The routing portion 400 may be disposed to surround the outer surface OS1a of the substrate 100 and the outer surface OS1b of the line substrate 200. The routing portion 400 according to an embodiment may include a plurality of routing lines which are disposed at each of a first outer surface (or one surface) OS1a among the outer surface OS of the substrate 100 and a first outer surface (or one surface) OS1b among the outer surface OS of the line substrate 200.

Each of the plurality of routing lines 410 may be formed to surround the outer surface OS1a of the substrate 100 and the outer surface OS1b of the line substrate 200, and may be individually (or a one-to-one relationship) connected to each of the first pads of the first pad portion 110 and the second pads of the second pad portion 210. According to an embodiment of the present disclosure, each of the plurality of routing lines 410 may be formed by a printing process using a conductive paste. According to another embodiment, each of the plurality of routing lines 410 may be formed by a transfer process that transfers the conductive paste pattern to a transfer pad made of a flexible material and transfers the conductive paste pattern transferred to the transfer pad to the routing portion 400. For example, the conductive paste may be an Ag paste, but embodiments of the present disclosure are not limited thereto.

The light emitting display apparatus 10 or the routing portion 400 according to an embodiment of the present disclosure may further include an edge coating layer 430.

The edge coating layer 430 may be implemented to cover the routing portion 400. The edge coating layer 430 may be implemented to cover the plurality of routing lines 410. For example, the edge coating layer 430 may be an edge protection layer or an edge insulation layer.

The edge coating layer 430 according to an embodiment may be implemented to cover all of the first periphery portion and the first outer surface OS1a of the substrate 100 and the first periphery portion and the first outer surface OS1b of the line substrate 200 as well as the plurality of routing lines 410. The edge coating layer 430 may prevent the corrosion of each of the plurality of routing lines 410 including a metal material or electrical short circuit between the plurality of routing lines 410. Also, the edge coating layer 430 may prevent or minimize or reduce the reflection of external light caused by the plurality of routing lines 410 and the first pads 111 of the first pad portion 110. The edge coating layer 430 may include a light blocking material including black ink. The edge coating layer 430 may implement (or configure) the outermost surface (or sidewall) of the display apparatus (or the display panel), and thus, may include an impact absorbing material (or substance) or a ductile material so as to prevent the damage of an outer surface OS of each of the substrates 100 and 200. The edge coating layer 430 may include a mixed material of a light blocking material and an impact absorbing material.

A dam 104 and a separation portion 105 according to an embodiment of the present disclosure will be described below with reference to FIGS. 10, 12, and 13.

The dam 104 according to an embodiment of the present disclosure may include a first dam pattern (or a lower dam) 104a, a second dam pattern (or a middle dam) 104b, a metal line 104m, and a third dam pattern (or an upper dam) 104c.

The first dam pattern 104a may be disposed over a circuit layer 101 of a third margin area MA3 of the substrate 100 or the outermost pixel Po. A portion of the first dam pattern 104a may be disposed on the switching circuit portion 170. The first dam pattern 104a may be formed of an inorganic material. The anti-electrostatic circuit may comprise a protection TFT Tesd disposed under the first dam pattern 104a.

According to an embodiment of the present disclosure, the first dam pattern 104a may include the same material as that of a passivation layer PAS. The first dam pattern 104a may be implemented in a single layer structure of the passivation layer PAS. In this case, the first dam pattern 104a may be formed or implemented by a portion (or a non-patterning region) of the passivation layer PAS which remains intactly without being patterned (or removed) by a patterning process of the passivation layer PAS disposed over the interlayer insulation layer ILD of the third margin area MA3.

According to another embodiment of the present disclosure, the first dam pattern 104a may be implemented in a stack structure of the passivation layer PAS and the interlayer insulation layer ILD. In this case, the first dam pattern 104a may be formed or implemented by a portion (or a non-patterning region) of the interlayer insulation layer ILD and the passivation layer PAS which remains intactly without being patterned (or removed) by a patterning process of the interlayer insulation layer ILD and the passivation layer PAS disposed over the buffer layer 101a of the third margin area MA3.

A side surface of the first dam pattern 104a may be implemented in an inclined structure or a forward tapered structure. For example, a cross-sectional surface of the first dam pattern 104a taken along a width direction may have a cross-sectional structure having a trapezoid shape where a top side is narrower than a lower side.

The second dam pattern 104b may be disposed over the first dam pattern 104a. The second dam pattern 104b according to an embodiment may be formed of an inorganic material. For example, the second dam pattern 104b may be formed of the same material as the planarization layer 102. The second dam pattern 104b may have the same height (or thickness) as the planarization layer 102, or may have a height which is higher than the planarization layer 102. For example, a height (or thickness) of the second dam pattern 104b may be twice a height (or thickness) of the planarization layer 102, based on two depositions of the planarization layer 102. The second dam pattern 104b may be formed or implemented by a portion (or a non-patterning region) of the planarization layer 102 which remains intactly without being patterned (or removed) by a patterning process of the planarization layer 102.

A lateral surface of the second dam pattern 104b may be implemented in an inclined structure or a forward tapered structure. For example, a cross-sectional surface of the second dam pattern 104b taken along a width direction may have a cross-sectional structure having the same trapezoid shape as the first dam pattern 104a. With respect to the width direction, each of one edge portion and the other edge portion of the second dam pattern 104b may protrude to the outside of the side surface of the first dam pattern 104a. For example, a distance between an end of a lateral surface of the second dam pattern 104b and an end of a lateral surface of the first dam pattern 104a may be greater than a thickness obtained by summating a thickness of the self-emitting device ED and a thickness of the common electrode CE.

The lateral surface of the first dam pattern 104a may have an undercut structure with respect to the second dam pattern 104b. For example, the dam 104 may include an undercut region UCA disposed at a boundary portion between the first dam pattern 104a and the second dam pattern 104b or at an upper lateral surface of the first dam pattern 104a. The undercut region UCA between lateral surface of the first dam pattern 104a and the second dam pattern 104b may be a structure for isolating (or disconnecting or separating) at least a portion of the light emitting device layer EDL disposed over the dam 104. For example, the undercut region UCA between the first dam pattern 104a and the second dam pattern 104b may be formed or implemented by an over-etching process performed on the passivation layer PAS. The second dam pattern 104b may protrude to the outside of the lateral surface of the first dam pattern 104a based on an undercut structure of the first dam pattern 104a, and thus, may cover the lateral surface of the first dam pattern 104a. Accordingly, the second dam pattern 104b may have an eaves structure with respect to the first dam pattern 104a.

The metal line 104m may be disposed over the second dam pattern 104b. The metal line 104m may be stacked over the second dam pattern 104b with the same material or the same structure as the pixel electrode PE. The metal line 104m may be formed or implemented by a portion (or a non-patterning region) of the pixel electrode PE which remains intactly over the second dam pattern 104b without being patterned (or removed) by a patterning process of the pixel electrode PE.

The metal line 104m, as illustrated in FIG. 13, may be electrically connected (or contact) to the pixel common voltage line CVL through the via hole 104h formed in the intersection or overlap region between the dam 104 and the pixel common voltage line CVL. Therefore, the metal line 104m embedded in the dam 104 may be disposed in a closed loop line shape continuously disposed at an edge portion of the substrate 100, and thus, may cut off static electricity flowing into an inner portion of the display area AA from the outside to prevent the occurrence of a defect caused by the static electricity. For example, the metal line 104m may discharge static electricity, flowing from the outside, to the pixel common voltage line CVL, thereby preventing the occurrence of a defect caused by the static electricity.

A portion of the metal line 104m overlapping the anti-electrostatic circuit PC may be electrically connected (or contact) to the second electrode Te2 of the protection TFT Tesd through a second contact hole CHb (see FIG. 9) formed to pass through the first dam pattern 104a and the second dam pattern 104b along with the electrode contact hole ECH. Therefore, in the anti-electrostatic circuit EPC, the second electrode Te2 of the protection TFT Tesd may be electrically connected (or contact) to the pixel common voltage line CVL through the metal line 104m, the via hole 104h, and the pixel common voltage line CVL and may be supplied with a pixel common voltage from the driving circuit unit via the pixel common voltage pad CVP, the pixel common voltage line CVL, the via hole 104h, and the metal line 104m. Accordingly, the anti-electrostatic circuit EPC may discharge static electricity, flowing in through the pixel driving line DL, to the pixel common voltage line CVL to prevent the occurrence of a defect caused by the static electricity.

The third dam pattern 104c may be disposed over the second dam pattern 104b to surround the metal line 104m. The metal line 104m may be disposed between the second dam pattern 104b and the third dam pattern 104c. A lateral surface of the third dam pattern 104c may be implemented in an inclined structure or a forward tapered structure. For example, the third dam pattern 104c taken along a widthwise direction may have a cross-sectional structure having a trapezoid shape which is the same as the second dam pattern 104b.

The third dam pattern 104c may include an organic material or an inorganic material. For example, the third dam pattern 104c may be stacked over the second dam pattern 104b with the same material as a bank 103. The third dam pattern 104c may be formed or implemented by a portion (or a non-patterning region) of the bank 103 which remains intactly over the second dam pattern 104b without being patterned (or removed) by a patterning process of the bank 103.

According to an embodiment of present disclosure, a material layer of the self-emitting device ED disposed over the dam 104 may be automatically isolated (or disconnected or separated) in performing a deposition process, based on the undercut region UCA (or the eaves structure) between the first dam pattern 104a and the second dam pattern 104b. For example, because the deposition material of the self-emitting device ED has linearity, the material layer of the self-emitting device ED may not be deposited over the lateral surface of the first dam pattern 104a covered by the second dam pattern 104b and may be deposited on a top surface and a lateral surface of dam 104 and a circuit layer 101, and thus, may be isolated (or disconnected or separated) in the undercut region UCA between the first dam pattern 104a and the second dam pattern 104b of the dam 104. Accordingly, the self-emitting device ED may be automatically isolated (or disconnected or separated) at the dam 104 in performing a deposition process, and thus, a separate patterning process of isolating (or disconnecting or separating) the self-emitting device ED may be omitted. Accordingly, the self-emitting device ED disposed over the substrate 100 may be isolated (or disconnected or separated) at the dam 104, and thus, a lateral water penetration path of the substrate 100 may be blocked by the dam 104.

Additionally, the common electrode CE disposed over the self-emitting device ED may be automatically isolated (or separated) by the undercut region UCA of the dam 104 like the self-emitting device ED, in performing a deposition process based on deposition method, or may be formed to surround all of the dam 104 and the self-emitting devices EDi of island shape isolated by the dam 104 without being isolated by the undercut region UCA of the dam 104.

Additionally, in an intersection or overlap region between the metal line 104m and the pixel common voltage line CVL, it may be difficult to form the via hole 104h for exposing the pixel common voltage line CVL due to a distance (or a height) between the metal line 104m and the pixel common voltage line CVL. Therefore, a middle metal layer may be additionally disposed between the metal line 104m and the pixel common voltage line CVL. The middle metal layer may be implemented on an interlayer insulation layer ILD along with a first electrode SD1 of the driving TFT Tdr. For example, the middle metal layer may be electrically connected (or contact) to the pixel common voltage line CVL through a middle via hole formed to pass through the interlayer insulation layer ILD and the buffer layer 101a. Also, a portion of the metal line 104m may be electrically connected (or contact) to the middle metal layer through the via hole 104h which passes through the second dam pattern 104b to expose the middle metal layer. Accordingly, the metal line 104m may be electrically connected (or contact) to the pixel common voltage line CVL through the middle metal layer.

The separation portion 105 according to an embodiment of the present disclosure may be implemented near (or around) the dam 104 to isolate (or disconnect or separate) the self-emitting device ED disposed near the dam 104. The separation portion 105 may be implemented to prevent the penetration of water (or moisture) in a lateral direction of the substrate 100 to prevent the self-emitting device ED from being degraded by the lateral penetration of water. The separation portion 105 may isolate the self-emitting device ED of the light emitting device layer EDL at least once near the dam 104, thereby preventing the lateral penetration of water. For example, the separation portion 105 may be a separation region, a separation line, an isolation region, an isolation line, a disconnection region, or a disconnection line, of the self-emitting device ED.

The separation portion 105 may be implemented over the interlayer insulation layer ILD or the buffer layer 101a of the circuit layer 101 near (or around) the dam 104. The separation portion 105 may include a plurality of separation structures 105-1 to 105-4 disposed near the dam 104. The separation portion 105 may include at least one outer separation structures (or first and second separation structures) 105-1 and 105-2 disposed at an outer region of the dam 104 or a second margin area MA2 of the substrate 100. The separation portion 105 may further include at least one inner separation structures (or third and fourth separation structures) 105-3 and 105-4 disposed at an inner region of the dam 104 or a first margin area MA1.

The plurality of separation structures 105-1 to 105-4 or first to fourth separation structures 105-1 to 105-4 may be disposed over the circuit layer 101 of the display portion AA to one-dimensionally have a closed loop line shape (or a continuous line shape or a closed loop shape). The at least one outer separation structures 105-1 and 105-2 may be disposed to surround the dam 104. The at least one inner separation structures 105-3 and 105-4 may be disposed to surround the dam 104.

Each of the plurality of separation structures 105-1 to 105-4 or first to fourth separation structures 105-1 to 105-4 may include a lower structure 105a and an upper structure 105b. Each of the plurality of separation structures 105-1 to 105-4 may intersect with the plurality of pixel driving lines.

The lower structure 105a may be implemented in a single layer structure based on the passivation layer PAS, or may be implemented in a stack structure of the passivation layer PAS and the interlayer insulation layer ILD. A lateral surface of the lower structure 105a may be implemented in an inclined structure or a tapered structure. For example, the lower structure 105a may be referred to as the term such as a base separation structure, a lower taper structure, or a first taper structure, or the like. The lower structure 105a may be implemented in the same structure as the first dam pattern 104a together with the first dam pattern 104a.

The upper structure 105b may be disposed over the lower structure 105a. The upper structure 105b may include an organic material. The upper structure 105b may be formed of the same material as a bank 103, but embodiments of the present disclosure are not limited thereto. A lateral surface of the upper structure 105b may be implemented in an inclined structure or a tapered structure. With respect to a widthwise direction, each of one edge portion and the other edge portion of the upper structure 105b may protrude to the outside of a lateral surface of the lower structure 105a. For example, the upper structure 105a may be referred to as the term such as an upper taper structure or a second taper structure, or the like.

A lateral surface 105as of the lower structure 105a may have an undercut structure with respect to the upper structure 105b. For example, each of the plurality of separation structures 105-1 to 105-4 may include an undercut region UCA disposed at an upper lateral surface of the lower structure 105a or a boundary portion between the lower structure 105a and the upper structure 105b. An undercut region UCA between the lower structure 105a and the upper structure 105b may be a structure for isolating (or disconnecting or separating) at least some layers of the light emitting device layer EDL disposed at the separation portion 105. For example, the undercut region UCA between the lower structure 105a and the upper structure 105b may be formed or implemented by an over-etching process of the passivation layer PAS. The upper structure 105b may protrude to the outside of a lateral surface of the lower structure 105a based on an undercut structure of the lower structure 105a, and thus, may cover a lateral surface of the lower structure 105a. Accordingly, the upper structure 105b may be disposed on the lower structure 105a to have an eaves structure with respect to the lower structure 105a.

At least one of the plurality of separation structures 105-1 to 105-4 or first to fourth separation structures 105-1 to 105-4 may further include a metal structure 105m disposed between the lower structure 105a and the upper structure 105b.

The metal structure 105m may be disposed over the lower structure 105a. The metal structure 105m may be stacked over the lower structure 105a with the same material or the same structure as the pixel electrode PE or the metal line 104m of the dam 104. The metal structure 105m may be formed together with the metal line 104m of the dam 104. A lateral surface of the metal structure 105m may be implemented in an inclined structure or a forward tapered structure. With respect to the width direction, each of one edge portion and the other edge portion of the metal structure 105m may protrude to the outside of the side surface of the lower structure 105a. For example, the metal structure 105m may be referred to as the term such as a metal pattern layer or a middle structure, or the like.

The upper structure 105b may be disposed over the metal structure 105m. The upper structure 105b may be stacked at an upper surface of the metal structure 105m. In FIGS. 10 and 12, the upper structure 105b is illustrated as being disposed at only the upper surface of the metal structure 105m, but embodiments of the present disclosure are not limited thereto, and the upper structure 105b may be stacked at the lower structure 105a to surround or cover all of a lateral surface and an upper surface of the metal structure 105m. In this case, like the metal line 104m of the dam 104, the metal structure 105m may be embedded inside the upper structure 105b.

The lateral surface of the lower structure 105a may have an undercut structure with respect to the metal structure 105m. For example, each of the plurality of separation structures 105-1 to 105-4 may include an undercut region UCA disposed at a boundary portion between the first lower structure 105a and the metal structure 105m or at an upper lateral surface of the lower structure 105a. For example, the undercut region UCA between the lower structure 105a and the metal structure 105m may be formed or implemented by an over-etching process of the passivation layer PAS. The metal structure 105m may protrude to the outside of the lateral surface of the lower structure 105a by the undercut structure of the lower structure 105a, and thus, may cover the lateral surface of the lower structure 105a. Accordingly, the metal structure 105m may have an eaves structure with respect to the lower structure 105a.

According to an embodiment of the present disclosure, a material layer of the self-emitting device ED disposed over the separation portion 105 may be automatically isolated (or disconnected or separated) in performing a deposition process, based on the undercut region (or the eaves structure) between the lower structure 105a and the upper structure 105b (or the metal structure 105m). For example, because the deposition material of the self-emitting device ED has linearity, the material layer of the self-emitting device ED may not be deposited over the lateral surface of the lower structure 105a covered by the upper structure 105b (or the metal structure 105m) and may be deposited on a top surface and a lateral surface of the upper structure 105b and a circuit layer 101 near the separation portion 105, and thus, may be isolated (or disconnected or separated) in the undercut region between the lower structure 105a and the upper structure 105b (or the metal structure 105m). Accordingly, the self-emitting device ED may be automatically isolated (or disconnected) by the plurality of separation structures 105-1 to 105-4 of the separation portion 105 in performing a deposition process, and thus, a separate patterning process of isolating (or disconnecting or separating) the self-emitting device ED may be omitted. Accordingly, the self-emitting device ED disposed over the substrate 100 may be additionally isolated (or disconnected or separated) near (or around) the dam 104 by the separation portion 105, and thus, a lateral water penetration path of the substrate 100 may be additionally blocked by each of the plurality of separation structures 105-1 to 105-4 of the separation portion 105.

Optionally, the common electrode CE disposed over the self-emitting device ED may be automatically isolated (or separated) by the undercut region UCA of the separation portion 105 like the self-emitting device ED, in performing a deposition process based on deposition method, or may be formed to surround all of the separation portion 105 and the self-emitting devices EDi of island shape isolated by the separation portion 105 without being isolated by the undercut region UCA of the separation portion 105.

Additionally, the metal structure 105m of at least one of the plurality of separation structures 105-1 to 105-4 may be implemented to have an eaves structure with respect to the lower structure 105a and to prevent static electricity from flowing into the display portion AA from the outside. To this end, the metal structure 105m of the plurality of separation structures 105-1 to 105-4 may be implemented to be electrically coupled to a pixel common voltage line CVL. For example, as illustrated in FIG. 13, a portion of the metal structure 105m overlapping the pixel common voltage line CVL may be electrically connected to (or contact) the pixel common voltage line CVL through a via hole 105h which is formed to pass through the lower structure 105a and the buffer layer 101a. Accordingly, the metal structure 105m of the plurality of separation structures 105-1 to 105-4 may be disposed in a closed loop line shape which is continuously disposed at a periphery portion of the substrate 100, and thus, may prevent static electricity from flowing into the display portion AA from the outside to prevent a defect caused by the static electricity. For example, the metal structure 105m of at least one of the plurality of separation structures 105-1 to 105-4 may discharge static electricity, flowing in from the outside, to the pixel common voltage line CVL to prevent a defect caused by the static electricity.

In an intersection or overlap region between the metal structure 105m and the pixel common voltage line CVL, due to a distance (or height) between the metal structure 105m and the pixel common voltage line CVL, it may be difficult to form via holes 105h for exposing the pixel common voltage line CVL. Therefore, a middle metal layer may be additionally disposed between the metal structure 105m and the pixel common voltage line CVL. The middle metal layer may be implemented on the interlayer insulation layer ILD together the first electrode SD1 of the driving TFT Tdr. For example, the middle metal layer may be electrically connected to (or contact) the pixel common voltage line CVL through a middle via hole which is formed to pass through the interlayer insulation layer ILD and the buffer layer 101a, together a via holes of the driving TFT Tdr. Moreover, a portion of the metal structure 105m may be electrically connected to (or contact) the middle metal layer through the via holes 105h which pass through the lower structure 105a and expose the middle metal layer, together with the electrode contact hole ECH. Accordingly, the metal structure 105m may be electrically connected to (or contact) the pixel common voltage line CVL through the middle metal layer.

Referring to FIGS. 10, 12, and 13, the light emitting display apparatus 10 or the substrate 100 according to an embodiment of the present disclosure may further include a groove line GRV.

The groove line GRV may be implemented between the separation portion 105 and the planarization layer 102. The groove line GRV may be formed or implemented together with the dam 104.

The groove line GRV may be implemented by removing all of the passivation layer PAS and the planarization layer 102 at an inner region of the dam 104. For example, the groove line GRV may be a region where a single structure or a multi-layer structure or the like, including at least one of the interlayer insulation layer ILD, the passivation layer PAS, the planarization layer 102, a pixel electrode material layer, and the bank 103 disposed on the buffer layer 101a between the inner separation structure 105-4 of the separation portion 105 and the bank 103, is removed. For example, the groove line GRV may be formed or implemented by patterning (or removing) each of the bank 103, the planarization layer 102, the passivation layer PAS, and the interlayer insulation layer ILD disposed in a first margin area MA1 of an outermost pixel Po or the substrate 100. Accordingly, the groove line GRV may define or configure a lateral surface 102s of the planarization layer 102 and may be implemented in a closed loop line shape (or a continuous line shape or a closed loop shape) surrounding the lateral surface 102s of the planarization layer 102.

The groove line GRV may define or configure the lateral surface 102s of the planarization layer 102, a lateral surface PASs of the passivation layer PAS, and a lateral surface ILDs of the interlayer insulation layer ILD, which are commonly disposed in an inner pixel Pi and the outermost pixel Po. For example, the groove line GRV may define or configure a lateral end 102e of the planarization layer 102, the lateral surface PASs of the passivation layer PAS, and the lateral surface ILDs of the interlayer insulation layer ILD, which are commonly disposed in the inner pixel Po and the outermost pixel Po. For example, each of the lateral surface 102s of the planarization layer 102, the lateral surface PASs of the passivation layer PAS, and the lateral surface ILDs of the interlayer insulation layer ILD may be exposed at the groove line GRV, and thus, may implement one sidewall of the groove line GRV.

The lateral end 102e of the planarization layer 102 may protrude toward a center portion of the groove line GRV (or the dam 104) from the lateral surface PASs of the passivation layer PAS. For example, a distance between the lateral end 102e of the planarization layer 102 and the outer surface OS of the substrate 100 may be less than a distance between the lateral surface PASs of the passivation layer PAS and the outer surface OS of the substrate 100. For example, a distance between the lateral end 102e of the planarization layer 102 and the lateral surface PASs of the passivation layer PAS or a distance between the lateral surface PASs of the passivation layer PAS and the lateral end 102e of the planarization layer 102 may be greater than a thickness obtained by summating a thickness of the self-emitting device ED and a thickness of the common electrode CE. Therefore, a periphery portion (or an edge portion) of the planarization layer 102 including the lateral surface 102s and the lateral end 102e of the planarization layer 102 may cover the lateral surface PASs of the passivation layer PAS and may directly face an upper surface of the buffer layer 101a. Accordingly, the periphery portion of the planarization layer 102 may have an eaves structure with respect to the lateral surface PASs of the passivation layer PAS.

The lateral surface PASs of the passivation layer PAS may be implemented in an inclined structure or a forward tapered structure. Thus, the lateral surface PASs of the passivation layer PAS may have an undercut structure with respect to the periphery portion of the planarization layer 102. For example, a boundary portion between the planarization layer 102 and the passivation layer PAS positioned at one side of the groove line GRV or an upper lateral surface of the passivation layer PAS may have an undercut structure with respect to the planarization layer 102. For example, due to the groove line GRV, an undercut region UCA may be implemented between the lateral surface PASs of the passivation layer PAS adjacent to the groove line GRV and the lateral surface 102s of the planarization layer 102 adjacent to the groove line GRV, and the undercut region UCA may be a structure for isolating (or disconnecting or separating) an edge portion of the planarization layer 102 and at least some layers of the light emitting device layer EDL disposed over the groove line GRV. The self-emitting device ED disposed over the groove line GRV and the lateral surface of the planarization layer 102 may be isolated in the undercut region UCA. For example, the undercut region UCA between the lateral surface PASs of the passivation layer PAS and the lateral surface 102s of the planarization layer 102 may be formed or implemented by an over-etching process performed on the passivation layer PAS. The lateral surface 102s of the planarization layer 102 may protrude to the outside of the lateral surface PASs of the passivation layer PAS by the undercut structure of the lateral surface PASs of the passivation layer PAS, and thus, may cover the lateral surface PASs of the passivation layer PAS. Accordingly, the lateral surface 102s of the planarization layer 102 may have an eaves structure with respect to the lateral surface PASs of the passivation layer PAS.

According to an embodiment of the present disclosure, a material layer of the self-emitting device ED disposed over the periphery portion of the planarization layer 102 and the groove line GRV may be automatically isolated (or disconnected or separated) by an undercut region UCA (or an eaves structure) between the lateral surface PASs of the passivation layer PAS and the lateral surface 102s of the planarization layer 102 in performing a deposition process. For example, because a deposition material of the self-emitting device ED has linearity, the deposition material of the self-emitting device ED may not be deposited on the lateral surface PASs of the passivation layer PAS covered by the lateral surface 102s of the planarization layer 102 and may be deposited on the lateral surface 102s of the planarization layer 102 and the buffer layer 101a of the groove line GRV, and thus, may be additionally isolated (or disconnected or separated) at an undercut region UCA between the lateral surface 102s of the planarization layer 102 and the lateral surface PASs of the passivation layer PAS.

Additionally, a common electrode CE disposed on the self-emitting device ED may be automatically isolated (or disconnected or separated) by the undercut region UCA between the lateral surface 102s of the planarization layer 102 and the lateral surface PASs of the passivation layer PAS like the self-emitting device ED, in a deposition process based on deposition, or may be formed to cover all of the lateral surface 102s of the planarization layer 102, the lateral surface PASs of the passivation layer PAS, and the buffer layer 101a of the groove line GRV without being isolated by the undercut region UCA between the lateral surface 102s of the planarization layer 102 and the lateral surface PASs of the passivation layer PAS.

As described above, the light emitting display apparatus according to an embodiment of the present disclosure may include the anti-electrostatic circuit EPC disposed to overlap the dam 104, and thus, may have a zero bezel width and may protect the pixel circuit, disposed in the outermost pixel, from static electricity. Also, in the light emitting display apparatus according to an embodiment of the present disclosure, the self-emitting device ED may be isolated by an undercut structure of the dam 104, and thus, the reliability of the self-emitting device ED may be prevented from being reduced by the penetration of water and an air bezel structure having no bezel area or having a zeroized bezel may be implemented. Also, in the light emitting display apparatus according to an embodiment of the present disclosure, the self-emitting device ED may be additionally isolated at least twice or more by the undercut area UCA implemented in the separation structures 105-1 to 105-4 and the undercut area UCA implemented between the lateral surface 102s of the planarization layer 102 and the lateral surface PASs of the passivation layer PAS by using the groove line GRV, thereby effectively preventing the penetration of water.

Figure 14:
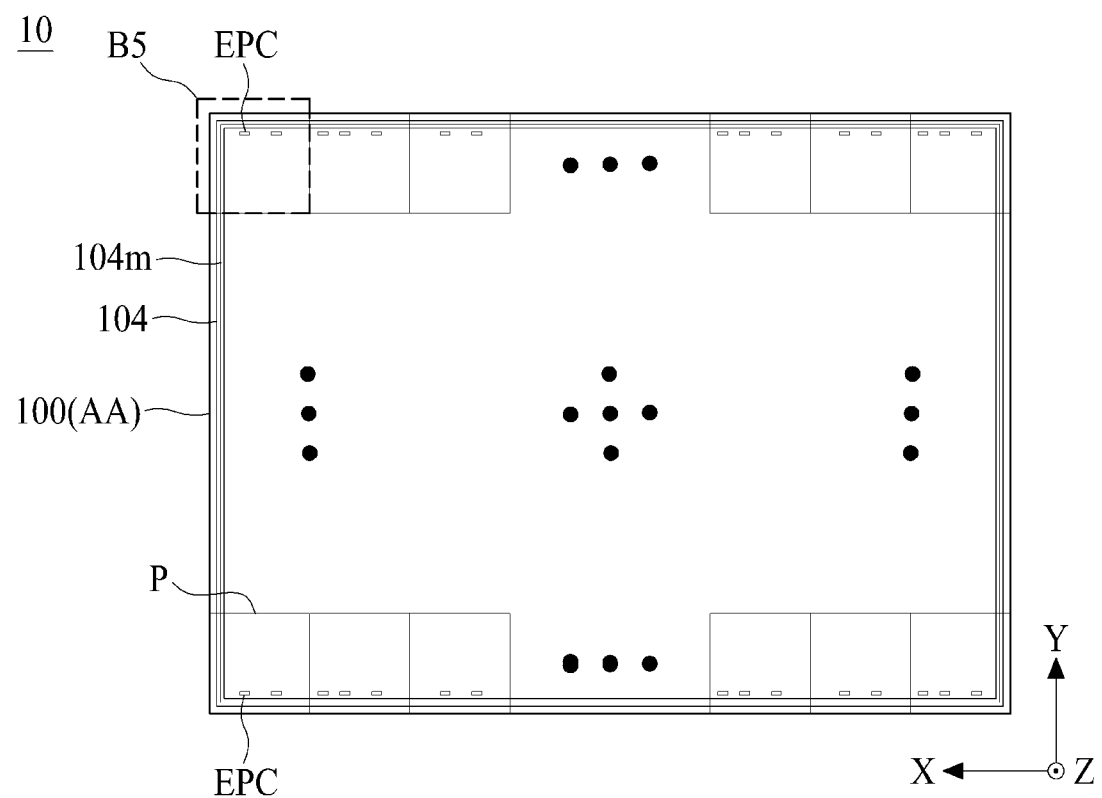
FIG. 14 is a diagram illustrating a light emitting display apparatus according to another embodiment of the present disclosure.
Figure 15:
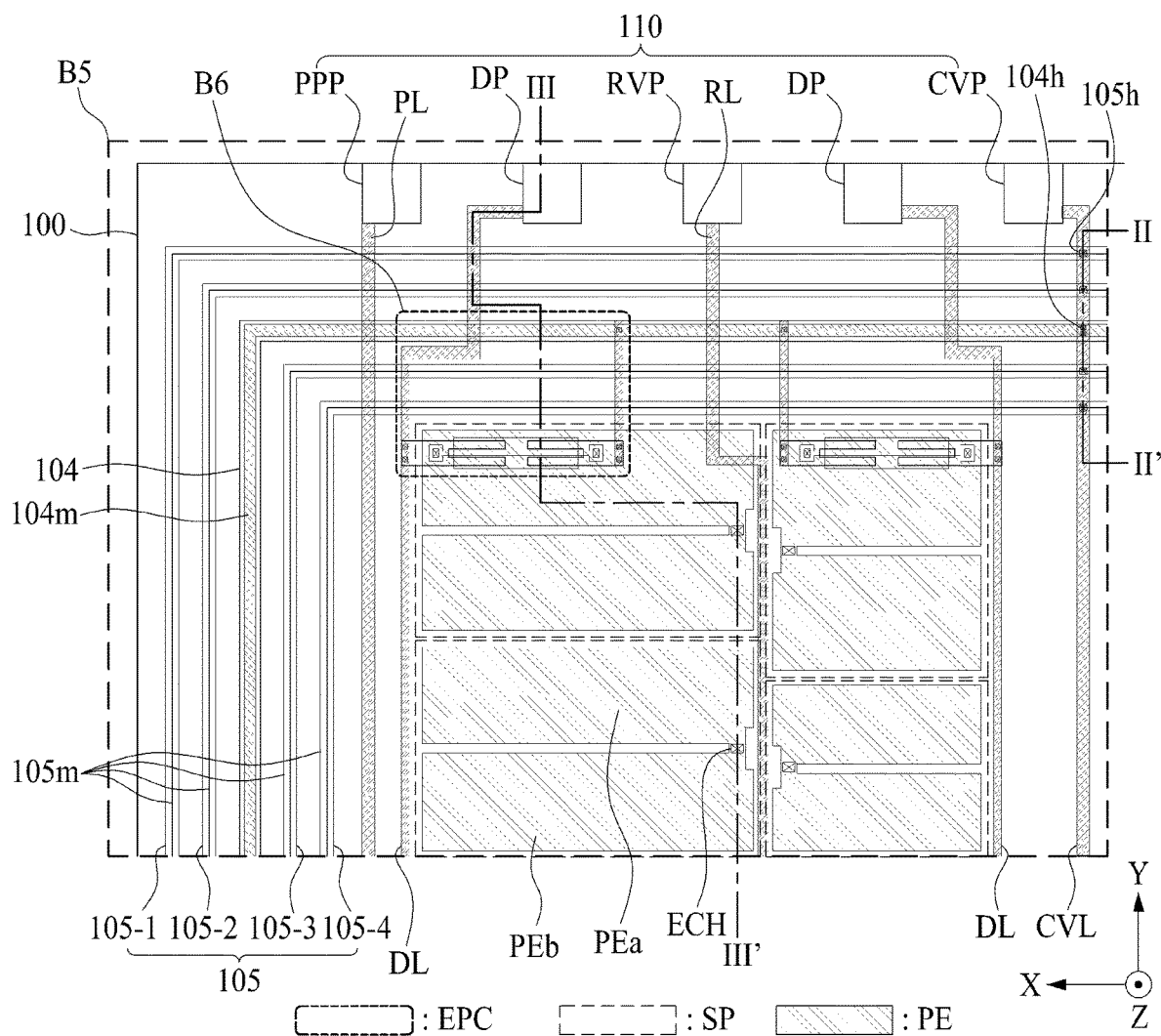
FIG. 15 is a schematic enlarged view of a region 'B5' illustrated in FIG. 14.
Figure 16:
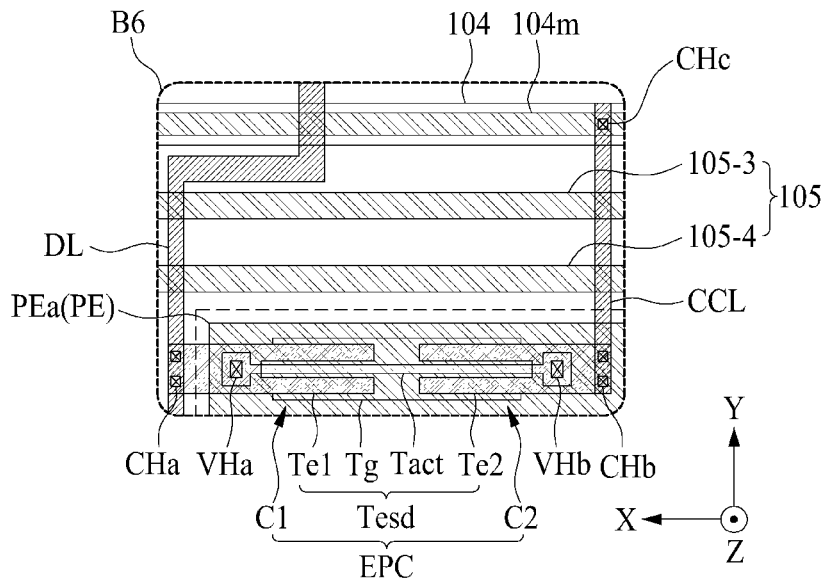
FIG. 16 is a schematic enlarged view of a region 'B6' illustrated in FIG. 15.

FIG. 14 is a diagram illustrating a light emitting display apparatus according to another embodiment of the present disclosure, FIG. 15 is a schematic enlarged view of a region 'B5' illustrated in FIG. 14, and FIG. 16 is a schematic enlarged view of a region 'B6' illustrated in FIG. 15. FIGS. 14 to 16 illustrate an embodiment implemented by modifying the anti-electrostatic circuit illustrated in FIGS. 6 to 8. In the following description, therefore, only an anti-electrostatic circuit and relevant elements will be described, the other elements are referred to by the same reference numerals as FIGS. 6 to 8, and their repetitive descriptions may be omitted.

Referring to FIGS. 14 to 16, an anti-electrostatic circuit EPC according to another embodiment of the present disclosure may be implemented to overlap an emission area EA of an outermost pixel Po.

The anti-electrostatic circuit EPC may be disposed to overlap the pixel electrode PE within the outermost pixel Po and may be electrically coupled between pixel driving lines PL, DL, RL, and GCL and a metal line 104m of a dam 104.

The anti-electrostatic circuit EPC according to an embodiment of the present disclosure may include a protection TFT Tesd, a first capacitor C1, and a second capacitor C2.

The protection TFT Tesd may be disposed to overlap a pixel electrode PE and may be electrically coupled between the pixel driving lines PL, DL, RL, and GCL and the metal line 104m of the dam 104. The protection TFT Tesd may be implemented to overlap a portion of the pixel electrode PE disposed in an outermost subpixel adjacent to a lateral surface of the substrate 100. The protection TFT Tesd may include a gate electrode Tg which is maintained in an electrical floating state, a first electrode Te1 which is electrically connected (or contact) to a corresponding pixel driving line DL through a first contact hole CHa, and a second electrode Te2 which is electrically coupled to the metal line 104m of the dam 104. Except for that the protection TFT Tesd is disposed to overlap the pixel electrode PE and has an electrical coupling structure between the second electrode Te2 and the metal line 104m, the protection TFT Tesd may be substantially the same as the protection TFT Tesd described above with reference to FIG. 9, and thus, repetitive descriptions thereof are omitted.

The protection TFT Tesd may be disposed to overlap the pixel electrode PE and not to overlap the metal line 104m, and thus, the second electrode Te2 of the protection TFT Tesd may be electrically coupled to the metal line 104m of the dam 104 through a separate connection line CCL.

A connection line (or a jumping line or a bridge line) CCL may extend along a second direction Y to intersect with or overlap each of the metal line 104m of the dam 104 and the second electrode Te2 of the protection TFT Tesd. The connection line CCL may be formed together with a data line DL and may be formed in parallel with the data line DL.

The protection TFT Tesd may be electrically connected (or contact) to one side of the connection line CCL through a second contact hole CHb. The metal line 104m of the dam 104 may be electrically connected (or contact) to the other side of the connection line CCL through a third contact hole CHc. Therefore, the second electrode Te2 of the protection TFT Tesd may be electrically connected to the metal line 104m of the dam 104 through the second contact hole CHb, the connection line CCL, and the third contact hole CHc, may be electrically connected (or contact) to a pixel common voltage pad CVP through the metal line 104m of the dam 104, the via hole 104h, and the pixel common voltage line CVL, and may be supplied with a pixel common voltage supplied from a driving circuit unit via the pixel common voltage pad CVP, the pixel common voltage line CVL, the via hole 104h, the metal line 104m, the third contact hole CHc, the connection line CCL, and the second contact hole CHb. Accordingly, the anti-electrostatic circuit EPC may discharge static electricity, flowing in through the pixel driving line DL, to the pixel common voltage line CVL to prevent the occurrence of a defect caused by the static electricity.

Figure 17:
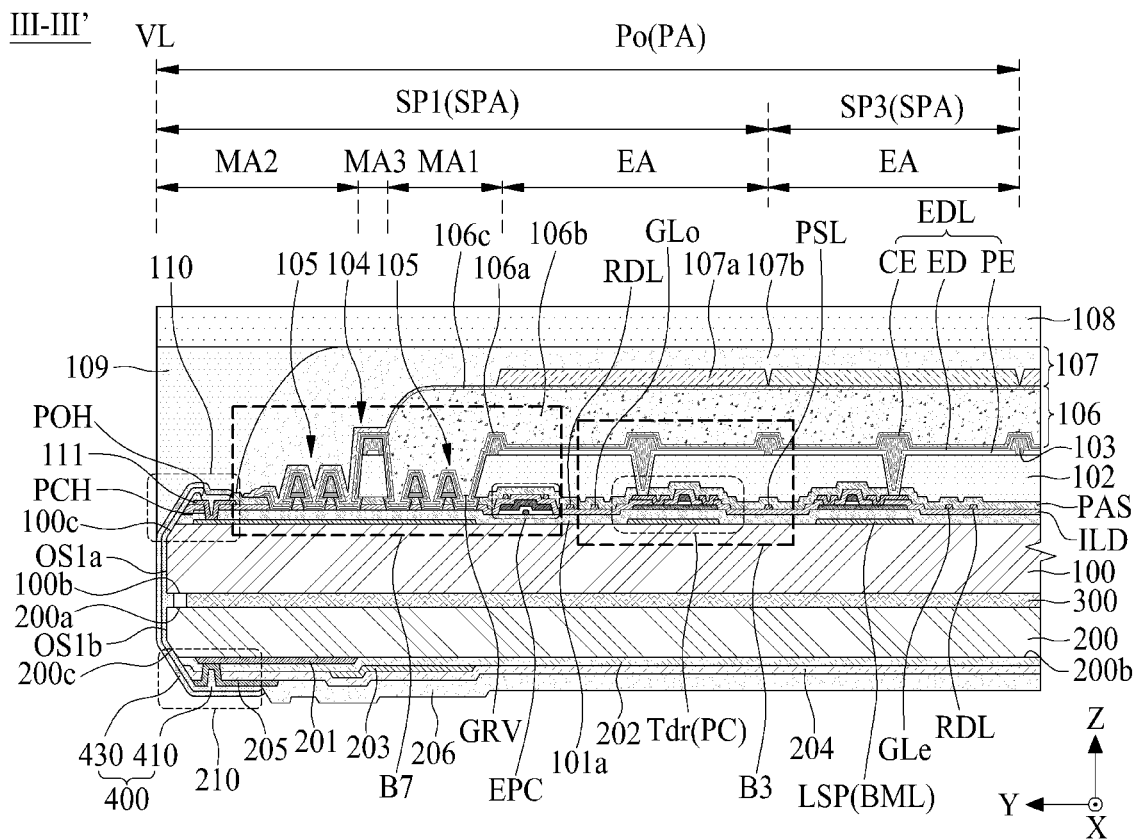
FIG. 17 is a schematic cross-sectional view taken along line illustrated in FIG. 15.
Figure 18:
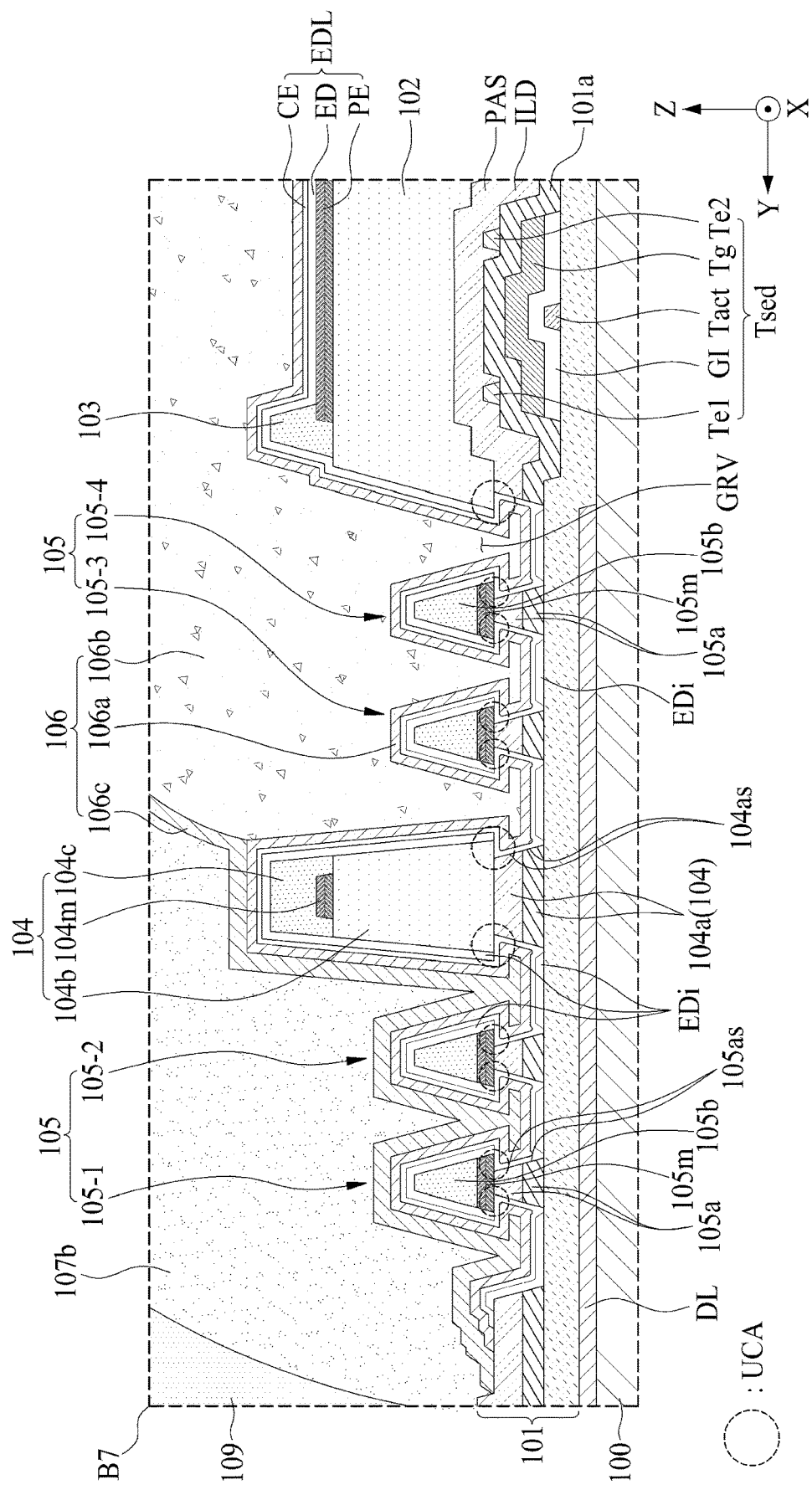
FIG. 18 is a schematic enlarged view of a region 'B7' illustrated in FIG. 17.

FIG. 17 is a schematic cross-sectional view taken along line illustrated in FIG. 15, and FIG. 18 is a schematic enlarged view of a region 'B7' illustrated in FIG. 17. A cross-sectional view taken along line II-IP illustrated in FIG. 15 is illustrated in FIG. 13, and the region 'B3' illustrated in FIG. 17 is illustrated in FIG. 11. In FIGS. 17 and 18, the other elements except a dam and an anti-electrostatic circuit may be substantially the same as FIGS. 10 to 13. In the following description, therefore, only a dam, an anti-electrostatic circuit, and relevant elements will be described, the other elements are referred to by the same reference numerals as FIGS. 10 to 13, and their repetitive descriptions may be omitted.

Referring to FIGS. 15, 17, and 18, in a light emitting display apparatus according to another embodiment of the present disclosure, except for that a first dam 104a is implemented on a buffer layer 101a, a dam 104 may be the same as the dam 104 described above with reference to FIGS. 10 to 13, and thus, the repetitive description thereof may be omitted. Because the dam 104 does not overlap an anti-electrostatic circuit EPC, the dam 104 may be implemented to have a width which is relatively less than that of the dam 104 described above with reference to FIGS. 10 to 13, and thus, a bezel width may decrease by a reduction in width of the dam 104.

The anti-electrostatic circuit EPC may be implemented to overlap an emission area EA of an outermost pixel Po (or an outermost subpixel). For example, the anti-electrostatic circuit EPC may be disposed between the dam 104 and each of the first gate line and the last gate line to overlap an emission area EA of the outermost pixel Po (or the outermost subpixel). The anti-electrostatic circuit EPC may be disposed at a circuit layer 101 overlapping a planarization layer 102 disposed in the outermost pixel Po (or the outermost subpixel). The anti-electrostatic circuit EPC may be disposed in the circuit layer 101 overlapping a pixel electrode PE disposed at the outermost pixel Po (or the outermost subpixel). For example, the anti-electrostatic circuit EPC may be disposed at the circuit layer 101 so as to be adjacent to a lateral surface 102s of the planarization layer 102.

As described above, the light emitting display apparatus according to another embodiment of the present disclosure may include the anti-electrostatic circuit EPC implemented to overlap the emission area EA of the outermost pixel Po (or the outermost subpixel), and thus, may have a zero bezel width without any increase in bezel width caused by a separate disposition region (or formation region) for forming the anti-electrostatic circuit EPC and may protect the pixel circuit, disposed in the outermost pixel, from static electricity. In addition, in the light emitting display apparatus according to an embodiment of the present disclosure, the self-emitting device ED may be isolated by an undercut structure of the dam 104, and thus, the reliability of the self-emitting device ED may be prevented from being reduced by the penetration of water and an air bezel structure having no bezel area or having a zeroized bezel may be implemented. Moreover, in the light emitting display apparatus according to an embodiment of the present disclosure, the self-emitting device ED may be additionally isolated at least twice or more by the undercut area UCA implemented in the separation structures 105-1 to 105-4 and the undercut area UCA implemented between the lateral surface 102s of the planarization layer 102 and the lateral surface PASs of the passivation layer PAS by using the groove line GRV, thereby effectively preventing the penetration of water.

Figure 19:
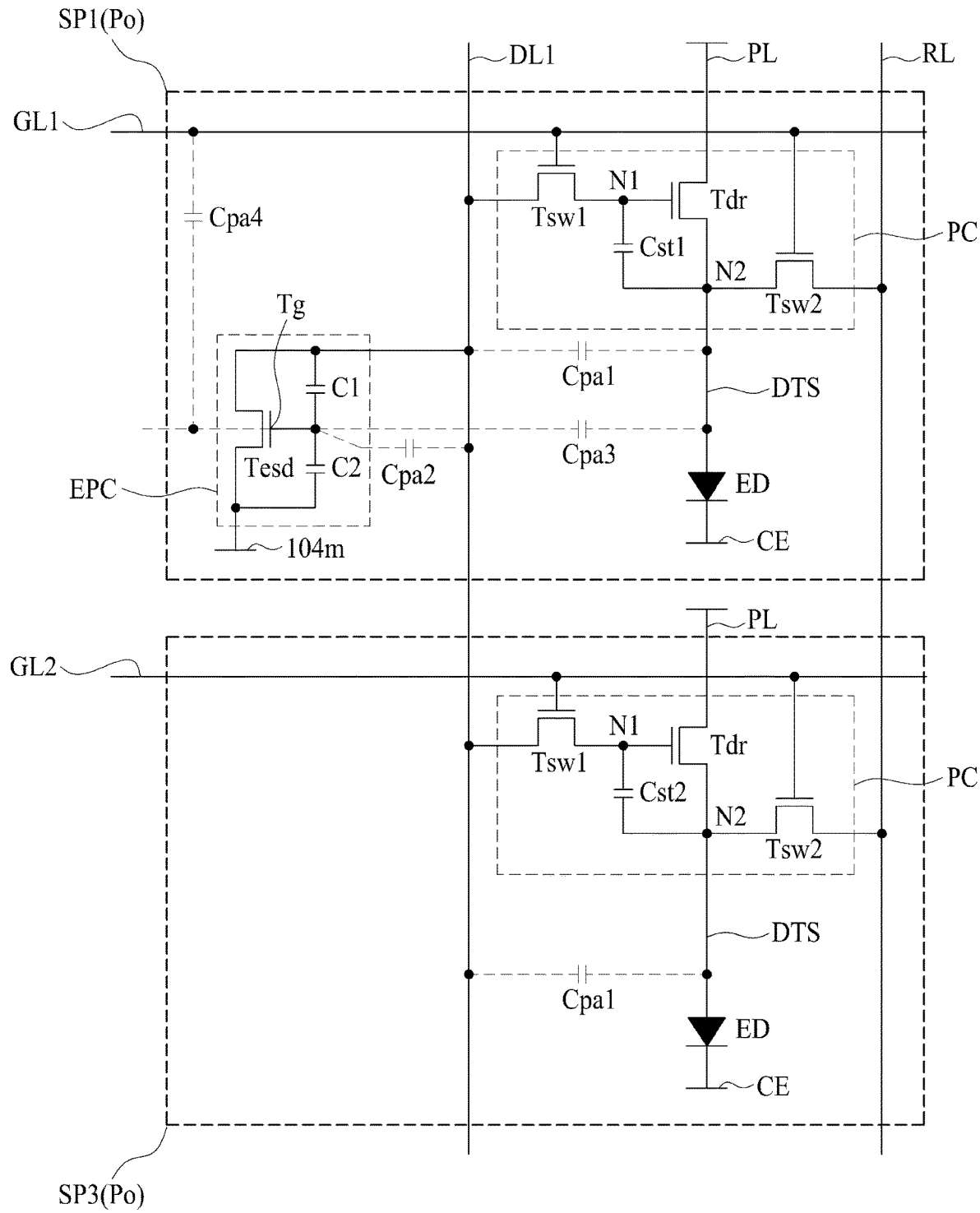
FIG. 19 is an equivalent circuit diagram of each of first and third subpixels of an outermost pixel according to an embodiment of the present disclosure.

FIG. 19 is an equivalent circuit diagram of each of first and third subpixels of an outermost pixel according to an embodiment of the present disclosure and is a diagram for describing a parasitic capacitance of each of the first and third subpixels of the outermost pixel, based on the presence of an anti-electrostatic circuit. In the following description, therefore, only an element associated with a parasitic capacitance among elements of each of an outermost subpixel and an inner subpixel will be described, the other elements are referred to by the same reference numerals as FIG. 4, and their repetitive descriptions may be omitted or will be briefly given.

Referring to FIG. 19, a first subpixel SP1 of an outermost pixel Po according to an embodiment of the present disclosure may include a pixel circuit PC, a self-emitting device ED, and an anti-electrostatic circuit EPC. That is, the first subpixel SP1 of the outermost pixel Po may be an outermost subpixel and may include the anti-electrostatic circuit EPC.

The pixel circuit PC of the first subpixel SP1 may include a first switching TFT Tsw1, a second switching TFT Tsw2, a driving TFT Tdr, and a first storage capacitor Cst1.

The anti-electrostatic circuit EPC may be disposed adjacent to a first data line DL1 and a first gate line GL1. The anti-electrostatic circuit EPC may include a protection TFT Tesd including a gate electrode Tg which is maintained in an electrical floating state.

The first subpixel SP1 of the outermost pixel Po may include a first parasitic capacitance Cpa1 between the first data line DL1 and a source electrode node DTS of the driving TFT Tdr, a second parasitic capacitance Cpa2 between the first data line DL1 and the gate electrode Tg of the protection TFT Tesd, a third parasitic capacitance Cpa3 between the gate electrode Tg of the protection TFT Tesd and the source electrode node DTS of the driving TFT Tdr, and a fourth parasitic capacitance Cpa4 between the gate electrode Tg of the protection TFT Tesd and the first gate line GL1.

A third subpixel SP3 of the outermost pixel Po according to an embodiment of the present disclosure may include a pixel circuit PC and a self-emitting device ED. That is, the third subpixel SP3 may be an inner subpixel and may include only a pixel circuit PC without including an anti-electrostatic circuit EPC.

The third subpixel SP3 of the outermost pixel Po may include a first switching TFT Tsw1, a second switching TFT Tsw2, a driving TFT Tdr, and a second storage capacitor Cst2.

The third subpixel SP3 may include a first parasitic capacitance Cpa1 between the first data line DL1 and a source electrode node DTS of the driving TFT Tdr.

According to an embodiment of the present disclosure, the first subpixel SP1 including the anti-electrostatic circuit EPC may have a parasitic capacitance which is relatively higher than the third subpixel SP3 including no anti-electrostatic circuit EPC due to second to fourth parasitic capacitances Cpa2 to Cpa4 based on the gate electrode Tg of the protection TFT Tesd. Due to a parasitic capacitance deviation between the first subpixel SP1 and the third subpixel SP3, a luminance deviation between the first subpixel SP1 and the third subpixel SP3 may occur. For example, when the same data voltage is applied to each of the first subpixel SP1 and the third subpixel SP3, the first subpixel SP1 may have luminance which is relatively higher than the third subpixel SP3 due to a floating gate electrode Tg of the protection TFT Tesd. For example, in the first subpixel SP1, as a gate voltage of the protection TFT Tesd is reduced by the first to third parasitic capacitances Cpa1 to Cpa3 in a falling period of a scan signal, a voltage of the source electrode node DTS of the driving TFT Tdr may decrease, and due to this, a gate-source voltage Vgs of the driving TFT Tdr may increase, whereby the self-emitting device ED may emit light having higher luminance than luminance corresponding to a data voltage as a data current supplied to the self-emitting device ED increases. Due to this, the first subpixel SP1 may have luminance which is relatively higher than that of the third subpixel SP3 where the self-emitting device ED emits light having luminance corresponding to a data voltage.

As described above, in order to compensate for or minimize or reduce a parasitic capacitance deviation between the first subpixel SP1 and the third subpixel SP3, the first storage capacitor Cst1 included in the outermost subpixel such as the first subpixel SP1 may be implemented to have a capacitance which differs from that of the second storage capacitor Cst2 included in the inner subpixel such as the third subpixel SP3. For example, a pixel circuit PC of an outermost subpixel including an anti-electrostatic circuit EPC among a plurality of subpixels SP may be implemented to include the first storage capacitor Cst1. On the other hand, a pixel circuit PC of an inner subpixel including no the anti-electrostatic circuit EPC among the plurality of subpixels SP may be implemented to include the second storage capacitor Cst2.

The first storage capacitor Cst1 may be implemented to have a capacitance which is less or greater than that of the second storage capacitor Cst2, based on a position of each of a gate electrode and a source electrode of the driving TFT Tdr and the floating gate electrode Tg of the anti-electrostatic circuit EPC in a subpixel area.

According to an embodiment of the present disclosure, the first storage capacitor Cst1 may be implemented to have a capacitance which is relatively less than the second storage capacitor Cst2. For example, an overlap area between a source electrode and a gate electrode of a driving TFT Tdr implementing the first storage capacitor Cst1 may be relatively less than an overlap area between a source electrode and a gate electrode of a driving TFT Tdr implementing the second storage capacitor Cst2. For example, when the first subpixel SP1 includes a third parasitic capacitance Cpa3 between the gate electrode Tg of the protection TFT Tesd and the source electrode node DTS of the driving TFT Tdr, the first storage capacitor Cst1 may be implemented to have a capacitance which is relatively less than the second storage capacitor Cst2.

According to another embodiment of the present disclosure, the first storage capacitor Cst1 may be implemented to have a capacitance which is relatively greater than the second storage capacitor Cst2. For example, the overlap area between the source electrode and the gate electrode of the driving TFT Tdr implementing the first storage capacitor Cst1 may be relatively greater than the overlap area between the source electrode and the gate electrode of the driving TFT Tdr implementing the second storage capacitor Cst2. For example, when the first subpixel SP1 includes the third parasitic capacitance Cpa3 between the gate electrode Tg of the protection TFT Tesd and the source electrode node DTS of the driving TFT Tdr, the first storage capacitor Cst1 may be implemented to have a capacitance which is relatively greater than the second storage capacitor Cst2.

Therefore, the light emitting display apparatus according to another embodiment of the present disclosure may include the anti-electrostatic circuit EPC implemented to overlap the emission area EA of the outermost pixel Po (or the outermost subpixel), and thus, may have a zero bezel width without any increase in bezel width caused by a separate disposition region (or formation region) for forming the anti-electrostatic circuit EPC and may protect the pixel circuit, disposed in the outermost pixel, from static electricity. In addition, in the light emitting display apparatus according to another embodiment of the present disclosure, a storage capacitor of a pixel including the anti-electrostatic circuit EPC may be differentiated from a storage capacitor of a pixel including no anti-electrostatic circuit EPC, thereby minimizing a luminance non-uniformity phenomenon caused by a parasitic capacitance deviation between pixels occurring due to whether an anti-electrostatic circuit EPC is provided or not.

Figure 20:
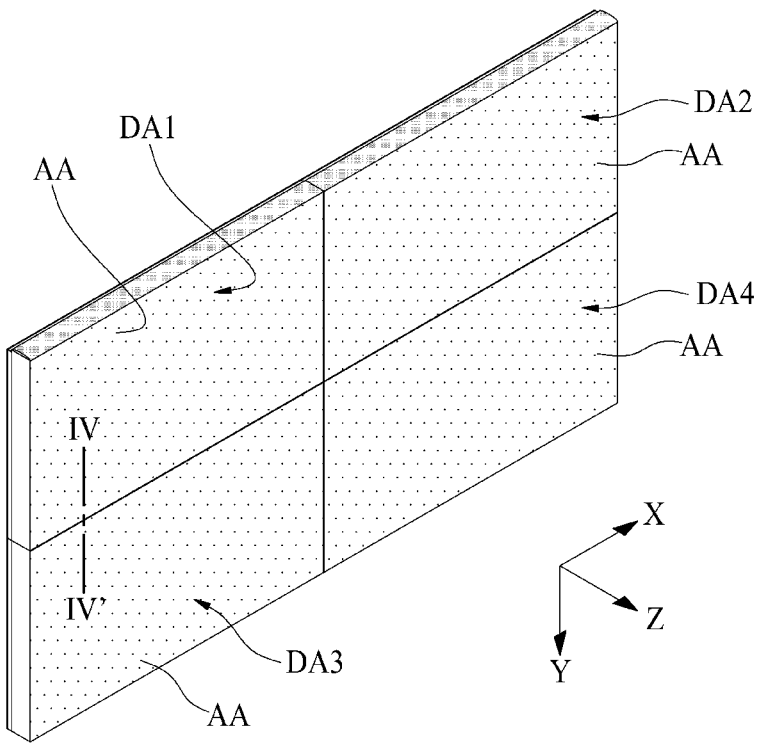
FIG. 20 is a diagram illustrating a multi-screen display apparatus according to an embodiment of the present disclosure.
Figure 21:
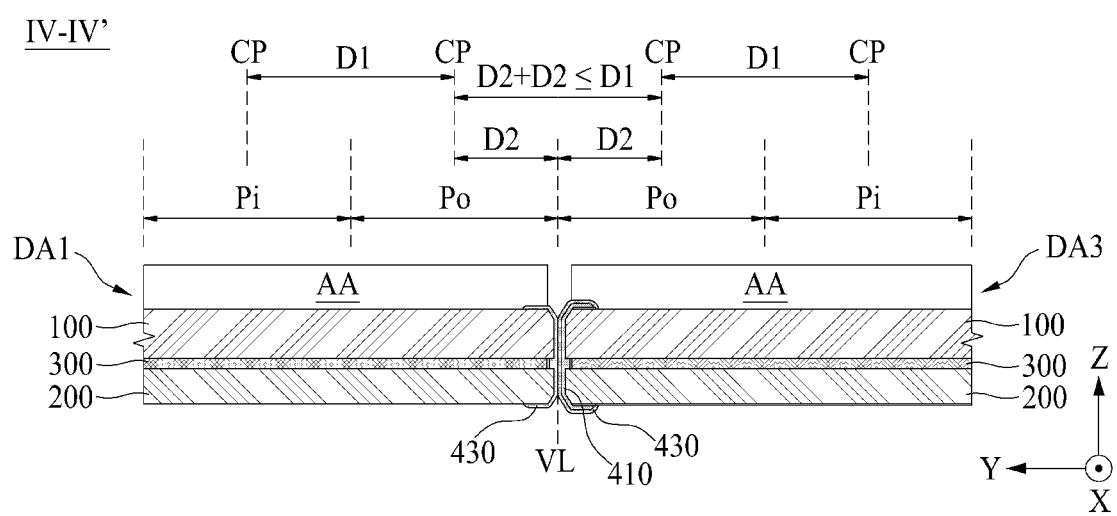
FIG. 21 is a schematic cross-sectional view taken along line IV-IV' illustrated in FIG. 20.

FIG. 20 is a diagram illustrating a multi-screen display apparatus according to an embodiment of the present disclosure, and FIG. 21 is a cross-sectional view taken along line IV-IV' illustrated in FIG. 20. FIGS. 20 and 21 illustrate a multi-screen display apparatus implemented by tiling the light emitting display apparatus according to an embodiment of the present disclosure illustrated in FIGS. 1 to 19.

Referring to FIGS. 20 and 21, the multi-screen display apparatus (or multi-screen light emitting display apparatus or a tiling light emitting display apparatus) according to an embodiment of the present disclosure may include a plurality of display apparatuses DA1 to DA4.

The plurality of display apparatuses DA1 to DA4 may each display an individual image or may divisionally display one image. Each of the plurality of display apparatuses DA1 to DA4 may include the light emitting display apparatus according to an embodiment of the present disclosure illustrated in FIGS. 1 to 19, and thus, their repetitive descriptions may be omitted.

The plurality of display apparatuses DA1 to DA4 may be tiled on a separate tiling frame to contact each other in a lateral surface thereof (or in a side-to-side connection relationship). For example, the plurality of display apparatuses DA1 to DA4 may be tiled to have an N×M form, thereby implementing a multi-screen display apparatus having a large screen. For example, N is a positive integer of 1 or more and M is a positive integer of 2 or more. For example, N is a positive integer of 2 or more and M is a positive integer of 1 or more.

Each of the plurality of display apparatuses DA1 to DA4 may not include a bezel area (or a non-display portion) surrounding all of a display portion AA where an image is displayed, and may have an air-bezel structure where the display portion AA is surrounded by air. For example, in each of the plurality of display apparatuses DA1 to DA4, all of a first surface of a substrate 100 may be implemented as the display portion AA.

According to an embodiment of the present disclosure, in each of the plurality of display apparatuses DA1 to DA4, a second interval D2 between a center portion CP of an outermost pixel Po and an outermost outer surface VL of the first substrate 100 may be implemented to be half or less of a first interval D1 (or a pixel pitch) between adjacent pixels. Accordingly, in two adjacent display apparatuses DA1 to DA4 connected to (or contacting) each other at lateral surfaces thereof along the first direction X and the second direction Y based on a lateral coupling method, an interval "D2+D2" between two adjacent outermost pixels Po may be equal to or less than the first interval D1 between two adjacent pixels.

Referring to FIG. 21, in first and third display apparatuses DA1 and DA3 connected to (or contacting) each other at lateral surfaces thereof along the second direction Y, the interval "D2+D2" between a center portion CP of an outermost pixel Po of the first display apparatus DA1 and a center portion CP of an outermost pixel Po of the third display apparatus DA3 may be equal to or less than the first interval D1 (or a pixel pitch) between two adjacent pixels Po and Pi disposed at each of the first and third display apparatuses DA1 and DA3.

Therefore, the interval "D2+D2" between center portions CP of outermost pixels Po of two adjacent display apparatuses DA1 to DA4 connected to (or contacting) each other at lateral surfaces thereof along the first direction X and the second direction Y may be equal to or less than the first interval D1 between two adjacent pixels Po and Pi disposed at each of the display apparatuses DA1 to DA4, and thus, there may be no seam or boundary portion between two adjacent display apparatuses DA1 to DA4, whereby there may be no dark area caused by a boundary portion provided between the display apparatuses DA1 to DA4. As a result, the image displayed on the multi-screen display apparatus in which each of the plurality of display apparatuses DA1 to DA4 is tiled in an NXM form may be displayed continuously without a sense of disconnection (or discontinuity) at boundary portion between the plurality of display apparatuses DA1 to DA4.

In FIGS. 20 and 21, it is illustrated that the plurality of display apparatuses DA1 to DA4 are tiled in a 2×2 form, but embodiments of the present disclosure are not limited thereto, and the plurality of display apparatuses DA1 to DA4 may be tiled in an x×1 form, a 1×y form, or an x×y form. For example, x and y may be two or more natural numbers equal to or different from each other. For example, x may be two or more natural numbers or equal to y. y may be two or more natural numbers or greater or less than x.

As described above, when display portion AA of each of the plurality of display apparatuses DA1 to DA4 is one screen and displays one image, a multi-screen display apparatus according to an embodiment of the present disclosure may display an image which is not disconnected and is continuous at a boundary portion between the plurality of display apparatuses DA1 to DA4, and thus, the immersion of a viewer watching an image displayed by the multi-screen display apparatus may be enhanced.

The light emitting display apparatus according to an embodiment of the present disclosure may be applied to all electronic devices including a light emitting display panel. For example, the light emitting display apparatus according to an embodiment of the present disclosure may be applied to mobile apparatuses, video phones, smart watches, watch phones, wearable apparatuses, foldable apparatuses, rollable apparatuses, bendable apparatuses, flexible apparatuses, curved apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive display apparatuses, automotive apparatuses, theater apparatuses, theater display apparatuses, TVs, wall paper display apparatuses, signage apparatuses, game machines, notebook computers, monitors, cameras, camcorders, home appliances, or the like.

A light emitting display apparatus and multi-screen display apparatus including the same according to an embodiment of the present disclosure will be described below.

A light emitting display apparatus according to an embodiment of the present disclosure may comprise a substrate; a display portion including a plurality of pixel driving lines disposed over the substrate and a plurality of pixels selectively connected to the plurality of pixel driving lines; a light emitting device layer including a self-emitting device disposed at the display portion; a dam disposed along a periphery portion of the substrate, the dam including a metal line; an encapsulation layer including an organic encapsulation layer disposed on an encapsulation region surrounded on at least four sides by the dam; and an anti-electrostatic circuit selectively disposed in outermost pixels of the plurality of pixels, the anti-electrostatic circuit may be electrically coupled between a pixel driving line of the plurality of pixel driving lines, the pixel driving line being disposed in at least one of the outermost pixels and the metal line disposed in the dam.

According to some embodiments of the present disclosure, the anti-electrostatic circuit may be disposed between the substrate and the dam.

According to some embodiments of the present disclosure, each of the plurality of pixels may comprise an emission area, and the anti-electrostatic circuit may overlap an emission area of at least one of the outermost pixels.

According to some embodiments of the present disclosure, each of the plurality of pixels may comprise an emission area, and the dam may have a closed loop line shape disposed along a region between a lateral surface of the substrate and emission areas of the outermost pixels.

According to some embodiments of the present disclosure, the dam may comprise a first dam pattern disposed over the substrate; a second dam pattern disposed over the first dam pattern; and a third dam pattern disposed over the second dam pattern, the metal line may be disposed between the second dam pattern and the third dam pattern, and the anti-electrostatic circuit may comprise a protection thin film transistor disposed under the first dam pattern.

According to some embodiments of the present disclosure, the protection thin film transistor may comprise a gate electrode electrically floated, a first electrode electrically coupled to the pixel driving line, and a second electrode electrically coupled to the metal line, and the anti-electrostatic circuit may further comprise a first capacitor disposed between the gate electrode and the first electrode of the protection thin film transistor; and a second capacitor disposed between the gate electrode and the second electrode of the protection thin film transistor.

According to some embodiments of the present disclosure, the dam may further comprise an undercut region disposed between a lateral surface of the first dam pattern and the second dam pattern, and the self-emitting device over the dam may be isolated in the undercut region.

According to some embodiments of the present disclosure, the light emitting display apparatus may further comprise a separation portion having a plurality of separation structures disposed near the dam, each of the plurality of separation structures may comprise a lower structure; and an upper structure disposed over the lower structure to have an eaves structure with respect to the lower structure, and the self-emitting device disposed over the separation portion may be isolated by the eaves structure.

According to some embodiments of the present disclosure, the light emitting display apparatus may further comprise a separation portion having a plurality of separation structures disposed near the dam, each of the plurality of separation structures may comprise a lower structure, and an upper structure disposed over the lower structure to have an eaves structure with respect to the lower structure, at least one of the plurality of separation structures may further comprise a metal structure disposed between the lower structure and the upper structure, the metal structure may be disposed over the lower structure to have an eaves structure with respect to the lower structure, and the self-emitting device disposed over the separation portion may be isolated by the metal structure.

According to some embodiments of the present disclosure, each of the plurality of separation structures may intersect or overlap with the plurality of pixel driving lines, and the metal structure may be electrically coupled to a pixel common voltage line of the plurality of pixel driving lines.

According to some embodiments of the present disclosure, the light emitting display apparatus may further comprise a planarization layer disposed between the substrate and the light emitting device layer; a passivation layer disposed between the substrate and the planarization layer; a groove line disposed at an inner region of the dam and implemented by removing all of the planarization layer and the passivation layer at an inner region of the dam; and an undercut region implemented between a lateral surface of the passivation layer adjacent to the groove line and a lateral surface of the planarization layer adjacent to the groove line, the self-emitting device disposed over the groove line and the lateral surface of the planarization layer may be isolated in the undercut region.

According to some embodiments of the present disclosure, each of the plurality of pixels may comprise a plurality of subpixels each having a pixel electrode, and the anti-electrostatic circuit may comprise a protection thin film transistor implemented to overlap a portion of the pixel electrode disposed in one of the outermost subpixels that is adjacent to a lateral surface of the substrate.

According to some embodiments of the present disclosure, the protection thin film transistor may comprise a gate electrode electrically floated, a first electrode electrically coupled to the pixel driving line, and a second electrode electrically coupled to the metal line, and the anti-electrostatic circuit may further comprise a first capacitor implemented between the gate electrode and the first electrode of the protection thin film transistor; and a second capacitor implemented between the gate electrode and the second electrode of the protection thin film transistor.

According to some embodiments of the present disclosure, the light emitting display apparatus may further comprise a connection line disposed to intersect or overlap with each of the metal line and the second electrode of the protection thin film transistor, the first electrode of the protection thin film transistor may be connected to the pixel driving line through a first contact hole, and the connection line may be electrically connected to the second electrode of the protection thin film transistor through a second contact hole and may be electrically connected to the metal line through a third contact hole.

According to some embodiments of the present disclosure, each of the plurality of subpixels may further comprise a pixel circuit, the pixel circuit of each of the plurality of subpixels may comprise a driving thin film transistor electrically coupled to the self-emitting device; and a storage capacitor disposed between a gate electrode and a source electrode of the driving thin film transistor, and a capacitance of the respective storage capacitors included in the outermost subpixel may differ from a capacitance of the respective storage capacitors included in an inner subpixel other than the outermost subpixel.

According to some embodiments of the present disclosure, a parasitic capacitance of the outermost subpixel may be greater than a parasitic capacitance of the inner subpixel, or the capacitance of the storage capacitor of the outermost subpixel may be less than the capacitance of the storage capacitor of the inner subpixel.

According to some embodiments of the present disclosure, the light emitting device layer may comprise a common electrode disposed in the display portion and electrically coupled to the self-emitting device, and at least one of the plurality of pixel driving lines may be a pixel common voltage line electrically coupled to the common electrode, and the metal line may be electrically coupled to the pixel common voltage line.

A multi-screen display apparatus according to an embodiment of the present disclosure may comprise a plurality of display apparatuses disposed along at least one direction of a first direction and a second direction crossing the first direction, each of the plurality of display apparatuses includes a light emitting display apparatus, the light emitting display apparatus includes a substrate, a display portion including a plurality of pixel driving lines disposed over the substrate and a plurality of pixels selectively connected to the plurality of pixel driving lines, a light emitting device layer including a self-emitting device disposed at the display portion, a dam disposed along an edge portion of the substrate, the dam including a metal line, an encapsulation layer including an organic encapsulation layer disposed on an encapsulation region surrounded on at least four sides by the dam, and an anti-electrostatic circuit selectively disposed in outermost pixels of the plurality of pixels, wherein the anti-electrostatic circuit is electrically coupled between a pixel driving line of the plurality of pixel driving lines, the pixel driving line being disposed in at least one of the outermost pixels and the metal line disposed in the dam.

According to some embodiments of the present disclosure, in the respective light emitting display apparatus of each of the plurality of display apparatuses, the plurality of pixels may be arranged over the substrate along each of the first direction and the second direction, in a first display apparatus and a second display apparatus adjacent along at least one of the first direction and the second direction, a distance between a center portion of one of the outermost pixels of the first display apparatus and a center portion of one of the outermost pixels of the second display apparatus may be less than or equal to a pixel pitch, and the pixel pitch may be a distance between center portions of two adjacent pixels to each other.

According to some embodiments of the present disclosure, the light emitting device layer may comprise a common electrode disposed in the display portion and electrically coupled to the self-emitting device, and at least one of the plurality of pixel driving lines may be a pixel common voltage line electrically coupled to the common electrode, and the metal line may be electrically coupled to the pixel common voltage line.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display apparatus comprising:
   a substrate;
   a display portion including a plurality of pixel driving lines disposed over the substrate and a plurality of pixels selectively connected to the plurality of pixel driving lines;
   a light emitting device layer including a self-emitting device disposed at the display portion;
   a dam disposed along a periphery portion of the substrate, the dam including a metal line;
   an encapsulation layer including an organic encapsulation layer disposed on an encapsulation region surrounded on at least four sides by the dam; and
   an anti-electrostatic circuit selectively disposed in outermost pixels of the plurality of pixels,
   wherein the anti-electrostatic circuit is electrically coupled between a pixel driving line of the plurality of pixel driving lines, the pixel driving line being disposed in at least one of the outermost pixels,
   wherein the metal line is embedded in the dam, and
   wherein the anti-electrostatic circuit is disposed between the substrate and the dam.

2. The light emitting display apparatus of claim 1, wherein:
   each of the plurality of pixels comprises an emission area, and the anti-electrostatic circuit overlaps an emission area of at least one of the outermost pixels.

3. The light emitting display apparatus of claim 1, wherein:
   each of the plurality of pixels comprises an emission area, and
   the dam has a closed loop line shape disposed along a region between a lateral surface of the substrate and emission areas of the outermost pixels.

4. The light emitting display apparatus of claim 3, wherein:
   the dam comprises:
      a first dam pattern disposed over the substrate;
      a second dam pattern disposed over the first dam pattern; and
      a third dam pattern disposed over the second dam pattern,
   the metal line is disposed between the second dam pattern and the third dam pattern, and
   the anti-electrostatic circuit comprises a protection thin film transistor disposed under the first dam pattern.

5. The light emitting display apparatus of claim 4, wherein:
   the protection thin film transistor comprises a gate electrode electrically floated, a first electrode electrically coupled to the pixel driving line, and a second electrode electrically coupled to the metal line, and
   the anti-electrostatic circuit further comprises:
      a first capacitor disposed between the gate electrode and the first electrode of the protection thin film transistor; and
      a second capacitor disposed between the gate electrode and the second electrode of the protection thin film transistor.

6. The light emitting display apparatus of claim 4, wherein:
   the dam further comprises an undercut region disposed between a lateral surface of the first dam pattern and the second dam pattern, and
   the self-emitting device over the dam is isolated in the undercut region.

7. The light emitting display apparatus of claim 1, further comprising a separation portion having a plurality of separation structures disposed near the dam,
   wherein each of the plurality of separation structures comprises:
      a lower structure; and
      an upper structure disposed over the lower structure to have an eaves structure with respect to the lower structure, and
   wherein the self-emitting device disposed over the separation portion is isolated by the eaves structure.

8. The light emitting display apparatus of claim 1, further comprising a separation portion having a plurality of separation structures disposed near the dam,
   wherein each of the plurality of separation structures comprises:
      a lower structure; and
      an upper structure disposed over the lower structure to have an eaves structure with respect to the lower structure,
   wherein at least one of the plurality of separation structures further comprises a metal structure disposed between the lower structure and the upper structure,
   wherein the metal structure is disposed over the lower structure to have an eaves structure with respect to the lower structure, and
   wherein the self-emitting device disposed over the separation portion is isolated by the metal structure.

9. The light emitting display apparatus of claim 8, wherein:
   each of the plurality of separation structures overlaps the plurality of pixel driving lines, and
   the metal structure is electrically coupled to a pixel common voltage line of the plurality of pixel driving lines.

10. The light emitting display apparatus of claim 1, further comprising:
    a planarization layer disposed between the substrate and the light emitting device layer;
    a passivation layer disposed between the substrate and the planarization layer;
    a groove line disposed at an inner region of the dam and implemented by removing all of the planarization layer and the passivation layer at the inner region of the dam; and
    an undercut region implemented between a lateral surface of the passivation layer adjacent to the groove line and a lateral surface of the planarization layer adjacent to the groove line,
    wherein the self-emitting device disposed over the groove line and the lateral surface of the planarization layer is isolated in the undercut region.

11. The light emitting display apparatus of claim 1, wherein:
    each of the plurality of pixels comprises a plurality of subpixels each having a pixel electrode, and
    the anti-electrostatic circuit comprises a protection thin film transistor implemented to overlap a portion of the pixel electrode disposed in one of the outermost subpixels that is adjacent to a lateral surface of the substrate.

12. The light emitting display apparatus of claim 11, wherein:
    the protection thin film transistor comprises a gate electrode electrically floated, a first electrode electrically coupled to the pixel driving line, and a second electrode electrically coupled to the metal line, and the anti-electrostatic circuit further comprises:
- a first capacitor disposed between the gate electrode and the first electrode of the protection thin film transistor; and
- a second capacitor disposed between the gate electrode and the second electrode of the protection thin film transistor.

13. The light emitting display apparatus of claim 12, further comprising a connection line disposed to overlap with each of the metal line and the second electrode of the protection thin film transistor,
   wherein the first electrode of the protection thin film transistor is connected to the pixel driving line through a first contact hole, and
   wherein the connection line is electrically connected to the second electrode of the protection thin film transistor through a second contact hole and is electrically connected to the metal line through a third contact hole.

14. The light emitting display apparatus of claim 11, wherein:
   each of the plurality of subpixels further comprises a pixel circuit, and
   the pixel circuit of each of the plurality of subpixels comprises:
   - a driving thin film transistor electrically coupled to the self-emitting device; and
   - a storage capacitor disposed between a gate electrode and a source electrode of the driving thin film transistor, and
   wherein a capacitance of the respective storage capacitors included in the outermost subpixels differs from a capacitance of the respective storage capacitor included in an inner subpixel other than the outermost subpixels.

15. The light emitting display apparatus of claim 14, wherein:
   a parasitic capacitance of the outermost subpixels is greater than a parasitic capacitance of the inner subpixel, or
   the capacitance of the respective storage capacitors of the outermost subpixels is less than the capacitance of the respective storage capacitor of the inner subpixel.

16. The light emitting display apparatus of claim 1, wherein:
   the light emitting device layer comprises a common electrode disposed in the display portion and electrically coupled to the self-emitting device, and
   at least one of the plurality of pixel driving lines is a pixel common voltage line electrically coupled to the common electrode, and the metal line is electrically coupled to the pixel common voltage line.

17. A multi-screen display apparatus comprising:
   a plurality of display apparatuses disposed along at least one direction of a first direction and a second direction crossing the first direction,
   wherein each of the plurality of display apparatuses includes the light emitting display apparatus of claim 1.

18. The multi-screen display apparatus of claim 17, wherein:
   in the respective light emitting display apparatus of each of the plurality of display apparatuses, the plurality of pixels are arranged over the substrate along each of the first direction and the second direction,
   in a first display apparatus and a second display apparatus adjacent along at least one of the first direction and the second direction, a distance between a center portion of one of the outermost pixels of the first display apparatus and a center portion of one of the outermost pixels of the second display apparatus is less than or equal to a pixel pitch, and the pixel pitch is a distance between center portions of two adjacent pixels to each other.

19. The multi-screen display apparatus of claim 17, wherein:
   the light emitting device layer comprises a common electrode disposed in the display portion and electrically coupled to the self-emitting device,
   at least one of the plurality of pixel driving lines is a pixel common voltage line electrically coupled to the common electrode, and
   the metal line is electrically coupled to the pixel common voltage line.

* * * * *